(12) United States Patent
Terasawa et al.

(10) Patent No.: US 6,995,918 B2
(45) Date of Patent: Feb. 7, 2006

(54) PROJECTION OPTICAL SYSTEM AND PROJECTION EXPOSURE APPARATUS

(75) Inventors: Chiaki Terasawa, Utsunomiya (JP); Hiroyuki Ishii, Utsunomiya (JP); Takashi Kato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/992,853

(22) Filed: Nov. 22, 2004

(65) Prior Publication Data

US 2005/0088761 A1    Apr. 28, 2005

Related U.S. Application Data

(62) Division of application No. 09/784,021, filed on Feb. 16, 2001.

(30) Foreign Application Priority Data

Feb. 16, 2000    (JP) .............................. 2000-037981

(51) Int. Cl.
   *G02B 3/00* (2006.01)
   *G02B 9/00* (2006.01)
(52) U.S. Cl. ...................... 359/649; 359/726; 359/730
(58) Field of Classification Search ........ 359/649–651, 359/726–736, 663, 364–366; 355/43, 46–50
   See application file for complete search history.

(56) References Cited

U.S. PATENT DOCUMENTS

| 4,241,390 A | 12/1980 | Markle et al. ............... 362/299 |
| 4,747,678 A | 5/1988 | Shafer et al. ................ 359/366 |
| 4,757,354 A | 7/1988 | Sato et al. .................... 355/53 |
| 4,812,028 A | 3/1989 | Matsumoto ................. 359/366 |
| 4,861,148 A | 8/1989 | Sato et al. ................... 359/366 |
| 4,953,960 A | 9/1990 | Williamson ................. 359/663 |
| 5,052,763 A | 10/1991 | Singh et al. ................ 359/355 |
| 5,592,329 A | 1/1997 | Ishiyama et al. ........... 359/399 |
| 5,636,066 A | 6/1997 | Takahashi .................. 359/726 |
| 5,650,877 A | 7/1997 | Phillips, Jr. et al. ........ 359/732 |
| 5,668,673 A | 9/1997 | Suenaga et al. ............ 359/731 |
| 5,686,728 A | 11/1997 | Shafer ..................... 250/492.2 |
| 5,691,802 A | 11/1997 | Takahashi .................... 355/53 |
| 5,815,310 A | 9/1998 | Williamson ................. 359/365 |

(Continued)

FOREIGN PATENT DOCUMENTS

EP    0 828 172 A1    3/1998

(Continued)

*Primary Examiner*—Jordan M. Schwartz
(74) *Attorney, Agent, or Firm*—Fitzpatrick, Cella, Harper & Scinto

(57) ABSTRACT

A projection optical system for projecting an image of an object onto an image plane. The projection optical system includes a first imaging optical system for forming an image of the object in which the first imaging optical system includes a first mirror for reflecting and collecting abaxial light from the object, a second imaging optical system for re-imaging the image upon the image plane, a second mirror for reflecting light from the first mirror to the image plane side, whereby the abaxial light is caused to pass outside of an effective diameter of the first mirror, and a field optical system including three lenses each having a positive refractive power. The abaxial light passed through the outside of the effective diameter of the first mirror is refracted by the three lenses toward a direction nearing an optical axis of the three lenses. Light that has passed through the three lenses is directed to the second imaging optical system, and the first and second imaging optical systems are disposed along a common optical axis.

8 Claims, 33 Drawing Sheets

U.S. PATENT DOCUMENTS

| | | | |
|---|---|---|---|
| 6,172,825 B1 | 1/2001 | Takahashi | 359/859 |
| 6,199,991 B1 | 3/2001 | Braat | 359/856 |
| 6,213,610 B1 | 4/2001 | Takahashi et al. | 359/858 |
| 6,262,836 B1 | 7/2001 | Hudyma et al. | 359/366 |
| 6,302,548 B2 | 10/2001 | Takahashi et al. | 359/858 |
| 6,600,608 B1 | 7/2003 | Shafer et al. | 359/729 |
| 6,636,350 B2 * | 10/2003 | Shafer et al. | 359/366 |
| 2001/0002155 A1 | 5/2001 | Takahashi et al. | 359/858 |
| 2001/0043391 A1 | 11/2001 | Shafer et al. | 359/365 |
| 2003/0197922 A1 * | 10/2003 | Hudyma | 359/359 |

FOREIGN PATENT DOCUMENTS

| | | |
|---|---|---|
| EP | 1 069 448 A1 | 1/2001 |
| JP | 51-149922 | 12/1976 |
| JP | 53-41079 | 4/1978 |
| JP | 61-149922 | 7/1986 |
| JP | 62-210415 | 9/1987 |
| JP | 62-258414 | 11/1987 |
| JP | 63-163319 | 7/1988 |
| JP | 2-66510 | 3/1990 |
| JP | 3-282527 | 12/1991 |
| JP | 4-234722 | 8/1992 |
| JP | 5-188298 | 7/1993 |
| JP | 6-230287 | 8/1994 |
| JP | 8-304705 | 11/1996 |
| JP | 9-211332 | 8/1997 |
| JP | 10-79345 | 3/1998 |
| JP | 10-90602 | 4/1998 |
| JP | 2000-98228 | 4/2000 |
| JP | 2000-100694 | 4/2000 |
| JP | 2001-27727 | 1/2001 |
| JP | 2001-166210 | 6/2001 |

* cited by examiner

| NUMERICAL EXAMPLE NO. | 1 | 2 | 3 | 4 |
|---|---|---|---|---|
| BG2 | -0.147 | -0.127 | -0.144 | -0.234 |
| BG1 | -1.352 | -1.443 | -1.458 | -0.857 |
| P1 | -0.015840 | -0.013120 | -0.016400 | -0.005480 |
| Pf+P2 | 0.015840 | 0.013120 | 0.016390 | 0.005490 |
| e/LM1 | 0.977 | 1.113 | 0.976 | 0.930 |
| OIL/(LM1+2*LM2) | 0.963 | 0.872 | 0.981 | 0.971 |
| LM2/LM1 | 0.688 | 0.761 | 0.673 | 0.448 |
| LM1/L | 0.388 | 0.385 | 0.368 | 0.223 |
| 1/BGM1 | -0.623 | -0.851 | -0.644 | -0.490 |

| NUMERICAL EXAMPLE NO. | 5 | 6 | 7 | 8 | 9 | 10 | 11 | 12 |
|---|---|---|---|---|---|---|---|---|
| BG2 | -0.269 | -0.204 | -0.184 | -0.192 | -0.227 | -0.121 | -0.196 | -0.199 |
| BG1 | -0.773 | -0.779 | -0.820 | -0.944 | -1.585 | -1.358 | -2.190 | -2.318 |
| P1 | -0.010084 | -0.009864 | -0.008851 | -0.009408 | -0.009000 | -0.013156 | -0.008163 | -0.008042 |
| Pf+P2 | 0.010074 | 0.009881 | 0.008860 | 0.009393 | 0.008996 | 0.013159 | 0.008156 | 0.008036 |
| e/LM1 | 1.100 | 1.038 | 2.414 | 1.771 | 0.909 | 0.943 | 0.803 | 0.797 |
| OIL/(LM1+2*LM2) | 0.823 | 0.681 | 0.784 | 0.829 | 1.021 | 0.861 | 0.910 | 0.889 |
| LM2/LM1 | 0.657 | 0.652 | 0.684 | 0.688 | 0.771 | 0.790 | 0.810 | 0.846 |
| LM1/L | 0.280 | 0.302 | 0.260 | 0.268 | 0.352 | 0.410 | 0.356 | 0.368 |
| 1/BGM1 | -1.036 | -1.792 | -1.121 | -0.972 | -0.390 | -0.809 | -0.883 | -0.876 |

FIG. 46

| NUMERICAL EXAMPLE NO. | 13 | 14 | 15 | 16 | 17 | 18 | 19 | 20 | 21 |
|---|---|---|---|---|---|---|---|---|---|
| BG2 | -0.122 | -0.095 | -0.141 | -0.267 | -0.193 | -0.185 | -0.153 | -0.264 | -0.280 |
| BG1 | -1.279 | -1.250 | -2.606 | -3.838 | -1.395 | -2.071 | -1.169 | -36.671 | -2.009 |
| P1 | -0.005007 | -0.004643 | -0.013843 | -0.005904 | -0.008983 | -0.013972 | -0.018751 | -0.006985 | -0.007175 |
| Pf+P2 | 0.004999 | 0.004638 | 0.013836 | 0.005899 | 0.008986 | 0.013988 | 0.018743 | 0.006977 | 0.007171 |
| e/LM1 | 1.164 | 1.088 | 0.914 | 0.959 | 1.113 | 0.925 | 1.000 | 1.316 | 0.979 |
| OIL/(LM1+2*LM2) | 0.874 | 0.827 | 1.036 | 1.537 | 0.779 | 0.950 | 0.845 | 15.187 | 1.634 |
| LM2/LM1 | 0.870 | 0.874 | 0.862 | 0.663 | 0.818 | 0.793 | 0.727 | 0.773 | 0.347 |
| LM1/L | 0.351 | 0.362 | 0.430 | 0.455 | 0.465 | 0.441 | 0.387 | 0.410 | 0.462 |
| 1/BGM1 | -0.679 | -0.778 | -0.667 | -0.670 | -0.994 | -0.796 | -0.863 | 0.119 | -0.551 |
| LFM1/LFM2 | 0.565 | 0.650 | 0.745 | 0.595 | 0.716 | 0.556 | 0.522 | 0.569 | 0.602 |

FIG. 47

PROJECTION OPTICAL SYSTEM AND PROJECTION EXPOSURE APPARATUS

This application is a divisional application of copending U.S. patent application Ser. No. 09/784,021, filed Feb. 16, 2001.

FIELD OF THE INVENTION AND RELATED ART

This invention relates to a projection optical system and a projection exposure apparatus for projecting a pattern of a mask onto a substrate through the projection optical system. More particularly, the invention concerns a catadioptric projection optical system having a reflection mirror, for printing, by projection exposure, a reticle pattern on a semiconductor wafer.

The density of an integrated circuit increases more and more, and the specification and performance required for a projection (exposure) optical system become much stricter. Generally, in order to obtain a higher resolving power, the exposure wavelength is shortened and/or the numerical aperture (NA) of a projection optical system is enlarged.

However, as the exposure wavelength reaches a region of 193 nm (ArF excimer laser light) or 157 nm ($F_2$ excimer laser light), usable lens materials are limited to quartz and fluorite. This is mainly because of decreases of the light transmission factor. For example, in a projection optical system such as disclosed in Japanese Laid-Open Patent Application, Laid-Open No. 79345/1998, wherein it comprises all dioptric lenses of a large number and wherein all lenses have a large glass material thickness, the exposure amount on a wafer becomes low and it causes a decrease of the throughput. Also, due to thermal absorption by the lenses, there occur problems (thermal aberration) such as changes of aberration or shift of the focal point position. When the exposure wavelength is 193 nm, quartz and fluorite can be used as a projection optical system. However, because the difference in dispersion between them is not large, correction of chromatic aberration is difficult to accomplish. In order to correct the chromatic aberration of a projection optical system completely, it is necessary to use a few achromatic lenses having a small curvature radius at its achromatic surface. This leads to an increase of the total glass material thickness of the optical system, which then raises the above-described problems of thermal aberration and transmission factor. Further, currently, it is very difficult to produce a projection optical system by use of fluorite, having a sufficient property to assure its design performance. It is further difficult to produce one having a large diameter. This makes it very difficult to accomplish color correction, and results in an increase of the cost. As for the exposure wavelength of 157 nm, only fluorite is the usable lens material. The chromatic aberration cannot be corrected only with a single lens material. Anyway, it is very difficult to provide a projection optical system only by use of dioptric systems.

In consideration of these inconveniences, many proposals have been made to introduce a reflecting system, having a mirror, into an optical system to thereby avoid the problems of transmission factor and color correction. For example, Japanese Laid-Open Patent Applications, Laid-Open Nos. 211332/1997 and 90602/1998 show a catoptric projection optical system which is constituted only by use of reflecting systems. Further, U.S. Pat. No. 5,650,877 and Japanese Laid-Open Patent Applications, Laid-Open Nos 210415/1987, 258414/1987, 163319/1988, 66510/1990, 282527/1991, 234722/1992, 188298/1993, 230287/1994, and 304705/1996 show a catadioptric projection optical system having a combination of catoptric and dioptric systems.

When a projection optical system which includes a catoptric system to meet the shortening of the exposure wavelength and the enlargement of NA (numerical aperture) is produced, the structure should of course be one that enables correction of chromatic aberration. In addition, idealistically, the structure should be simple and sufficient to enable that an imaging region of sufficient size is defined upon an image plane, that the number of optical elements such as mirrors or lenses is small, that the mirror incidence angle and reflection angle are not large, and that a sufficient image-side working distance is assured.

If an imaging region width of sufficient size is attainable on the image plane, in the case of a scan type projection exposure apparatus, it is advantageous with respect to the throughput, such that the exposure variation can be suppressed. If the number of optical elements is small, the process load in the production of optical elements such as mirrors and lenses can be reduced. Also, since the total glass material thickness can be made smaller, the loss of light quantity can be reduced. Further, the increase of the footprint of the apparatus can be suppressed, and the loss of light quantity due to the film can also be decreased. Particularly, this is very advantageous because, when the exposure wavelength is 157 nm ($F_2$ excimer laser light), the loss of light quantity at the mirror reflection film cannot be disregarded. When the mirror incidence angle and the reflection angle are not large, the influence of a change in light quantity due to the angular characteristic of the reflection film can be suppressed. If a sufficient image-side working distance can be maintained, it is advantageous with respect to structuring an auto focusing system or a wafer stage conveyance system in the apparatus. If the structure is simple, complexity of a mechanical barrel, for example, can be avoided, and it provides an advantage to the manufacture.

Here, the conventional examples are considered with respect to the above-described points.

In the projection optical system shown in U.S. Pat. No. 5,650,877, a Mangin mirror and a refracting member are disposed in an optical system to print an image of a reticle on a wafer. This optical system has inconveniences that, in every picture angle used, there occurs light interception (void) at the central portion of a pupil and that the exposure region cannot be made large. If the exposure region is to be enlarged, it disadvantageously causes widening of the light interception at the central portion of the pupil. Further, the refractive surface of the Mangin mirror defines a beam splitting surface such that the light quantity decreases to a half each time the light passes this surface. The light quantity will be decreased to about 10% upon the image plane (wafer surface).

In the projection optical systems shown in Japanese Laid-Open Patent Applications, Laid-Open Nos. 211332/1997 and 90602/1998, the basic structure comprises a reflection system only. However, with respect to aberration (Petzval sum) and mirror disposition, it is difficult to keep a sufficient imaging region width on the image plane. Also, since, in this structure, a concave mirror adjacent to the image plane and having a large power mainly has an imaging function, enlargement of NA is difficult to accomplish. Since a convex mirror is placed just before the concave mirror, a sufficient image-side working distance cannot be maintained.

In the projection optical systems shown in Japanese Laid-Open Patent Applications, Laid-Open Nos. 210415/

1987 and 258414/1987, a Cassegrain type or Schwarzschild type mirror system is used. An opening is formed at the central portion of the mirror, by which a void is defined in the pupil such that only the peripheral portion of the pupil contributes to the imaging. However, the presence of a void in the pupil will have an influence on the imaging performance. If the pupil void is to be made smaller, the power of the mirror must be large. This causes enlargement of the incidence and reflection angles of the mirror. Further, an enlarged NA (numerical aperture) will cause a large increase of the mirror diameter.

In the projection optical systems shown in Japanese Laid-Open Patent Applications, Laid-Open Nos. 163319/1988, 188298/1993 and 230287/1994, the structure is complicated due to deflection and bend of the optical path. Since most of the power of optical groups for imaging an intermediate image, as a final image, is sustained by a concave mirror, it is structurally difficult to enlarge the NA. The magnification of the lens system which is disposed between the concave mirror and the image plane is at a reduction ratio and also it has a positive sign. Because of it, a sufficient image-side working distance cannot be kept. Further, in order that the object plane and the image plane are placed opposed, it is necessary to use two flat mirrors only for the sake of deflection of the optical path, without any contribution to aberration correction. As the exposure wavelength is shortened to 157 nm, this is undesirable also with respect to the loss of light quantity. Further, it is structurally difficult to hold the imaging region width because of the necessity of light path division. Since the optical system has to be large, there is a disadvantage with respect to the footprint.

In the projection optical systems shown in Japanese Laid-Open Patent Applications, Laid-Open Nos. 66510/1990 and 282527/1991, the optical path is divided by a beam splitter, and this makes the barrel structure complicated. It needs a beam splitter of a large diameter and, if this is of a prism type, the loss of light quantity is large because of its thickness. For a larger NA, a larger diameter is necessary, and thus the loss of light quantity becomes larger. If the beam splitter is of a flat plate type, there will occur astigmatism and coma even in regard to axial light rays. Further, there may occur aberrations due to a change in characteristic at the light dividing surface or production of asymmetric aberration resulting from thermal absorption. It is therefore difficult to manufacture the beam splitter very accurately.

In the projection optical systems shown in Japanese Laid-Open Patent Applications, Laid-Open Nos. 234722/1992 and 304705/1996, many of the above-described inconveniences may be removed. However, each time the optical path is deflected, the light path from a concave mirror is divided. This requires eccentric optical handling and it makes the structure and assembling very complicated.

SUMMARY OF THE INVENTION

It is accordingly an object of the present invention to provide a projection optical system of simple structure and easy assembling wherein an optical system such as disclosed in Japanese Laid-Open Patent Applications, Laid-Open Nos. 234722/1992 and 304705/1996, described above, is improved. It is another object of the present invention to provide a projection exposure apparatus and/or a device manufacturing method using the same.

In accordance with the present invention, a projection optical system, a projection exposure apparatus and a device manufacturing method having features as stated in Items (1)–(37) below are provided.

(1) A projection optical system for projecting an image of an object onto an image plane, comprising: a first imaging optical system for forming an image of the object; a second imaging optical system for re-imaging the image upon the image plane; wherein said first and second imaging optical systems are disposed in an order from the object side and are disposed along a common straight optical axis, wherein said first imaging optical system includes a first mirror for reflecting and collecting abaxial light from the object, wherein one of said first and second imaging optical systems includes a second mirror for reflecting light from said first mirror to the image plane side, and wherein, with said second mirror, the abaxial light is caused to pass an outside of an effective diameter of said first mirror.

(2) A projection optical system according to Item (1) wherein said first imaging optical system has a magnification β which satisfies a relation $|\beta| \geq 1$.

(3) A projection optical system according to Item (1) or (2) wherein said first imaging optical system includes at least one lens.

(4) A projection optical system according to Item (3) wherein said lens has a positive refracting power.

(5) A projection optical system according to any one of Items (1) to (4) wherein said second imaging optical system includes at least one lens.

(6) A projection optical system according to Item (5) wherein said lens has a positive refracting power.

(7) A projection optical system according to any one of Items (1) to (6), further comprising a lens group disposed between said first and second mirrors.

(8) A projection optical system according to Item (7) wherein said lens group has a negative refracting power and wherein said lens group is disposed between said first mirror and a refractive lens of said first imaging optical system, having a positive refracting power.

(9) A projection optical system according to Item (1), further comprising a field optical system disposed between said first and second imaging optical systems, for projecting a pupil of said first imaging optical system onto said second imaging optical system, wherein said first imaging optical system comprises a first mirror group of positive refracting power, including at least said first mirror, and a second mirror group including said second mirror, wherein light from said first mirror group as reflected by said second mirror group is caused to pass an outside of an effective diameter of said first mirror group.

(10) A projection optical system according to Item (9) wherein said second imaging optical system is constituted by lenses only and it has a positive refracting power.

(11) A projection optical system according to Item (9) or (10) wherein said second imaging optical system has a magnification BG2 which satisfies a relation $-0.5 < BG2 < -0.05$.

(12) A projection optical system according to any one of Items (9) to (11), wherein said first imaging optical system has a magnification BG1 which satisfies a relation $-40.0 < BG1 < -0.5$.

(13) A projection optical system according any one of Items (9) to (12), wherein said field optical system is constituted by lenses.

(14) A projection optical system according to any one of Items (9) to (12), wherein said field optical system comprises a first field mirror and a second field mirror group including a second field mirror, wherein abaxial light passed through the outside of the effective diameter of said first mirror group is reflected by said first field mirror and said second field mirror, in this order, and after that, the light passes a region adjacent to the optical axis of said first field mirror and enters said second imaging optical system.

(15) A projection optical system according to Item (14) wherein said first field mirror comprises a concave mirror and wherein said second field mirror comprises a convex mirror.

(16) A projection optical system according to Item (14) wherein said first field mirror comprises a concave mirror and wherein said second field mirror comprises a concave mirror.

(17) A projection optical system according to any one of Items (9) to (16), wherein relations P1<0 and Pf+P2>0 are satisfied where P1, Pf and P2 are Petzval sums of said first imaging optical system, said field optical system and said second imaging optical system, respectively.

(18) A projection optical system according to any one of Items (9) to (17), wherein a relation 0.6<e/LM1<2.5 is satisfied where LM1 is a paraxial distance between the object and said first mirror, and e is a distance from the object to a pupil conjugate point defined by an optical element positioned at the object side of said first mirror.

(19) A projection optical system according to any one of Items (9) to (18), wherein the distance LM1 satisfies a relation 0.5<OIL/(LM1+2×LM2)<20 where LM2 is a paraxial distance between said first and second mirrors, and OIL is a paraxial distance along the optical path, from the object to the image defined by said first imaging optical system.

(20) A projection optical system according to any one of Items (9) to (19), wherein the distances LM1 and LM2 satisfy a relation 0.2<LM2/LM1<0.95.

(21) A projection optical system according to any one of Items (9) to (20), wherein the distance LM1 satisfies a relation 0.15<LM1/L<0.55 where L is a distance from an object plane to an image plane in said projection optical system.

(22) A projection optical system according to any one of Items (9) to (21), wherein said first mirror group has a magnification BGM1 which satisfies a relation −2.0<1/BGM1<0.4.

(23) A projection optical system according to any one of Items (9) to (22), wherein said first imaging optical system has a lens group of positive refracting power, disposed closest to the object side.

(24) A projection optical system according to any one of Items (9) to (23), wherein said first mirror group includes a lens of negative refracting power and said first mirror.

(25) A projection optical system according to any one of Items (9) to (24), wherein said second mirror group includes said second mirror and a lens.

(26) A projection optical system according to any one of Items (9) to (25), wherein the abaxial light from the object passes a lens of said second mirror group before it is incident on said first mirror group.

(27) A projection optical system according to any one of Items (9) to (26), wherein a positive lens, included by said field optical system, is disposed just after the image plane side of said first mirror group of said first imaging optical system.

(28) A projection optical system according to any one of Items (14) to (16), wherein a relation 0.45<LFM1/LFM2<0.8 is satisfied where LFM1 is a distance between said second field mirror and said first field mirror, and LFM2 is a distance between said second field mirror and the image plane.

(29) A projection optical system according to any one of Items (14) to (16), wherein said second field mirror group includes said second field mirror and a lens.

(30) A projection optical system according to any one of Items (14) to (16), (28) and (29), wherein a positive lens, included by said field optical system, is disposed between said first mirror of said first imaging optical system and said second field mirror of said field optical system, wherein light reflected by said second mirror of said first imaging optical system passes said positive lens and then is reflected by said first field mirror.

(31) A projection optical system according to any one of Items (1) to (30), wherein said projection optical system is telecentric with respect to each of the object side and the image plane side.

(32) A projection optical system according to any one of Items (1) to (31), wherein said projection optical system has a magnification of a reduction ratio.

(33) A projection optical system according to any one of Items (1) to (32), further comprising a field stop disposed at the position of the image defined by said first imaging optical system, for changing at least one of a size and a shape of an imaging region upon the image plane.

(34) A projection optical system according to any one of Items (1) to (33), further comprising a stop disposed inside said second imaging optical system.

(35) A projection exposure apparatus for projecting a pattern of a mask onto a substrate through a projection optical system as recited in any one of Items (1) to (34).

(36) A projection exposure apparatus according to Item (35) wherein laser light from one of an ArF excimer laser and an $F_2$ laser is used for the projection exposure.

(37) A device manufacturing method, comprising the steps of: printing a device pattern on a wafer by exposure, using a projection exposure apparatus as recited in Item (35) or (36); and developing the exposed wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 46 illustrates numerical parameters in Examples 1–12 of the present invention.

FIG. 47 illustrates numerical parameters in Examples 13–21 of the present invention.

DESCRIPTION OF THE PREFERRED EMBODIMENTS

Figure 1:
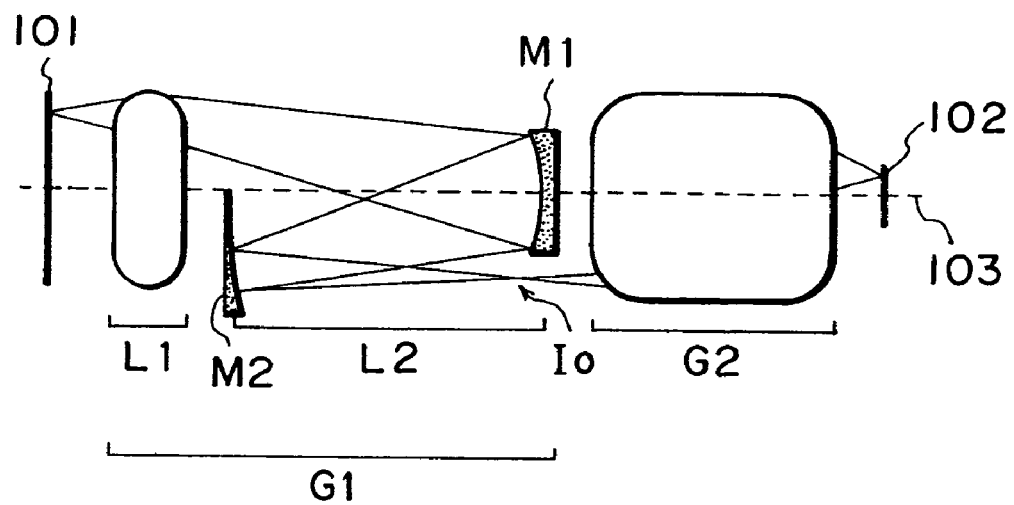
FIG. 1 is a schematic view of an example of the structure of a projection optical system according to an embodiment of the present invention.

In accordance with an embodiment of the present invention, a catadioptric projection optical system, such as shown in FIG. 1, is provided (First Embodiment). Denoted at 101 is a reticle which is illuminated with an illumination system, not shown. Denoted at 102 is a wafer, and denoted at 103 is an lo optical axis of an optical system in the first embodiment. Here, the optical system comprises at least first and second imaging optical systems G1 and G2, in an order from the object side. The reticle 101 and the wafer 102 are held by movable stages (not shown), respectively.

The first imaging optical system G1 comprises, in an order from the object side, at least a first mirror M1, having a refracting element L1, and and a second mirror M2. Light from the reticle 101 is imaged by the first imaging optical system G1, whereby an intermediate image Io is formed. Here, abaxial light from the reticle 101 passes an outside of the effective diameter of the first mirror M1. The intermediate image lo as imaged by the first imaging optical system G1 is then imaged on the wafer 102 by the second imaging optical system G2, comprising a refracting element, at a predetermined magnification. In the structure described above, the optical system of the first embodiment has one optical axis 103, and it accomplishes a multiple-number imaging optical system wherein abaxial light without light interception of a pupil is imaged.

The first imaging optical system G1 comprises, at least, one or more refracting lenses and two mirrors. The refractive lens group L1 mainly functions to keep the telecentricity at the object side and contributes to correction of distortion aberration. Also, it serves so that light is incident on the first mirror M1 without excessive expansion.

The second mirror M2 is disposed opposed to the first mirror M1 and the optical axis 103, and it functions to deflect the light from the first mirror M1 toward the positive direction and also to direct the light toward the outside of the effective diameter of the first mirror M1. Here, the direction from the reticle 101 toward the wafer 102 is taken as a positive direction. With the structure described above, light can be directed to the second imaging optical system without a void in a pupil and without bend of the optical axis.

The refractive lens group L1 should desirably have a positive refracting power. With the positive refracting power, the incidence height on the first mirror M1 can be kept moderate and also the incidence angle on the first mirror M1 with respect to the optical axis can be made large such that separation of light by the second mirror M2 is made easy. The first mirror M1 should desirably be a concave mirror.

In the optical system of the first embodiment, the pupil of the first imaging optical system G1 is present before or after the first mirror M1. In the portion adjacent there, the width of light at each picture angle in the first imaging optical system G1 becomes large. Additionally, dispersion of light due to the difference in picture angle becomes small. Thus, the first mirror M1 as it has a positive power, i.e., as being provided by a concave mirror, is effective to converge lights, of each picture angle, from the refractive lens group L1, such that separation of light after the second mirror M2 is made easier. Also, a curvature of field is produced in an "over" direction, thereby to cancel an "under" curvature of field in the second imaging optical system G2.

The second mirror M2 plays a role of returning the light from the first mirror M1 toward the positive direction along the optical axis 103. Here, the second mirror M2 may be a concave mirror or a flat mirror, or a convex mirror. It should have a required shape based on the difference in power arrangement. It is to be noted that, in the first imaging optical system G1, for cancellation of the curvature of field of the second imaging optical system G2 as well as other aberrations, the second mirror M2 may be a concave mirror. This is preferable since the refracting power of the first mirror M1 is shared by it.

The second imaging optical system G2 has a function for imaging the intermediate image Io, being imaged by the first imaging optical system G1, upon the wafer 102. The second imaging optical system G2 operates to cancel aberrations such as curvature of field in the "over" direction, for example, as produced by the first imaging optical system G1. The second imaging optical system G2 comprises a refractive lens system. By constituting a final imaging optical system with use of a refractive lens system, an optical system having a large numerical aperture can be accomplished easily.

The second imaging optical system has a reduction magnification, and this prevents an excessive increase of the width of light at the first imaging optical system G1 as well as it facilitates separation of light by the first and second mirrors M1 and M2. There is an aperture stop inside the second imaging optical system G2.

The refractive lens group R may be disposed in the group L2, including two mirrors, that is, the first and second mirrors M1 and M2.

Figure 2:
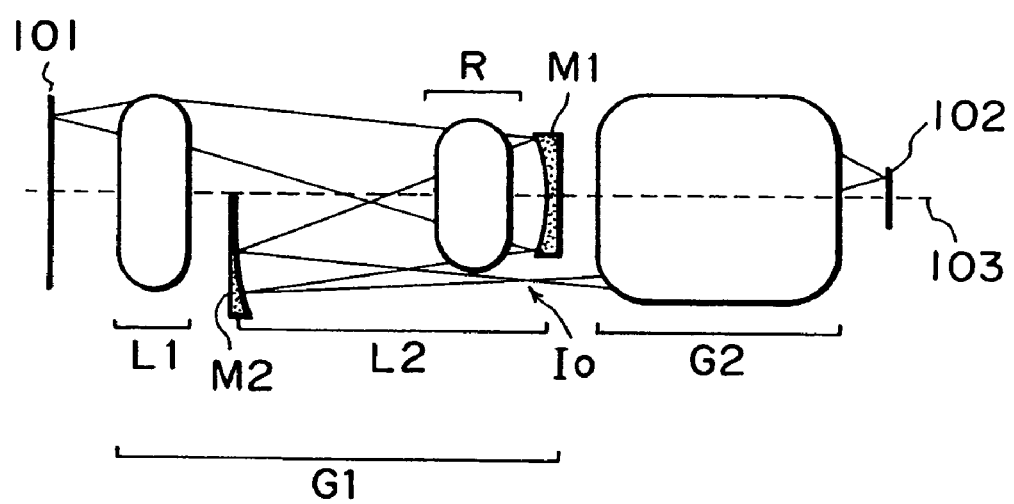
FIG. 2 is a schematic view of an example of the structure of a projection optical system according to a first embodiment of the present invention, wherein a refractive lens group R is disposed in a group L2.

FIG. 2 is a schematic view of an example wherein a refractive lens group R is disposed in the structure of FIG. 1. Here, the same reference numerals as those of FIG. 1 are assigned to members having corresponding functions.

When the refractive lens group R is disposed between the refractive lens group L1 and the first mirror M1, the structure is such as called a reciprocal optical system. Namely, into this refractive lens group R, the light refracted by the refractive lens group L1 enters and, additionally, the light reflected by the second mirror M2 passes therethrough. When this refractive lens group R is used, the refracting power thereof should desirably be negative. If the refracting power of the refractive lens group R is negative, the Petzval sum which the first mirror M1 bears is shared. Also, it contributes to correction of chromatic aberration in the whole system. Thus, if the refractive lens group R is provided, it should desirably have a negative refracting power. Further, simultaneously, it contributes to correction of coma aberration and spherical aberration of the whole system.

As described hereinbefore, mainly for correction of axial chromatic aberration or the like, the refractive lens group R should preferably be disposed about the first mirror M1. However, it may be disposed adjacent to the second mirror R. Namely, it may be disposed at a position for transmitting the reflection light from the first mirror M1 and the reflection light from the second mirror. Further, the refractive lens group R may be disposed at any place within the range of the group L2, including two mirrors. Also, lens elements of any number may be used.

The projection optical system in this embodiment, particularly when it is provided by a double-imaging optical system, has a positive magnification.

In the first embodiment, with the structure such as described above, a catadioptric optical system having constituent elements of a smaller number, having a high resolving power, having an assured wide exposure region, and being easy for assembling and adjustment, can be accomplished without light interception at the central portion of a pupil.

Figure 3:
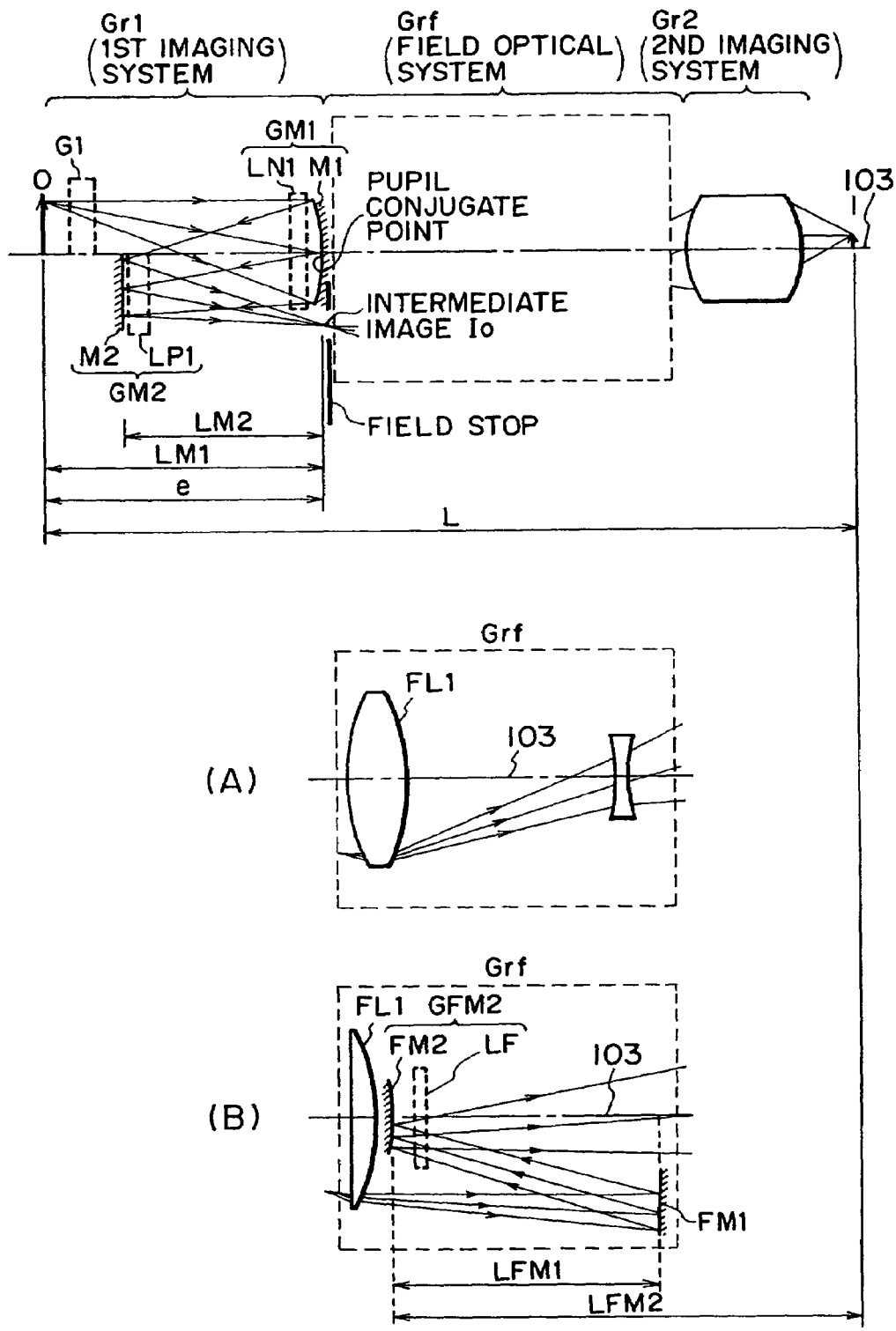
FIG. 3 is a schematic view of a basic structure of a projection optical system according to a second embodiment of the present invention.

In accordance with another embodiment of the present invention, a catadioptric projection optical system such as shown in FIG. 3, for example, is provided (Second Embodiment). In this embodiment, the region of the object plane from which the light reaches the image plane and which is attributable to the imaging is a semi-arcuate zone (ring-like field) outside the optical axis, and there is no void at the central portion of the light upon the pupil plane. The projection optical system comprises, in an order along the optical path from the object side, a first imaging system Gr1 having a function for forming an intermediate image of the object, a field optical system Grf for projecting a pupil of the first imaging system Gr1 onto a pupil of a second imaging system Gr2, and the second imaging system Gr2 is disposed just before the image plane and operates to form a final image. The first imaging system Gr1 includes two mirror groups, i.e., a first mirror group Gm1 including a first mirror M1 and having a positive refracting power, and a second mirror group GM2 including a second mirror M2. The second mirror group GM2 is disposed physically at the object side of the first mirror group GM1, and the first mirror M1 is a concave mirror having its concave surface facing to the object side. The light from the object side is reflected by the first and second mirrors M1 and M2, in this order, inside the first imaging system Gr1. After this, the light goes through the outside of the effective diameter of the first mirror group GM1 toward the image side, and it passes through the field optical system Grf and the second imaging system Gr2. Thus, the whole system of the projection optical system is defined along a straight optical axis 103. The object plane and the image plane are opposed to each other, at the opposite ends of the optical axis 103. The magnification of the projection optical system is a reduction ratio.

FIG. 3 is a schematic view of a basic structure of the second embodiment, and FIGS. 12–45 show Examples 5–21, respectively, to which the second embodiment is applied, to be described later. In all examples, the first imaging system Gr1 has two mirrors, and the second imaging system Gr2 comprises refractive lens systems only.

FIGS. 12–19 show cases wherein the field optical system Grf is provided by lens systems, and FIGS. 20–28 show cases wherein the field optical system Grf has two mirrors.

Generally, when a mirror is used, the optical system functions as follows.

(a) No chromatic aberration occurs at the mirror.

With this feature, when a concave lens and a concave mirror are combined to provide a Mangin mirror, even by a positive power, excessive dichromatism can be produced.

(b) The relation between the power of the mirror and the Petzval sum is opposite to that of an ordinary refractive lens.

With this feature, since a concave mirror, for example, has a negative value of Petzval sum while it has a positive power, the power load of a negative lens in the optical system for correction of Petzval sum can be reduced.

(c) Light rays are reflected.

Because of this, the optical system has to be complicated to place the object and image planes opposed to each other. For example, there occurs a void in the pupil, ring field, and bend of the optical path.

In this embodiment, to accomplish the above-described purposes, the functions of a mirror such as described above are effectively reflected to the optical system. As shown in FIG. 3, the structure is simple and the projection optical system is disposed along a straight optical axis 103, although it uses a first imaging system, a field optical system, a second imaging system and a mirror, as shown in FIG. 3. This provides significant advantages. Since there is no necessity of bending the optical path, the barrel structure can be made simple like that of a conventional refractive lens system. As regards the self-weight deformation of an optical element, since the gravity direction and the optical axis direction are registered with each other, there does not occur asymmetrical deformation. Thus, an asymmetrical aberration does not occur easily. Current equipment for the manufacture, such as peripheral equipment for assembling and adjustment as well as instruments for measurement, for example, can be used. This is very advantageous with respect to the cost. Further, since the footprint of the apparatus is substantially the same as that of a conventional refractive lens system, the area to be occupied is unchanged. This feature is accomplished by the arrangement that, while an optical system concept (ring field system) in which only paraxial light contributes to the imaging, is set, the function (c) described above is used twice in the first imaging system Gr1, and double reflections are accomplished with the use of two mirrors, and that the light from the object side is directed through the outside of the effective diameter of the first mirror group GM1 to the image side. The light thereafter passes through the field optical system Grf and the second imaging system Gr2, and it reaches the image plane. Thus, an optical system having a single optical axis is accomplished.

The second imaging system Gr2 is provided by a refractive lens system, and it has a positive refracting power. With this structure, enlargement of the NA can be met and, additionally, the image side working distance can be assured easily. If the second imaging system Gr2 has a concave mirror, as described with reference to the conventional examples, it becomes difficult to enlarge the NA and to keep the image side working distance. The field optical system Grf may be provided by refractive lens systems, as shown at (A) in FIG. 3. Alternatively, it may comprise two mirrors, such as shown at (B) in FIG. 3. As will be described later in relation to the examples, depending on the power arrangement, the positive lens FL1 may be omitted. In the case of (B) in FIG. 3, the field optical system Grf includes a first field mirror FM1, comprising a concave mirror, and a second field mirror FM2, comprising a convex mirror. The second field mirror may be provided by a concave mirror.

As regards the color correction, the achromatic state of the first imaging system Gr1 may be made "over achromatism" on the basis of the function (a) described above, when the first mirror group GM1 is constituted by a lens LN1 of negative refracting power as well as the first mirror M1, which is a concave mirror. Thus, even though a single glass material is used for the lens, correction of chromatic aberration can be attained. This is very advantageous particularly for use of an ArF excimer laser or an $F_2$ excimer laser.

As regards reduction in the number of optical elements or reduction in size and weight, since this embodiment concerns a ring field system using abaxial light only, the mirror diameter can be made smaller than that of an optical system of a Cassegrain type or Schwarzschild type. Further, the number of mirrors is small in this embodiment, as at least two.

In the first imaging system Gr1, due to the function (b) described above, the first mirror group GM1 of the first imaging system Gr1 provides a large negative Petzval sum. Thus, the field optical system Grf and the second imaging system Gr2 can be provided, without using many negative refracting power lenses for correction of the Petzval sum as in the conventional refractive lens system. As a result, the number of lenses can be reduced. Further, where the second mirror group GM2 of the first imaging system Gr1 is provided by a lens LP1 and a mirror M2, the power sharing of the lens LP1 and the second mirror M2 can be changed, while keeping the total power of the second mirror group GM2 unchanged. Thus, the Petzval sum can be controlled as desired. The degree of freedom for aberration correction increases, and it contributes to reduction of the number of optical elements. This is also the case with the second field mirror FM2 shown at (B) in FIG. 3 and, by combining the second field mirror FM2 and the lens LF into a second field mirror group, the degree of freedom for the Petzval sum correction increases, which contributes to reduction in the number of optical elements. There arises a necessity that the positive refracting power of the second imaging system Gr2 should be made large so as to cancel the large negative Petzval sum of the first imaging system Gr1. Since the principal light ray height emitted from the first imaging system Gr1 passes the outside of the first mirror group GM1, it is incident on the field optical system Grf at a high position. Thus, the angle of the principal light ray entering the second imaging system Gr2 from the field optical system Grf becomes larger. As a result, in order to maintain the image-side telecentricity, there arises a necessity that the positive refracting power of the second imaging system Gr2 should be larger. Since the positive refracting power of the second imaging system Gr2 can be enlarged without contradiction to these two necessities.,the effective diameter of the second imaging system Gr2 becomes smaller. Thus, the reduction in size and weight is accomplished.

As regards the incidence angle and reflection angle of light on the mirror, because this embodiment concerns a ring field system, the incidence angle and the reflection angle of the light on the mirror can be made smaller than that in an optical system of a Cassegrain type or Schwarzschild type. Further, in the first imaging system Gr1, the first mirror M1 is disposed adjacent to a point optically conjugate with a pupil, and the light reflected by the second mirror M2 passes about the outside of the effective diameter of the first mirror group GM1. Since the light is not reflected at a high position away from the optical axis of the mirror, the incidence angle and the reflection angle of the light on the first and second mirrors M1 and M2 do not become extraordinarily large. In a case where the field optical system Grf has a structure as shown at (B) in FIG. 3, the spacing between the first and second field mirrors FM1 and FM2 is kept large as much as possible. Also, the width of the light is narrow. Therefore, the incidence angle and the reflection angle do not become extraordinarily large.

As regards the width of the imaging region on the image plane, the mirror should be disposed so as to keep the effective light as much as possible. When the field optical system Grf comprises only a refractive lens system (FIG. 3, (A)) or it includes a mirror (FIG. 3, (B)), in the first imaging system Gr1, the object height may be made high within the tolerable range of aberration correction. Thus, this is not an obstacle. In the field optical system Grf having a field mirror (FIG. 3, (B)), since the width of light is narrow, it is easy to avoid an eclipse of the effective light flux. Therefore, a sufficient imaging region width can be attained.

In the first imaging system Gr1, a positive lens group G1 may be disposed just after the object plane. This is effective for the correction of distortion aberration, for example, and to maintain its object-side telecentricity satisfactorily. Therefore, in order to reduce any warp of the object plane (reticle) or image plane (wafer) or to decrease a change in magnification due to defocus, it is desirable to provide an optical system being telecentric both in the object side and the image side, by using the positive lens group G1 and the second imaging system Gr2. In the present invention, as shown in FIG. 3, the second mirror M2 should have a half disk-like shape, for separation of light. The positive lens group G1 may have either a half disk-like shape, or it may have a disk-like shape for easiness of lens manufacture and lens holding. Further, the second mirror M2 may be formed at the surface portion below the optical axis. For the same reason, the lens LP1 having a half disk-like shape, may have a disk-like shape. On that occasion, the light passes the lens LP1 three times. Similarly, the second mirror M2 may be formed at the lower surface portion of the lens LP1. Also, the first mirror M1 may be formed as a back-surface mirror of the lens LN1. The mirrors used in the present invention may be back-surface mirrors, with respect to the aberration correction.

As shown at (A) and (B) of FIG. 3, the field optical system includes a positive lens FL1 disposed at the back, on the image plane side, of the first mirror group GM1 of the first imaging system Gr1. This structure suppresses enlargement of the diameter. While it is necessary to form the first face of the positive lens FL1 to have a discontinuous shape such as dual curvature, for example, the first mirror M1 may be formed at the central portion of the positive lens FL1. Further, a field stop may be disposed at the position of an intermediate image of the first imaging system, to define a variable imaging region on the image plane. This is effective to make the illumination system (not shown) very simple.

In the second embodiment, the optical system should preferably satisfy the following conditions.

When the magnification of the second imaging system Gr2 is BG2, the following relation should be satisfied:

$$-0.5 < BG2 < -0.05 \quad (1)$$

When the magnification of the first imaging system Gr1 is BG1, the following relation should be satisfied:

$$-40.0 < BG1 < -0.5 \quad (2)$$

When the Petzval sums of the first imaging system Gr1, of the field optical system Grf and of the second imaging system are P1, Pf and P2, respectively, the following relations are satisfied:

$$P1 < 0$$

$$Pf + P2 > 0 \quad (3)$$

When the paraxial distance between the object and the first mirror is LM1, and the distance from the object to a pupil conjugate point defined by an optical element, which is at the object side of the first mirror, is e, these distances satisfy the following relation:

$$0.6 < e/LM1 < 2.5 \quad (4)$$

When the paraxial distance between the first and second mirrors is LM2, and the paraxial distance from the object plane to the intermediate image by the first imaging system OIL, the distance LM1 described above satisfies the following relation:

$$0.5 < OIL/(LM1 + 2 \times LM2) < 20 \quad (5)$$

The distances LM1 and LM2 satisfy the following relation:

$$0.2 < LM2/LM1 < 0.95 \quad (6)$$

When the distance from the object plane to the image plane with respect to the projection optical system is L, the distance LM1 described above satisfies the following relation:

$$0.15 < LM1/L < 0.55 \quad (7)$$

When the magnification of the first mirror group is BGM1, the following relation is satisfied:

$$-2.0 < 1/BGM1 < 0.4 \quad (8)$$

The condition (1) defines the magnification of the second imaging system Gr2 in a proper range, so as to obtain a good imaging performance and to assure the back focus (image side working distance), while meeting enlargement of the NA. By keeping a negative value throughout the whole range, the back focus is assured easily.

Here, if the lower limit is exceeded, the power of the second imaging system Gr2 becomes small, such that the diameter of the second imaging system becomes large, or the virtual object height with respect to the second imaging system Gr2 becomes low. As a result, the powers of the groups constituting the field optical system Grf become larger, causing difficulties in correction of distortion aberration or curvature of field. Alternatively, the magnification of the first imaging system Gr1 becomes too small, such that there may occur interference of the reflection light from the second mirror M2 with the first mirror group GM1. This makes the power arrangement difficult. On the other hand, if the upper limit is exceeded, the power of the second imaging system Gr2 increases, and it makes the correction of aberration difficult to accomplish. Further, the diameter of the field optical system Grf disadvantageously increases.

The condition (2) defines the magnification of the first imaging system Gr1 so that, while keeping an appropriate power of the first imaging system Gr1, the reflection light from the second mirror M2 efficiently passes without interference with the first mirror group GM1. If the lower limit is exceeded, the width of light becomes large at the outside of the first mirror group GM1, to cause an enlargement of the field optical system Grf or an increase of the power of the second imaging system Gr2. This makes the aberration correction difficult to accomplish.

If the upper limit is exceeded, the power of the first imaging system Gr1 increases to cause difficulties in aberration correction. Alternatively, there may occur an inconvenience that the reflection light from the second mirror M2 interferes with the first mirror group GM1. Here, the lower limit of the condition (2) may preferably be equal to −5.0.

The condition (3) relates to the Petzval sum which determines the field curvature of the optical system as a whole. The Petzval sum of the whole system may preferably be equal to about zero. However, in this embodiment, due to the presence of the first mirror group GM1, the Petzval sum of the first imaging system Gr1 has a large negative value. In order to cancel this, the total of the Petzval sum of the field optical system Grf and that of the second imaging system Gr2 has a large positive value. If this condition is not satisfied, for correction of the Petzval sum, the number of lenses becomes larger, or the correction of curvature of field becomes difficult to accomplish.

The condition (4) concerns the positional relation of the pupil conjugate point of the first imaging system and the first mirror M1. Taking into account a decrease of curvature of field or higher order distortion aberration and a decrease of the mirror incidence angle such as described above, it is desirable to take the positional relation substantially registered. If the lower limit is exceeded, the heights as the principal rays from each object height are reflected by the first mirror M1 differ from each other. This causes increases of higher order distortion aberration and the curvature of field. Also, since the diameter of the first mirror group GM1 becomes larger, there occurs an inconvenience of interference of the reflection light from the second mirror M2 with the first mirror group GM1. If the upper limit is exceeded, similarly the heights as the principal rays from each object height are reflected by the first mirror M1 differ from each other, and it causes increases of higher order distortion aberration as well as the curvature of field. Also, since the angle of the reflection light from the second mirror M2 with respect to the optical axis becomes larger, the power sharing or the field optical system Grf becomes large, which makes it difficult to accomplish the aberration correction.

Condition (5) concerns the positional relation of the intermediate image by the first imaging system Gr1 and the first mirror M1. Under the condition, the reflection light from the second mirror M2 efficiently passes toward the image side without interference with the first mirror group GM1. As shown in FIG. 3, it is preferable that an intermediate image is formed substantially outside the first mirror M1. Thus, if this range is exceeded, the width of light outside the first mirror M1 becomes large, and the diameter of the field optical system Grf becomes large. This causes an increase of aberration. Particularly, if the lower limit is exceeded, the magnification of the first imaging system Gr1 becomes too small, and there may occur an inconvenience of interference of the reflection light from the second mirror M2 with the first mirror group GM1. Further, the powers of the first and second mirrors M1 and M2 become too large, and the amount of aberration production undesirably increases. If the upper limit is exceeded, to the contrary, the magnification of the first imaging system Gr1 becomes too large. As a result, an excessive space is produced outside the first mirror M1, or the magnification has to be reduced by means of the second imaging system Gr2. Thus, the power balance of the optical system as a whole is undesirably destroyed. The upper limit of the condition (5) may preferably be equal to 3.0.

Condition (6) defines a proper position of the second mirror M2 with respect to the first mirror M1. If the lower limit is exceeded, it causes an inconvenience that the light directed from the object plane to the first mirror M1 is eclipsed by the second mirror M2. If the upper limit is exceeded, the second mirror M2 and the object plane come close to each other, and the space at the object side becomes small.

Condition (7) defines a proper position of the first mirror M1 with respect to the total length of the optical system. If this range is exceeded, the power balance of the optical system as a whole is undesirably destroyed. Particularly, if the lower limit is exceeded, the power of the first imaging system Gr1 increases. If the upper limit is exceeded, the power of the second imaging system increases. The balance of Petzval sum or aberration cancelling relation is undesirably destroyed.

Condition (8) defines the magnification of the first mirror group GM1 in the first imaging system Gr1. If this range is exceeded, the power of the first mirror group GM1 goes beyond a proper range. The power of the second mirror group GM2 for causing the reflection light from the second mirror M2 to pass through the outside of the first mirror group GM1, is restricted. This results in higher order aberration or curvature of field. The light may interfere with the first mirror group GM1. Further, the power balance with the second imaging system Gr2 is influenced, to cause the aberration correction more difficult. Particularly, if the lower limit is exceeded, the magnification of the first imaging system Gr1 becomes larger toward the enlargement side, so that the power of the second imaging system Gr2 becomes larger. Any way, the aberration correction is difficult to accomplish. The upper limit of the condition (8) may preferably be equal to −0.2.

Particularly, in an embodiment such as shown at (B) in FIG. 3, the field optical system Grf comprises a first field mirror FM1 being a concave mirror having a concave surface facing to the object side, and a second field mirror group GFM2 including a second field mirror FM2. The first field mirror FM1 is physically disposed at the image plane side of the second field mirror group GFM2. The second imaging system Gr2 is constituted by refractive lenses only, and it has a positive refracting power. Light from the object is reflected in the first imaging system Gr1 by the first and second mirrors M1 and M2, in this order, and after this, the light passes the outside of an effective diameter of the first mirror group GM1 to the image side. Then, the light is reflected in the field optical system, by the first and second field mirrors FM1 and FM2 in this order. Thereafter, the light goes about the optical axis center of the first field mirror FM1 to the image plane side, and finally it passes the second imaging system Gr2. Thus, the projection optical system as a whole is provided along a straight line of optical axis 103. The object plane and the image plane are opposed to each other, at the opposite ends of the optical axis 103. The magnification of the projection optical system as a whole is at a reduction ratio.

Important features of an embodiment such as shown at (B) in FIG. 3 reside in that, in the first imaging system Gr1, the above-described function (c) is used twice such that the reflection is performed twice by using two mirrors of the first and second mirrors M1 and M2, and that the light from the object is directed through the outside of the effective diameter of the first mirror group GM1 to the image plane side. Also, even in the field optical system Grf, the above-described function (c) is used twice, and the reflection is made twice by using two mirrors of first and second field mirrors FM1 and FM2, so that the light is directed to the image plane side through the optical axis central portion of the first field mirror FM1

The optical system of this embodiment preferably satisfies the following conditions.

When the magnification of the first imaging system Gr1 is BG1, the following relation should be satisfied:

$$-40.0<BG1<-0.9 \quad (9)$$

When the distance between the object plane and the first mirror M1 is LM1, and the distance of a pupil conjugate point defined by an optical element, which is at the object side of the first mirror M1, is e, these distances satisfy the following relation:

$$0.8<e/LM1<1.5 \quad (10)$$

The distance LM1, the distance LM2 between the first and second mirrors M1 and M2, and the paraxial distance OIL from the object plane to the intermediate image by the first imaging system Gr1 satisfy the following relation:

$$0.6<OIL/(LM1+2\times LM2)<20 \quad (11)$$

The distance LM1 and the conjugate length L of the projection optical system as a whole satisfy the following relation:

$$0.75<LM1/L<0.55 \quad (12)$$

When the magnification of the first mirror group GM1 is BGM1, the following relation is satisfied:

$$-1.2<1/BGM1<0.4 \quad (13)$$

The distance LFM1 between the first and second field mirrors FM1 and FM2, and the distance LFM2 between the second field mirror FM2 and the image plane, satisfy the following relation:

$$0.45<LFM1/LFM2<0.8 \quad (14)$$

Conditions (9) to (13) are similar to those described hereinbefore. Condition (14) defines the positional relation of the first and second field mirrors FM1 and FM2. If the lower limit is exceeded, the space between the first and second field mirrors FM1 and FM2 becomes narrower, and the powers of the mirrors become larger. Thus, the aberration at the mirror surface disadvantageously increases. If the upper limit is exceeded, the lens space for constituting the second imaging system Gr2 becomes narrower, and the aberration disadvantageously increases due to an increase of the power of each lens.

In the second embodiment of the present invention as described above, the optical system comprises a first imaging system, a field optical system and a second imaging system. Two mirrors of the first imaging system are used to perform reflection twice, to direct light to the image plane side. By this, the structure becomes very simple wherein the optical axis extends along a single straight line. Further, when predetermined conditions such as positional relations of the mirrors, and magnification sharing of each imaging system and each mirror group, are satisfied, a sufficient imaging region width is attainable. Thus, a catadioptric projection optical systems, which is small in size and light in weight, which has optical elements of a reduced number, which has incidence angles and reflection angles on the mirrors not being very large, and which has a sufficient image side working distance, is accomplished.

A specific example of the present invention will now be described. Examples 1–4 are those based on the first embodiment described above, and examples 5–21 are those based on the second embodiment.

EXAMPLE 1

Figure 4:
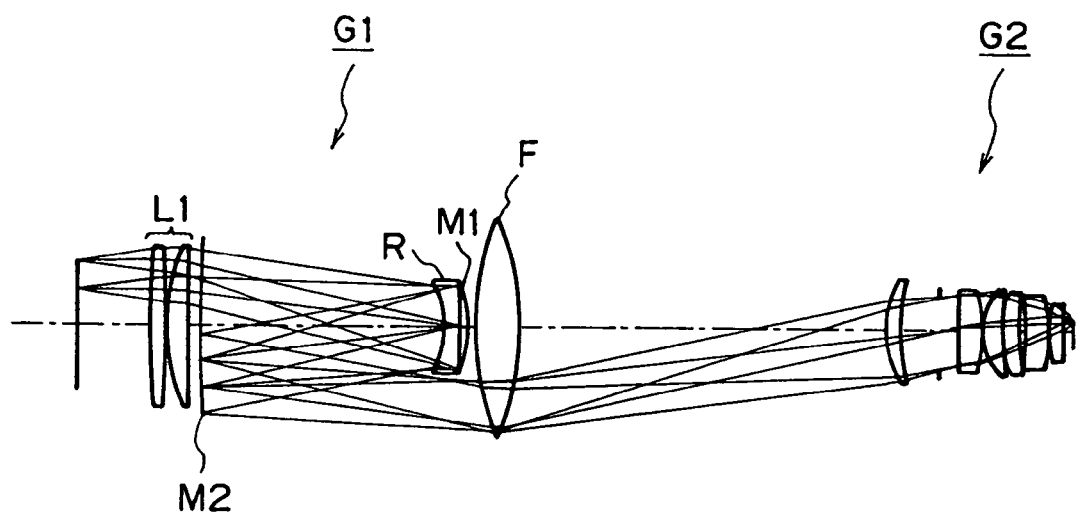
FIG. 4 is a sectional view of a lens structure in Example 1 of the present invention.

FIG. 4 shows a specific lens structure of Example 1. The projection magnification was 1:4, and the design base wavelength was 157 nm. The glass material was fluorite.

The projection optical system comprises, in an order from the object side, a refractive lens group L1 having a positive refracting power, a refractive lens group R which is a reciprocal optical system wherein both the incidence light and reflection light of a first mirror M1 (to be placed later) transmit therethrough, a concave mirror (first mirror) M1, a concave mirror (second mirror) M2, a field lens group F, and a second imaging optical system G2.

In this embodiment, the image side numerical aperture was NA=0.6, the reduction magnification was 1:4, and the object-to-image distance (from the first object plane to the second object plane) was L=about 1170 mm. The design base wavelength was 157 nm. In the range of the image height of about 11.25–19.75 mm, the aberration was corrected. An abaxial exposure region of arcuate shape, having at least a size of about 26 mm in the lengthwise direction and 8 mm in the width was assured.

Figure 8:
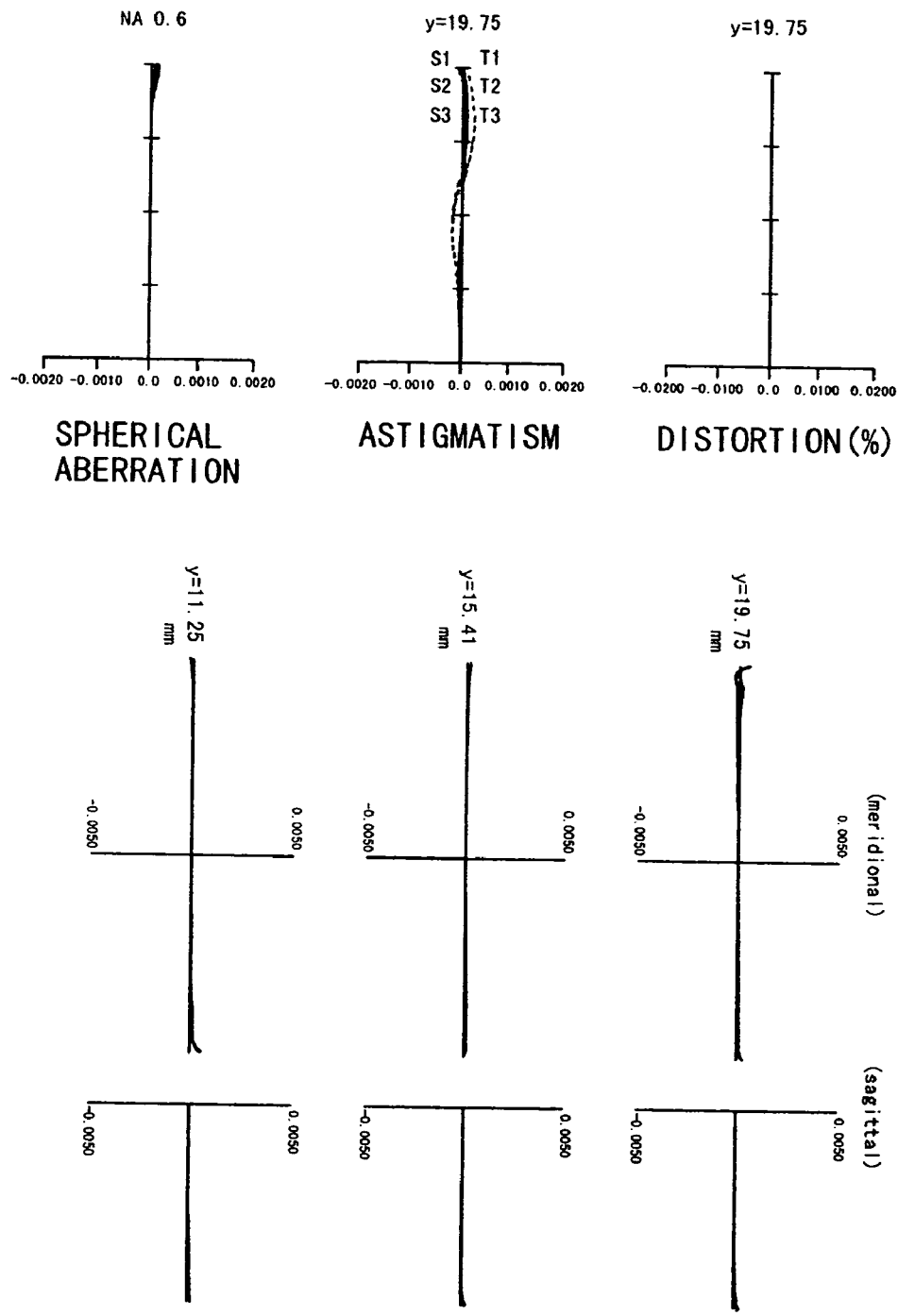
FIG. 8 illustrates aberrations in Example 1 of the present invention.

FIG. 8 shows longitudinal and transverse aberrations of this example, and structural specifications of a numerical example are shown in Table 1. The aberrations in the drawing concern the base wavelength 157 nm ±2 pm.

The refractive lens group L1 comprises, in an order from the object side, an aspherical positive lens having a biconvex shape, and an aspherical positive lens of approximately flat-convex shape having a convex surface facing to the object side. With the refractive lens group L1, the telecentricity and the balance of distortion aberration are held satisfactorily and, additionally, the light is refracted toward the first mirror M1 and the reciprocal optical system R.

The refractive lens group R (reciprocal optical system) comprises an aspherical negative lens of a meniscus shape, having a concave surface facing to the object side. With this negative lens, mainly the curvature of field and axial chromatic aberration are corrected. Also, with the aspherical surface, mainly the spherical aberration and coma aberration, for example, are corrected.

The first mirror M1 comprises an aspherical surface concave mirror having a concave surface facing to the object side. It has a positive refracting power and functions to produce a curvature of field in the positive direction to cancel the negative curvature of field of the second imaging optical system which comprises a refractive lens. The second mirror M2 comprises a concave mirror having a concave surface facing to the image side, and it serves to direct the abaxial light on the first object 101 to the outside of the effective diameter of the first mirror M1. An intermediate image is formed adjacent to the outside of the effective diameter of the first mirror M1. In this example, the first imaging optical system is an enlarging system, and separation between the reflection light from the first mirror M1 and the reflection light from the second mirror M2 is accomplished easily.

In this example, a single aspherical lens of biconvex shape is disposed, as a field lens group F, adjacent to the intermediate image.

The second imaging optical system G2 comprises, in an order from the object side, an aspherical positive lens of a meniscus shape having a concave surface facing to the object side, an aperture stop, an aspherical positive lens of approximately flat-convex shape having a convex surface facing to the image side, an aspherical positive lens having a convex surface facing to the object side, an aspherical lens having a concave surface facing to the image side, an aspherical lens having a convex surface facing to the image side, and an aspherical positive lens having a convex surface facing to the object side. The second imaging optical system G2 provides a reduction system for imaging the light from the field lens group F onto the second object surface 102. Because the light is incident on the aperture stop with a certain angle, the effective diameter of the refractive lens about the aperture stop can be suppressed to be small. With this arrangement, various aberrations such as axial chromatic aberration and spherical aberration can be reduced and, additionally, they can be cancelled with various aberrations produced in the first imaging optical system. Thus, satisfactory aberration correction is accomplished in the whole system.

In this example, the second mirror M2 is a spherical mirror, and all the remaining elements have an aspherical surface. However, the refractive lenses of the first and second imaging optical systems G1 and G2 and the first mirror M1 may not be defined by an aspherical surface. A spherical lens or spherical mirror may be used therefor. However, use of an aspherical surface can correct the aberrations better.

EXAMPLE 2

Figure 5:
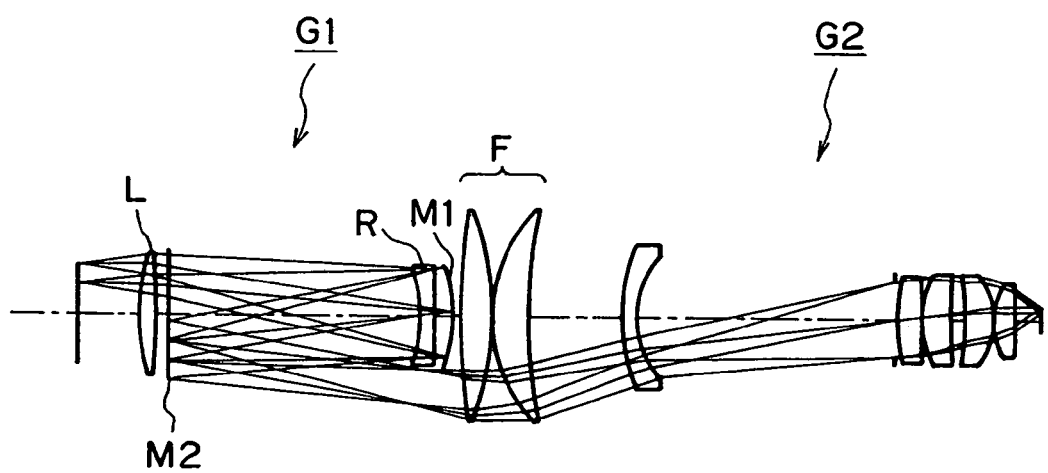
FIG. 5 is a sectional view of a lens structure in Example 2 of the present invention.

FIG. 5 shows a specific lens structure of Example 2. The projection magnification was 1:4, and the design base wavelength was 157 nm. The glass material was fluorite.

The projection optical system comprises, in an order from the object side, a refractive lens group L1 having a positive refracting power, a refractive lens group R which is a reciprocal optical system wherein both the incidence light and reflection light of a first mirror M1 (to be placed later) transmit therethrough, a concave mirror (first mirror) M1, a flat mirror (second mirror) M2, a field lens group F, and a second imaging optical system G2.

In this embodiment, the image side numerical aperture was NA=0.60, the reduction magnification was 1:4, and the object-to-image distance (from the first object plane to the second object plane) was L=about 1205 mm. In the range of the image height of about 0–16.25 mm, the aberration was corrected. An abaxial exposure region of arcuate shape, having at least a size of about 26 mm in the lengthwise direction and 4 mm in the width was assured.

Figure 9:
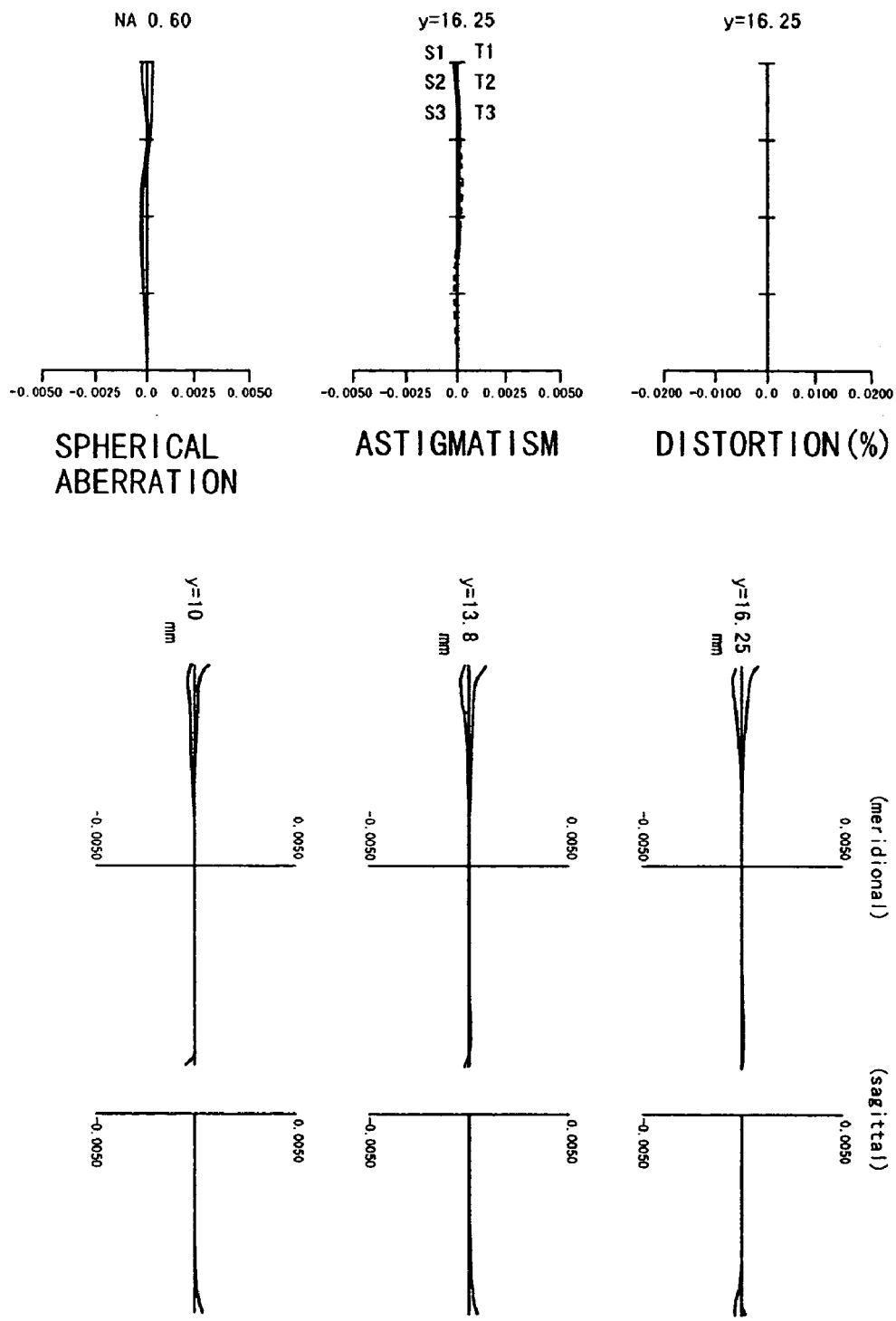
FIG. 9 illustrates aberrations in Example 2 of the present invention.

FIG. 9 shows longitudinal and transverse aberrations of this example, and structural specifications of a numerical example are shown in Table 2. The aberrations in the drawing concern the base wavelength and a wavelength ±2 pm.

The refractive lens group L1 comprises, in an order from the object side, a single aspherical positive lens having a biconvex shape. The group Le including two mirrors comprises a refractive lens group R (reciprocal optical system) and first and second mirrors M1 and M2.

The refractive lens group R (reciprocal optical system) comprises an aspherical negative lens having a concave surface facing to the object side. The first mirror M1 comprises an aspherical surface concave mirror having a concave surface facing to the object side. The second mirror M2 is a flat mirror.

A field lens group F is disposed adjacent to an intermediate image as formed by the first imaging optical system. The field lens group F comprises, in an order from the object side, an aspherical positive lens of biconvex shape, and an aspherical positive lens of meniscus shape having a concave surface facing to the image side.

The second imaging optical system G2 comprises, in an order from the object side, an aspherical negative lens of meniscus shape having a concave surface facing to the image side, an aperture stop, an aspherical positive lens of biconvex shape, a spherical positive lens of meniscus shape having a convex surface facing to the object side, an aspherical positive lens having a convex surface facing to the image side, an aspherical positive lens having a convex surface facing to the image side, and an aspherical positive lens of approximately flat-convex shape having a convex surface facing to the object side. In this example, the second imaging optical system G2 includes a strong negative lens.

EXAMPLE 3

Figure 6:
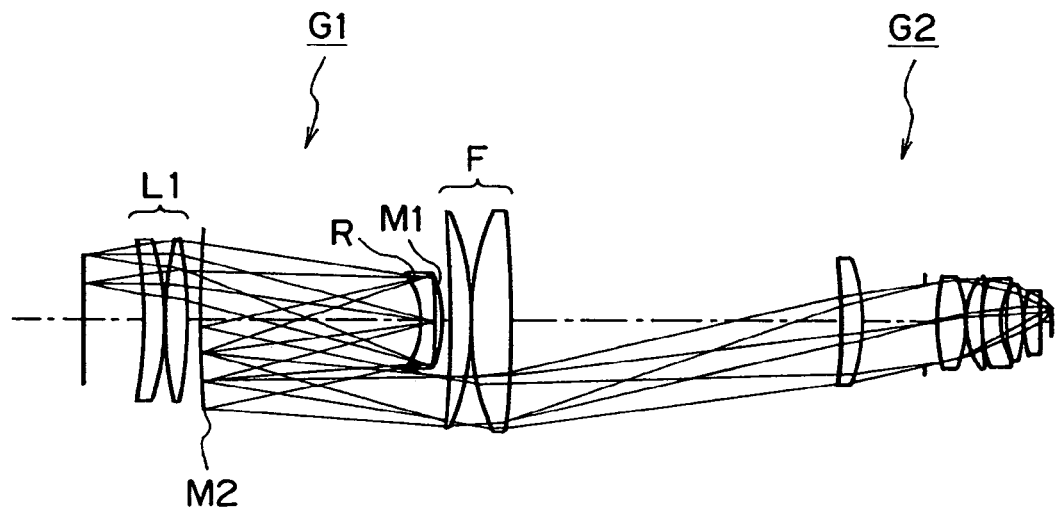
FIG. 6 is a sectional view of a lens structure in Example 3 of the present invention.

FIG. 6 shows a specific lens structure of Example 3. The projection magnification was 1:4, and the design base wavelength was 157 nm. The glass material was fluorite.

In this embodiment, the image side numerical aperture was NA=0.68, the reduction magnification was 1:4, and the object-to-image distance (from the first object plane to the second object plane) was L=about 1185 mm. In the range of the image height of about 11.25–20.25 mm, the aberration was corrected. An abaxial exposure region of arcuate shape, having at least a size of about 26 mm in the lengthwise direction and 8 mm in the width was assured.

Figure 10:
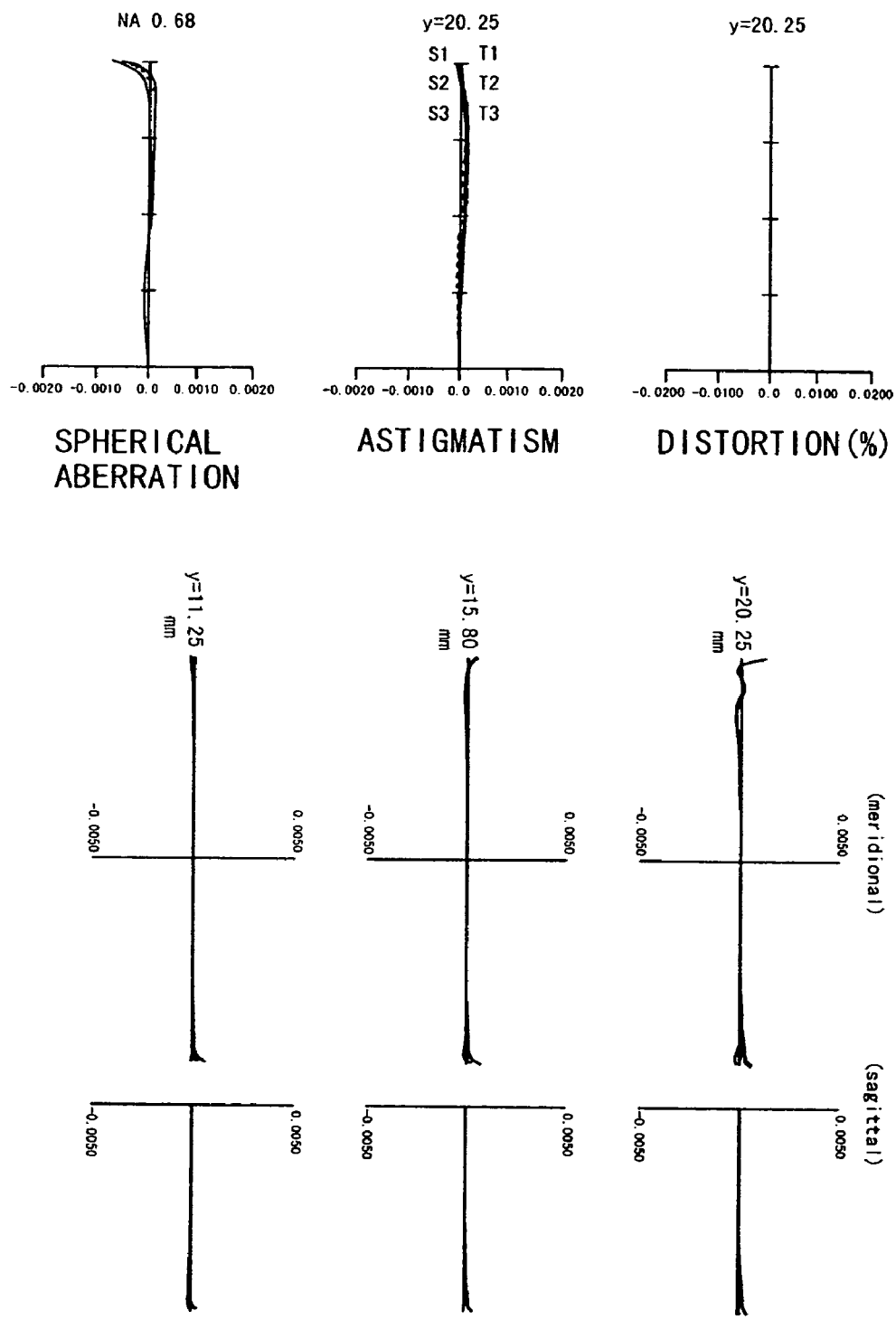
FIG. 10 illustrates aberrations in Example 3 of the present invention.

FIG. 10 shows longitudinal and transverse aberrations of this example, and structural specifications of a numerical example are shown in Table 3. The aberrations in the drawing concern the base wavelength 157 mn 2 pm.

The refractive lens group L1 comprises, in an order from the object side, an aspherical positive lens of meniscus shape having a concave surface facing to the object side, and an aspherical positive lens of biconvex shape. The refractive lens group R (reciprocal optical system) comprises an aspherical negative lens of meniscus shape, having a concave surface facing to the object side.

The first mirror M1 comprises an aspherical surface concave mirror having a concave surface facing to the object side. It has a positive refracting power and functions to produce a curvature of field in the positive direction to cancel the negative curvature of field of the second imaging optical system which comprises a refractive lens. The second mirror M2 comprises an aspherical surface concave mirror having a concave surface facing to the image side, and it serves to direct the abaxial light on the first object 101 to the outside of the effective diameter of the first mirror M1. An intermediate image is formed adjacent to the outside of the effective diameter of the first mirror M1. In this example, a field lens group F is disposed adjacent to the intermediate image. This field lens group F comprises, in an order from the object side, an aspherical positive lens of a meniscus shape having a convex surface facing to the image side, and an aspherical positive lens of a biconvex shape.

The second imaging optical system G2 comprises, in an order from the object side, an aspherical positive lens of a meniscus shape having a convex surface facing to the object side, an aperture stop, an aspherical positive lens of approximately flat-convex shape having a convex surface facing to the image side, an aspherical positive lens having a convex surface facing to the object side, an aspherical lens having a concave surface facing to the image side, an aspherical lens having a convex surface facing the to to the image side, and an aspherical positive lens having a convex surface facing to the object side. The second imaging optical system G2 provides a reduction system for imaging the light from the field lens group F onto the second object surface 102.

Because the light is incident on the aperture stop with a certain angle, the effective diameter of the refractive lens about the aperture stop can be suppressed to be small. With this arrangement, various aberrations such as axial chromatic aberration and spherical aberration can be reduced and, additionally, they can be cancelled with various aberrations produced in the first imaging optical system. Thus, satisfactory aberration correction is accomplished in the whole system.

EXAMPLE 4

Figure 7:
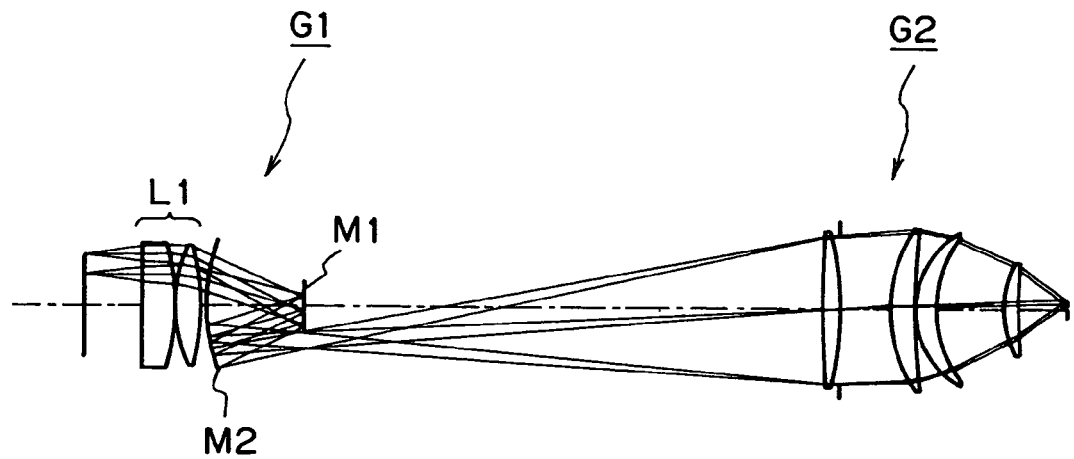
FIG. 7 is a sectional view of a lens structure in Example 4 of the present invention.

FIG. 7 shows a specific lens structure of Example 4. The projection magnification was 1:5, and the design base wavelength was 157 nm (wavelength of an $F_2$ excimer laser). The glass material was fluorite.

In this embodiment, the image side numerical aperture was NA=0.60, and the object-to-image distance (from the first object plane to the second object plane) was L=about 1411 mm. In the range of the image height of about 9–15 mm, the aberration was corrected. An abaxial exposure region of an arcuate shape, having at least a size of about 20.8 mm in the lengthwise direction and 5 mm in the width was assured.

Figure 11:
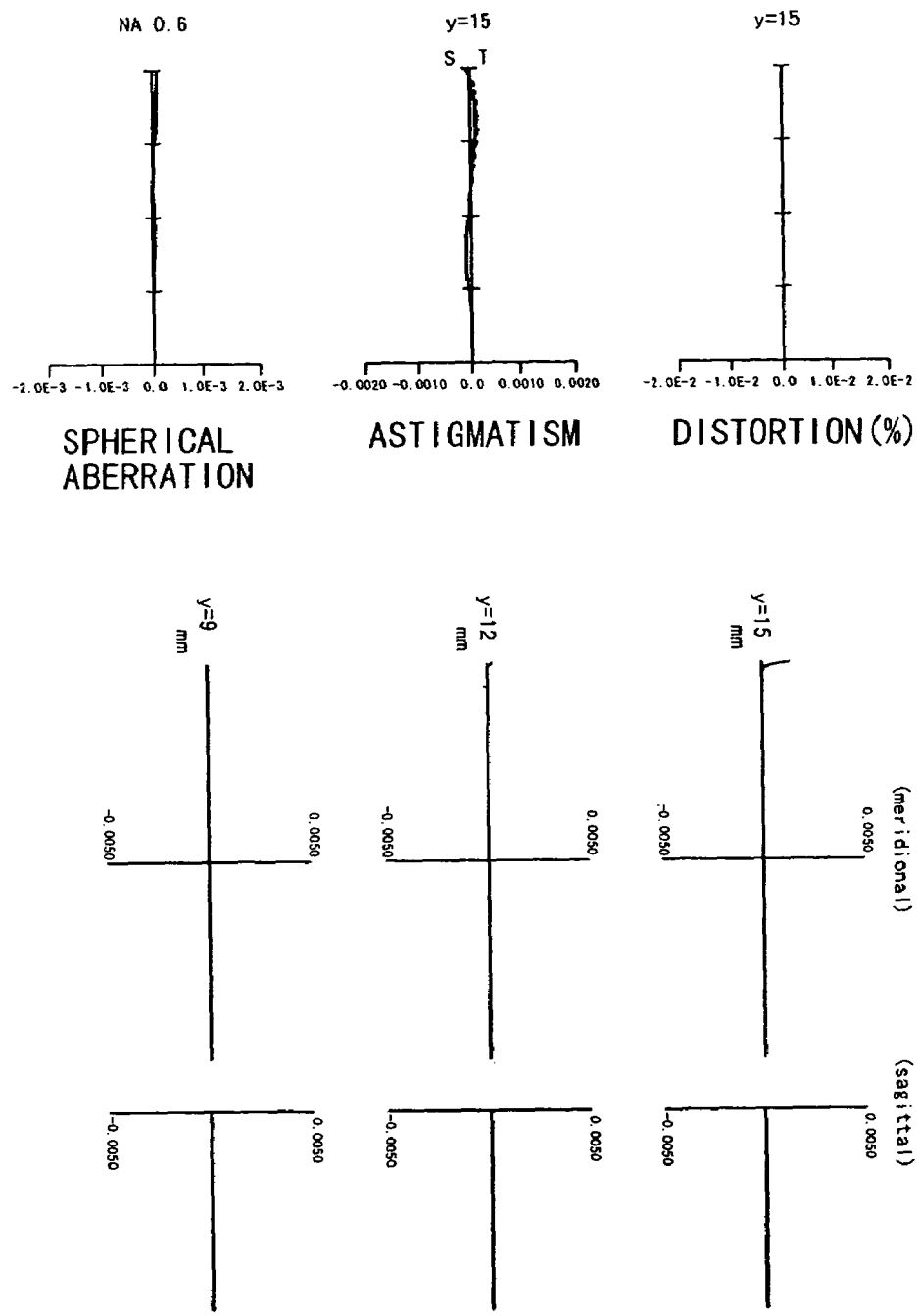
FIG. 11 illustrates aberrations in Example 4 of the present invention.

FIG. 11 shows longitudinal and transverse aberrations of this example, and structural specifications of a numerical example are shown in Table 4.

The projection optical system comprises, in an order from the object side, a refractive lens group L1 having a positive refracting power, a concave mirror (first mirror) M1, a concave mirror (second mirror) M2, and a second imaging optical system G2. In this example, there is no refractive lens group R or field lens group F, inside the group L2 having two mirrors.

The refractive lens group L1 comprises, in an order from the object side, an aspherical positive lens having a convex surface facing to the image side, and an aspherical positive lens of biconvex shape.

The first mirror M1 comprises an aspherical surface concave mirror having a concave surface facing to the object side. The second mirror M2 comprises an aspherical surface concave mirror having a concave surface facing to the image side, and it serves to direct the abaxial light on the first object 101 to the outside of the effective diameter of the first mirror M1. An intermediate image is formed adjacent to the outside of the effective diameter of the first mirror M1. In this example, the first imaging optical system G1 constitutes a reduction system.

The second imaging optical system G2 comprises, in an order from the object side, an aspherical positive lens of biconvex shape, an aperture stop, two aspherical positive lenses of meniscus shape having a concave surface facing to the image side, and an aspherical positive lens having a convex surface facing to the object side. The second imaging optical system G2 provides a reduction system for imaging the light from the second mirror M2 upon the second object surface 102.

In the four examples described above, except Example 2, the first mirror M1 is defined by an aspherical surface. Further, except Examples 1 and 2, all the refractive lenses are aspherical lenses. However, a spherical lens may be used in combination.

As regards the aspherical lenses, although the surface opposite to the aspherical surface is spherical, it may be flat or spherical. Further, the first mirror or the second mirror may be provided by an aspherical surface having no refracting power.

In Examples 1–4 described above, the exposure region has an arcuate shape. However, as long as it is inside the aberration-corrected range, any other shape such as a rectangular shape may be used. Further, while the group L2 having two mirrors is shown as including the refractive lens group R, the refractive lens group R and the mirrors may be integrated (Mangin mirror structure). Alternatively, the refractive lens group R and the second mirror M2 may be integrated into a Mangin mirror structure.

In the examples described above, while there is aspherical surface data in which the conical constant k is taken as zero, the design may be made while using the conical constant as a variable.

The exposure light source used an $F_2$ laser of a wavelength 157 nm. However, a KrF excimer laser (wavelength 248 nm) or an ArF excimer laser (wavelength 193 nm), for example, may be used. Particularly, the invention is effective when the wavelength is shortened and usable optical materials are limited, and the number of optical elements should be reduced. Thus, the present invention is effective for an optical system to be used with a wavelength not longer than 250 nm.

In these examples, fluorite was used as the glass material for the wavelength 157 nm from the $F_2$ excimer laser. However, any other glass material such as fluorine-doped quartz, for example, may be used. When a KrF or an ArF light source is used, fluorite and quartz may be used in combination, or only one of them may be used.

EXAMPLE 5

Figure 12:
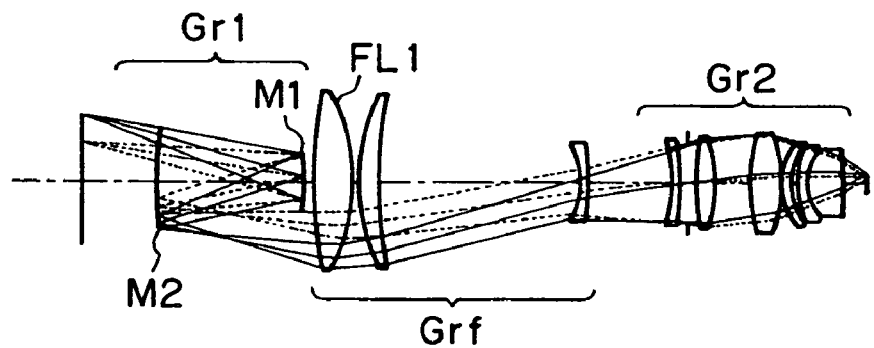
FIG. 12 is a schematic view of a light path in a case, in Example 5 of the present invention, wherein a field optical system is constituted by lens systems.

FIG. 12 is an optical path view of Example 5 of the present invention. The design base wavelength was 157 nm of $F_2$ excimer laser light, the NA was 0.6, and the projection magnification β was 1:6. The lens conjugate distance L was 1005 mm. The optical system had an exposure region (imaging region) upon an image plane, of an arcuate shape, at the image height from 8.64 mm to 14.40 mm. The optical system was provided by a small number of optical elements, ie., two mirrors and nine lenses.

In this example, denoted at r1–r2 are components of a first imaging system Gr1, and it comprises a first mirror M1 (concave surface) and a second mirror M2 (concave surface). Denoted at r3–r8 are components of a field optical system Grf, and it comprises two positive lenses, including a positive lens FL1 disposed at the image side of the first mirror M1, and one negative lens. Denoted at r9–r21 are components of a second imaging system Gr2, and it comprises a stop r11, four positive lenses and two negative lenses.

In this example, the magnification of the first imaging system Gr1 is at the most reduction rate and, therefore, a value close to the upper limit of condition (2) is taken.

Figure 29:
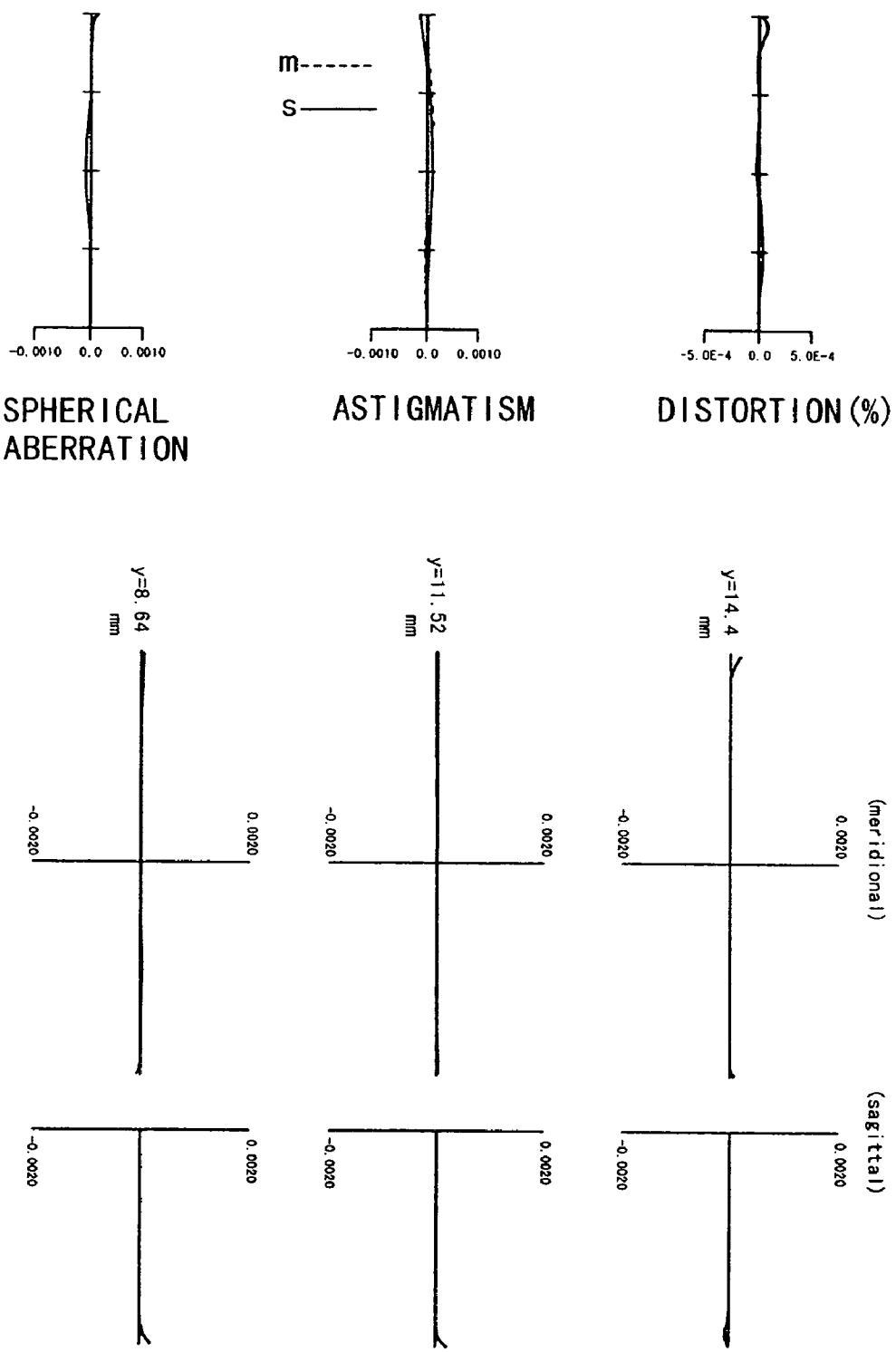
FIG. 29 illustrates aberrations in Example 5 of the present invention.

Structural specifications of numerical examples are shown in Table 5. In this example, an image side working distance of 30 mm is assured, and the total glass material length along the optical path is extraordinarily shortened to 224.7 mm. While the largest diameter of the optical system as a whole is 227 mm at the field optical system, the largest diameter of the second imaging system is as small as 125 mm, regardless of that the NA is 0.6. FIG. 29 shows aberrations, and from this, it is seen that aberrations are corrected satisfactorily.

EXAMPLE 6

Figure 13:
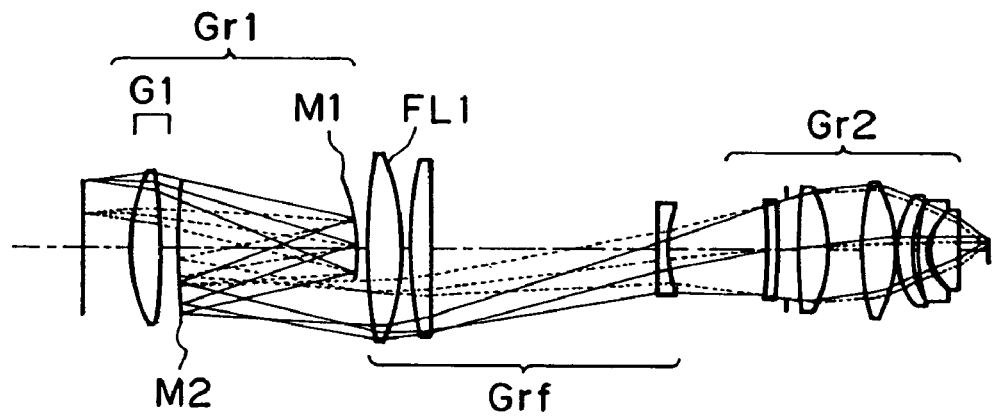
FIG. 13 is a schematic view of a light path in a case, in Example 6 of the present invention, wherein a field optical system is constituted by lens systems.

FIG. 13 is an optical path view of Example 6 of the present invention. The design base wavelength was 157 nm of $F_2$ excimer laser light, the NA was 0.6, and the projection magnification β was 1:5. The lens conjugate distance L was 956 mm. The optical system had an exposure region (imaging region) upon an image plane, of an arcuate shape, at the image height from 7.2 mm to 14.40 mm. The optical system was provided by a small number of optical elements, i.e., two mirrors and ten lenses.

In this example, denoted at r1–r4 are components of a first imaging system Gr1, and it comprises a positive lens (group G1) at r1 and r2, a first mirror M1 (concave surface) and a second mirror M2 (concave surface). Denoted at r5–r10 are components of a field optical system Grf, and it comprises two positive lenses, including a positive lens FL1 disposed at the image side of the first mirror M1, and one negative lens. Denoted at r11–r23 are components of a second imaging system Gr2, and it comprises a stop r13, four positive lenses and two negative lenses.

In this example, the magnification of the first imaging system Gr1 is at a smaller rate and, therefore, a value close to the lower limit of condition (8) is taken. Further, based on this, the intermediate image at a paraxial portion of the first imaging system Gr1 is formed at a position after the light is reflected by the first mirror M1 and before it is incident on the second mirror M2. Therefore, a value close to the lower limit of condition (5) is taken.

Figure 30:
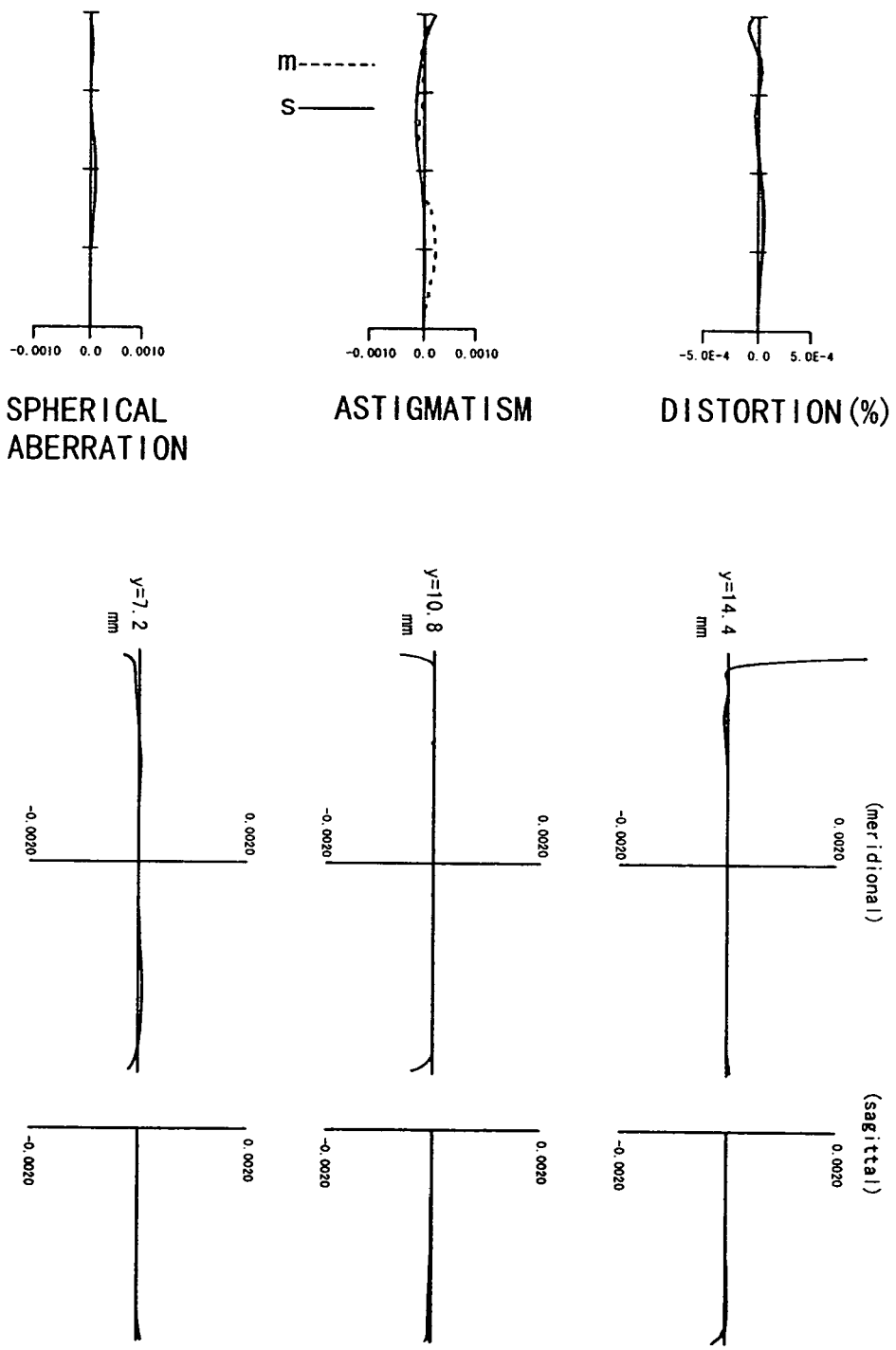
FIG. 30 illustrates aberrations in Example 6 of the present invention.

Structural specifications of numerical examples are shown in Table 6. In this example, an image side working distance of 31 mm is assured, and the total glass material length along the optical path is extraordinarily shortened to 232.1 mm. While the largest diameter of the optical system as a whole is 196 mm at the field optical system, the largest diameter of the second imaging system is as small as 143 mm, regardless that the NA is 0.6. FIG. 30 shows aberrations, and from this, it is seen that aberrations are corrected satisfactorily.

EXAMPLE 7

Figure 14:
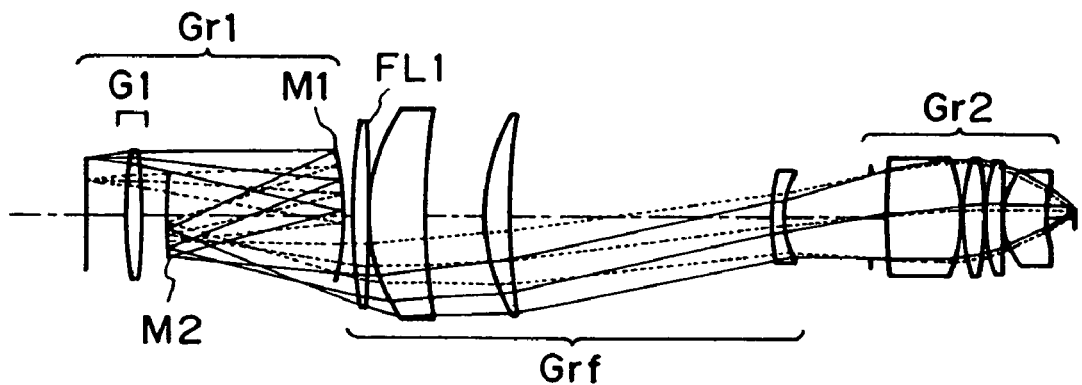
FIG. 14 is a schematic view of a light path in a case, in Example 7 of the present invention, wherein a field optical system is constituted by lens systems.

FIG. 14 is an optical path view of Example 5 of the present invention. The design base wavelength was 157 nm of $F_2$ excimer laser light, the NA was 0.6, and the projection magnification β was 1:5. The lens conjugate distance L was 1199 mm. The optical system had an exposure region (imaging region) upon an image plane, of an arcuate shape, at the image height from 8.4 mm to 14.0 mm. The optical system was provided by a small number of optical elements, i.e., two mirrors and nine lenses.

In this example, denoted at r1–r4 are components of a first imaging system Gr1, and it b comprises a positive lens (group G1) at r1 and r2, a first mirror M1 (concave surface) and a second mirror M2 (concave surface). Denoted at r5–r12 are components of a field optical system Grf, and it comprises three positive lenses, including a positive lens FL1 disposed at the image side of the first mirror M1, and one negative lens. Denoted at r13–r21 are components of a second imaging system Gr2, and it comprises a stop r13 and four positive lenses.

In this example, since the position of a pupil conjugate point of the first imaging system Gr1 is largely remote, in the positive direction, from the position of the first mirror M1, a value close to the upper limit of condition (4) is taken. Further, since the distance from the object plane to the first mirror M1 is short as compared with the whole optical length, a value close to the lower limit of condition (7) is taken.

Figure 31:
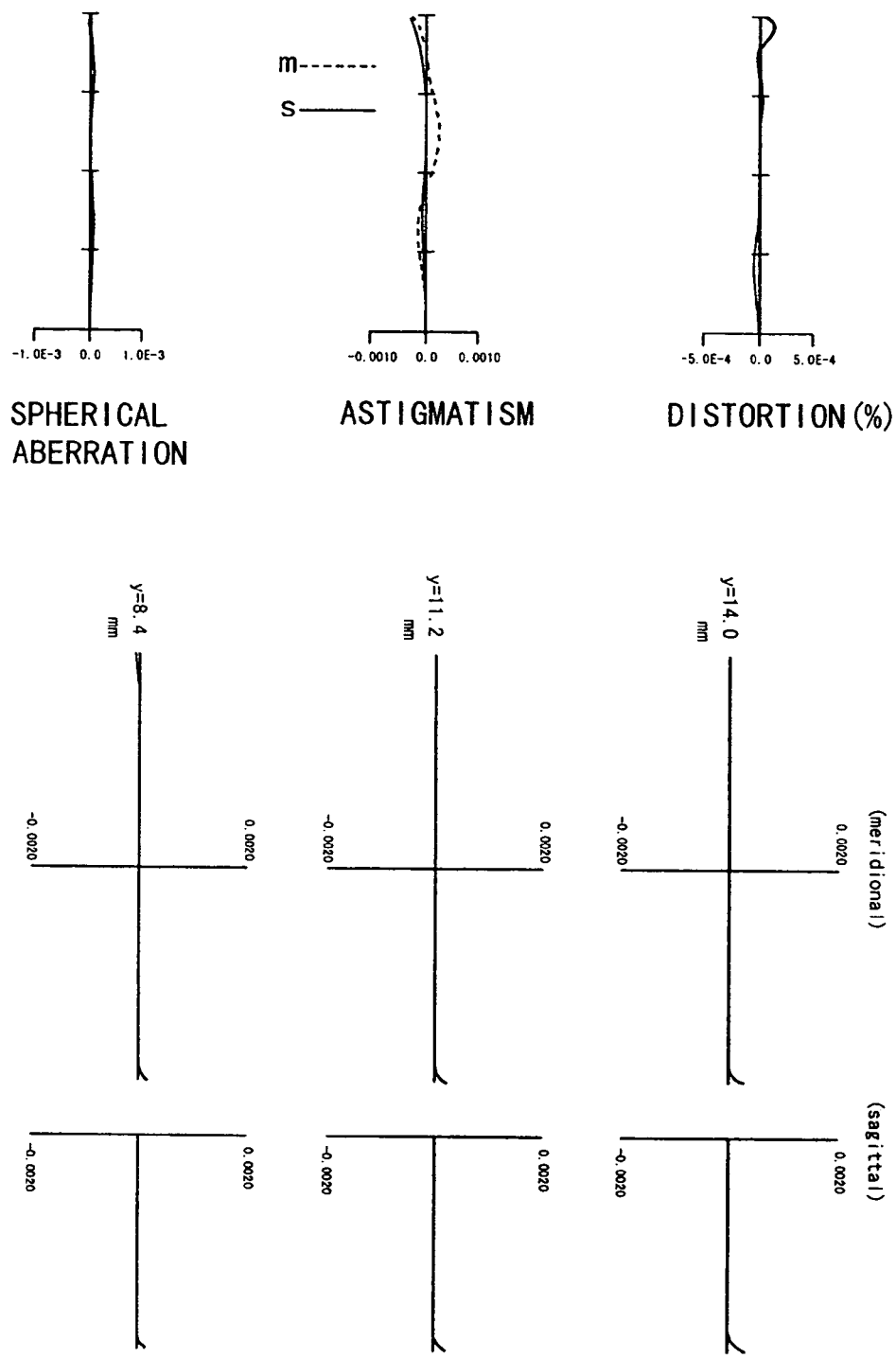
FIG. 31 illustrates aberrations in Example 7 of the present invention.

Structural specifications of numerical examples are shown in Table 7. In this example, an image side working distance of 31 mm is assured, and the total glass material length along the optical path is extraordinarily shortened to 333.8 mm. While the largest diameter of the optical system as a whole is 250 mm at the field optical system, the largest diameter of the second imaging system is as small as 143 mm, regardless of the NA is 0.6. FIG. 31 shows aberrations, and from this, it is seen that aberrations are corrected satisfactorily.

EXAMPLE 8

Figure 15:
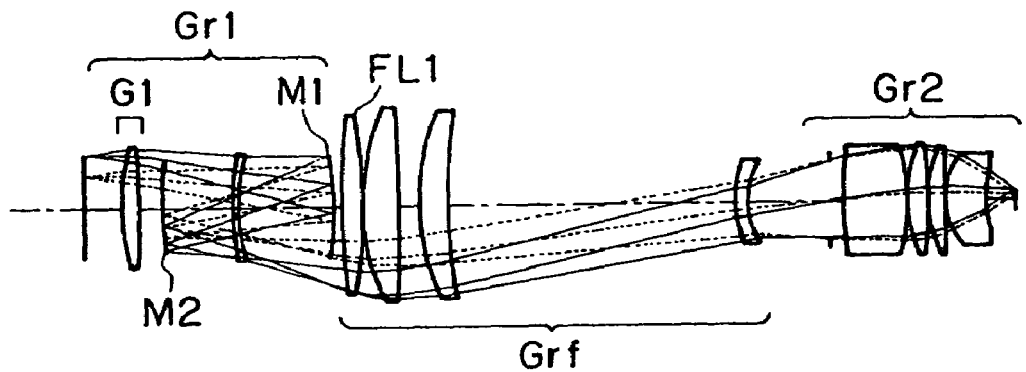
FIG. 15 is a schematic view of a light path in a case, in Example 8 of the present invention, wherein a field optical system is constituted by lens systems.

FIG. 15 is an optical path view of Example 8 of the present invention. The design base wavelength was 157 nm of $F_2$ excimer laser light, the NA was 0.6, and the projection magnification β was 1:5. The lens conjugate distance L was 1198 mm. The optical system had an exposure region (imaging region) upon an image plane, of an arcuate shape, at the image height from 8.4 mm to 14.0 mm. The optical system was provided by a small number of optical elements, i.e., two mirrors and ten lenses.

In this example, denoted at r1–r10 are components of a first imaging system Gr1, and it comprises a positive lens (group G1), a first mirror M1 (concave mirror) and a second mirror (concave mirror) M2. The imaging system group G1 comprises a positive lens at r1 and r2, negative lenses at r3 and r4; r6 and r7; and r9 and r10$a$ of the same type which are physically disposed between the first and second mirrors M1 and M2. Denoted at r11–r18 are components of a field optical system Grf, and it comprises three positive lenses, including a positive lens FL1 disposed at the image side of the first mirror M1, and one negative lens. Denoted at r19–r27 are components of a second imaging system Gr2, and it comprises a stop r19 and four positive lenses.

In this example, the negative lenses are provided in the first imaging system Gr1, between the first mirror M1 and the second concave mirror M2, so as to avoid the inconvenience of interference of the reflection light from the second mirror with the first mirror M1 and also to correct distortion aberration, for example.

Figure 32:
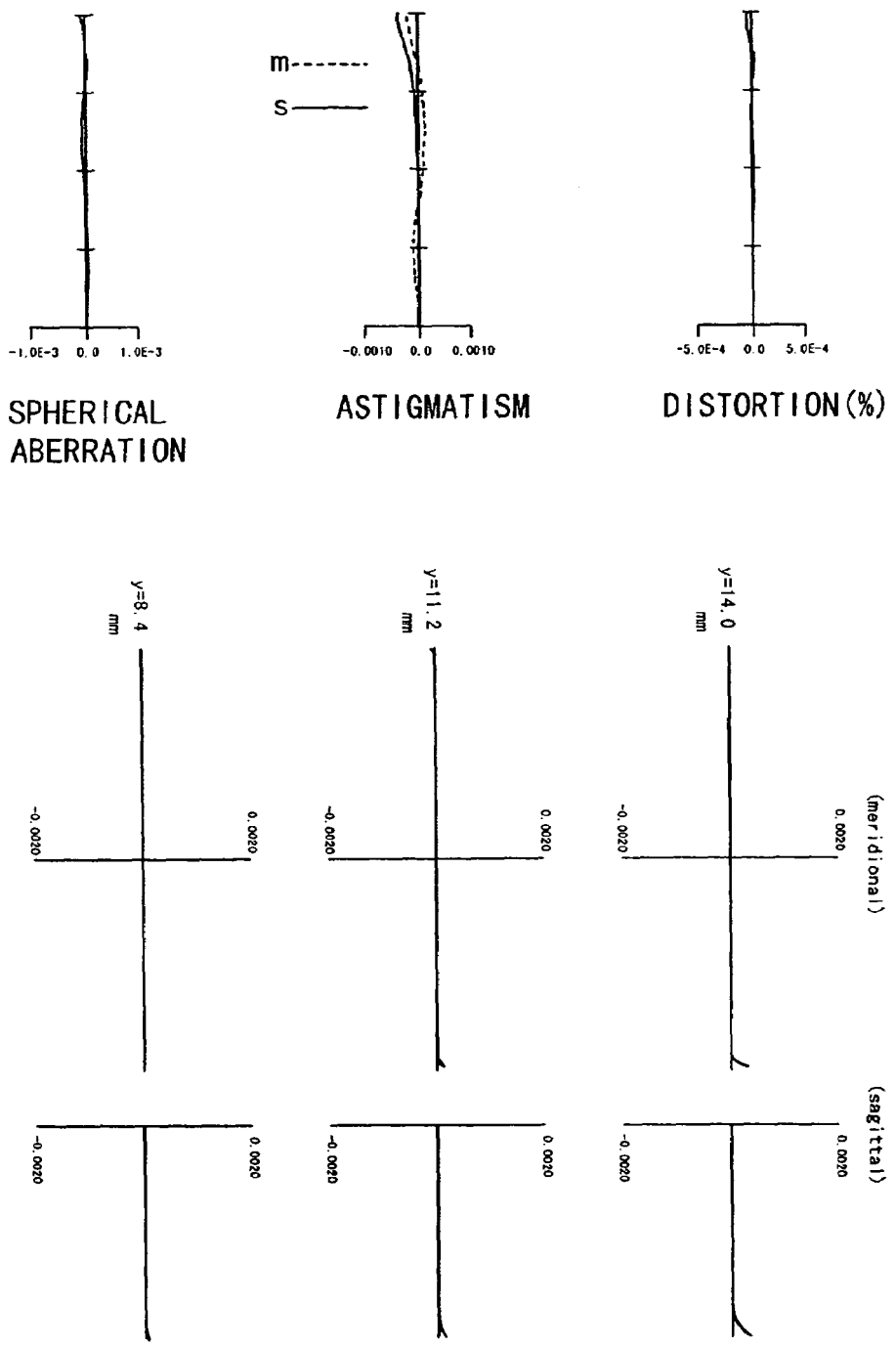
FIG. 32 illustrates aberrations in Example 8 of the present invention.

Structural specifications of numerical examples are shown in Table 8. In this example, an image side working distance of 36.1 mm is assured, and the total glass material length along the optical path is extraordinarily shortened to 337.6 mm. While the largest diameter of the optical system as a whole is 245 mm at the field optical system, the largest diameter of the second imaging system is as small as 142 mm, regardless that the NA is 0.6. FIG. 32 shows aberrations, and from this, it is seen that aberrations are corrected satisfactorily.

EXAMPLE 9

Figure 16:
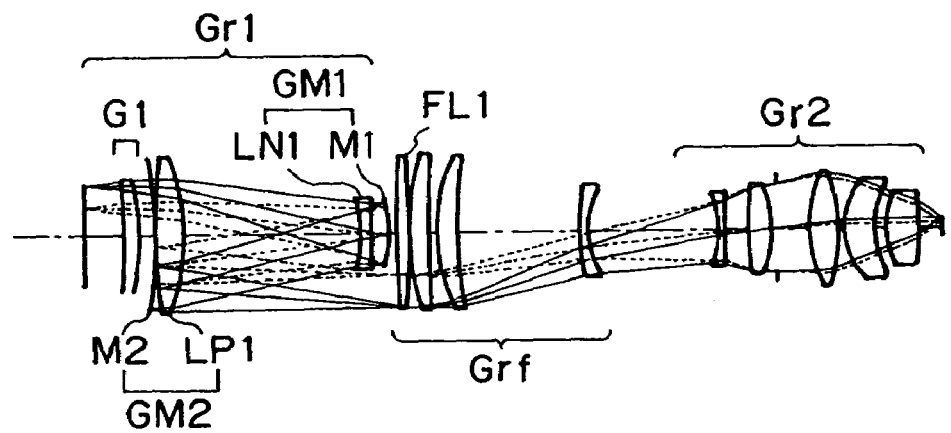
FIG. 16 is a schematic view of a light path in a case, in Example 9 of the present invention, wherein a field optical system is constituted by lens systems.

FIG. 16 is an optical path view of Example 9 of the present invention. The design base wavelength was 157 nm of $F_2$ excimer laser light, the NA was 0.6, and the projection magnification β was 1:5. The lens conjugate distance L was 1166 mm. The optical system had an exposure region (imaging region) upon an image plane, of an arcuate shape, at the image height from 7.7 mm to 14.0 mm. The optical system was provided by a small number of optical elements, i.e., two mirrors and twelve lenses.

In this example, denoted at r1–r14 are components of a first imaging system Gr1, and it comprises a positive lens (group G1) at r1 and r2, and positive lenses LP1 at r3 and r4; r10 and r11; and r13 and r14 of the same type which constitute a second mirror group GM2 in combination with a second mirror M2. Also, it comprises negative lenses LN1 at r5 and r6; and r8 and r9 of the same type, for constituting a first mirror group GM1 in combination with a first mirror M1.

Denoted at r15–r22 are components of a field optical system Grf, and it comprises three positive lenses, including a positive lens FL1 disposed at the image side of the first mirror M1, and one negative lens. Denoted at r23–r33 are components of a second imaging system Gr2, and it comprises a stop r27, four positive lenses and one negative lens.

In this example, the position of the intermediate image formed by the first imaging system Gr1 is substantially coincident with the position of the first mirror M1, and the intermediate image is formed outside the first mirror group GM1. Therefore, undesirable interference between the light and the first mirror group GM1 can be avoided easily. Further, the structure is efficient since enlargement of the diameter of the field optical system can be suppressed. The second mirror group GM2 is provided by the positive lens LP1 and the second mirror M2, to thereby control the Petzval sum. On the other hand, since the imaging state of the intermediate image is moderate, a field stop may be provided at that position.

Figure 33:
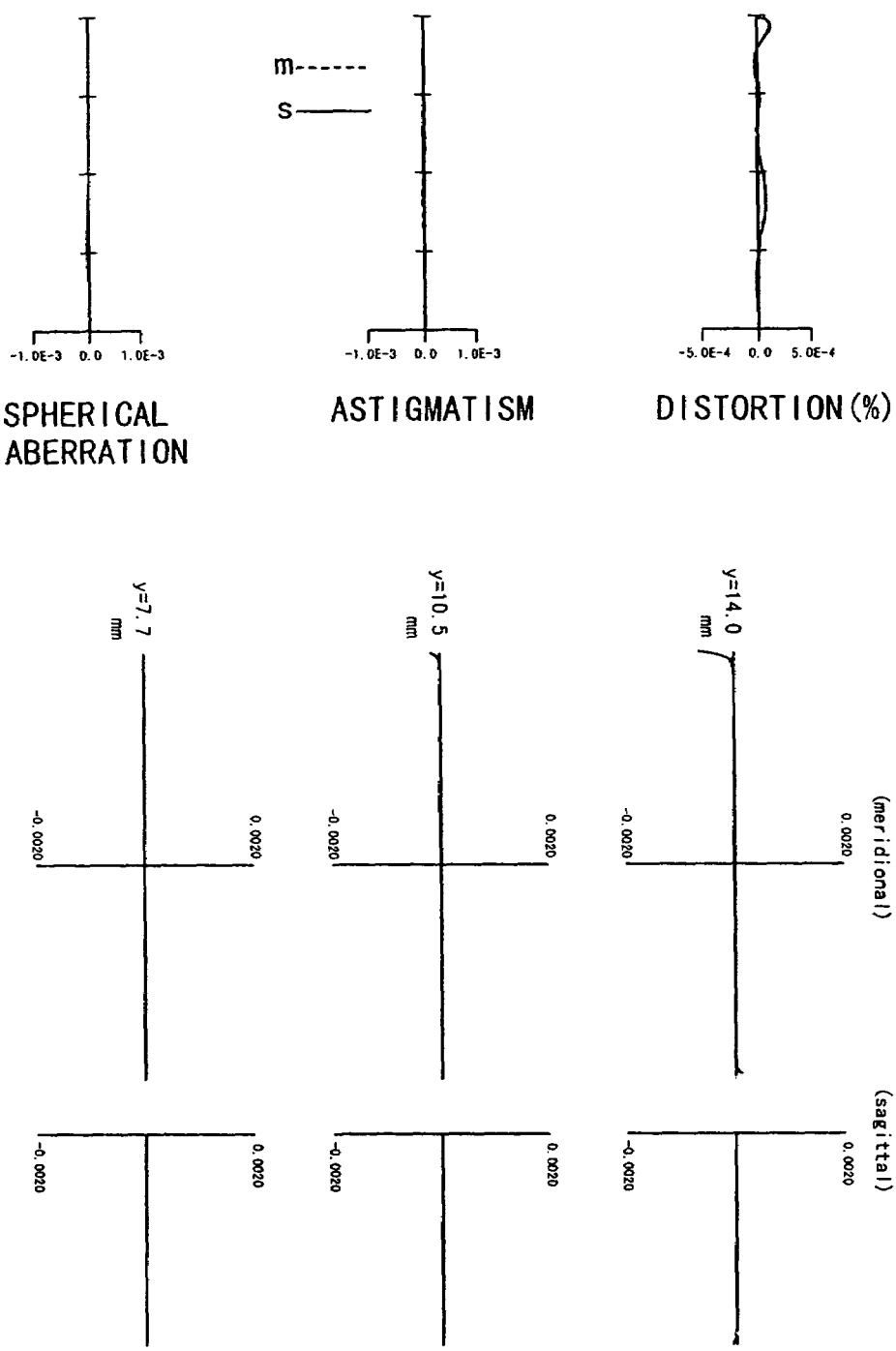
FIG. 33 illustrates aberrations in Example 9 of the present invention.

Structural specifications of numerical examples are shown in Table 9. In this example, an image side working distance of 30.3 mm is assured, and the total glass material length along the optical path is extraordinarily shortened to 400.5 mm. While the largest diameter of the optical system as a whole is 213 mm at the field optical system, the largest diameter of the second imaging system is as small as 157 mm, regardless that the NA is 0.6. FIG. 33 shows aberrations, and from this, it is seen that aberrations are corrected satisfactorily.

EXAMPLE 10

Figure 17:
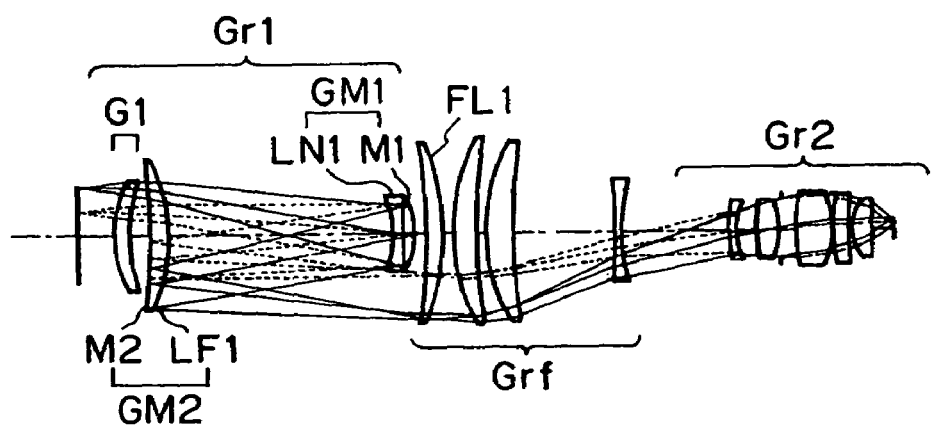
FIG. 17 is a schematic view of a light path in a case, in Example 10 of the present invention, wherein a field optical system is constituted by lens systems.

FIG. 17 is an optical path view of Example 10 of the present invention. The design base wavelength was 157 nm of $F_2$ excimer laser light, the NA was 0.6, and the projection magnification β was 1;5. The lens conjugate distance L was 1160 mm. The optical system had an exposure region (imaging region) upon an image plane, of an arcuate shape, at the image height from 7.7 mm to 14.0 mm. The optical system was provided by a small number of optical elements, i.e., two mirrors and twelve lenses.

In this example, denoted at r1–r14 are components of a first imaging system Gr1, and it comprises a positive lens (group G1) at r1 and r2, and positive lenses LP1 at r3 and r4; r10 and r11; and r13 and r14 of the same type which constitute a second mirror group GM2 in combination with a second mirror M2. Also, it comprises negative lenses LN1 at r5 and r6; and r8 and r9 of the same type, for constituting a first mirror group GM1 in combination with a first mirror M1.

Denoted at r15–r22 are components of a field optical system Grf, and it comprises three positive lenses, including a positive lens FL1 disposed at the image side of the first mirror M1, and one negative lens. Denoted at r23–r33 are components of a second imaging system Gr2, and it comprises a stop r27, four positive lenses and one negative lens.

In this example, particularly, the first mirror group GM1 of the first imaging system Gr1 is provided by the negative lens LN1 and the first mirror M1, and the power of each element is strengthened. By this, the effect of correcting chromatic aberration with respect to the whole optical system is enhanced. Further, the second mirror group GM2 is provided by the positive lens LP1 and the second mirror M2, to thereby control the Petzval sum.

Figure 34:
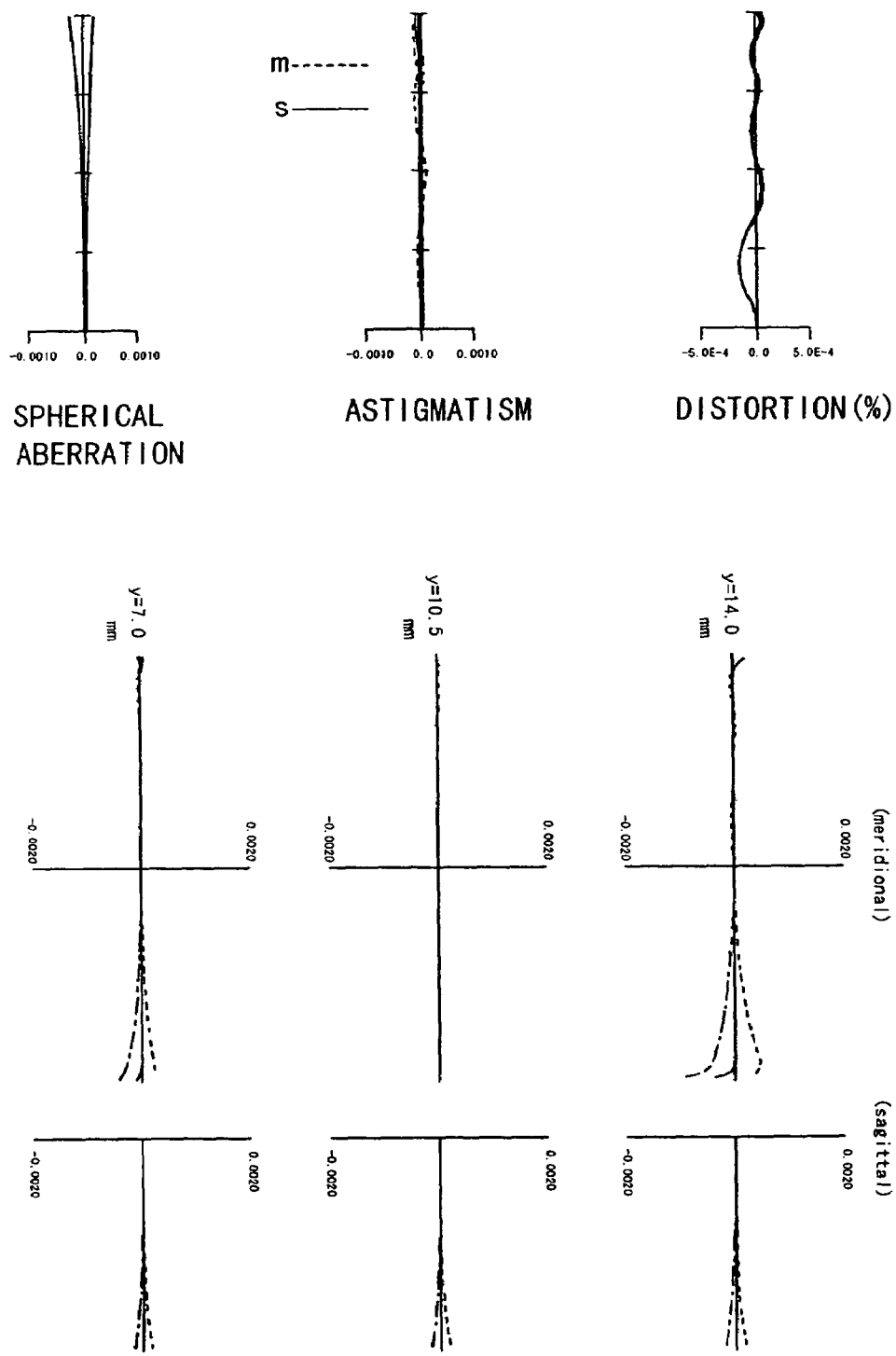
FIG. 34 illustrates aberrations in Example 10 of the present invention.

Structural specifications of numerical examples are shown in Table 10. In this example, an image side working distance of 30.0 mm is assured, and the total glass material length along the optical path is extraordinarily shortened to 375.9 mm. While the largest diameter of the optical system as a whole is 266 mm at the field optical system, the largest diameter of the second imaging system is as small as 105 mm, regardless that the NA is 0.6. FIG. 34 shows aberrations with respect to the base wavelength 157 nm and a wavelength range of 2 pm. From the drawing, it is seen that aberrations are corrected satisfactorily.

EXAMPLE 11

Figure 18:
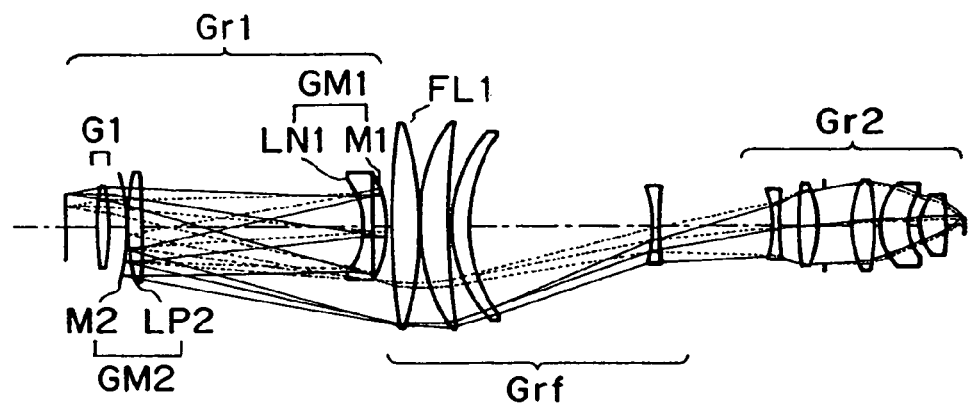
FIG. 18 is a schematic view of a light path in a case, in Example 11 of the present invention, wherein a field optical system is constituted by lens systems.

FIG. 18 is an optical path view of Example 11 of the present invention. The design base wavelength was 157 nm of $F_2$ excimer laser light, the NA was 0.6, and the projection magnification β was 1:4. The lens conjugate distance L was 1430 mm. The optical system had an exposure region (imaging region) upon an image plane, of an arcuate shape, at the image height from 8.19 mm to 13.65 mm. The optical system was provided by a small number of optical elements, i.e., two mirrors and twelve lenses.

In this example, denoted at r1–r12 are components of a first imaging system Gr1, and it comprises a positive lens (group G1) at r1 and r2, and negative lenses LN1 at r3 and r4; and r6 and r7 of the same type which constitute a first mirror group GM1 in combination with a first mirror M1. Also, it comprises positive lenses LP1 at r8 and r9; and r11 and r12 of the same type, for constituting a second mirror group GM2 in combination with a second mirror M2.

Denoted at r13–r20 are components of a field optical system Grf, and it comprises three positive lenses, including a positive lens FL1 disposed at the image side of the first mirror M1, and one negative lens. Denoted at r21–r31 are components of a second imaging system Gr2, and it comprises a stop r25, four positive lenses and one negative lens.

In this example, like Example 10, due to the structure of the first mirror group GM1 as described, the effect of correcting chromatic aberration is enhanced. Further, the second mirror group GM2 is provided by the positive lens LP1 and the second mirror M2, to thereby control the Petzval sum.

Figure 35:
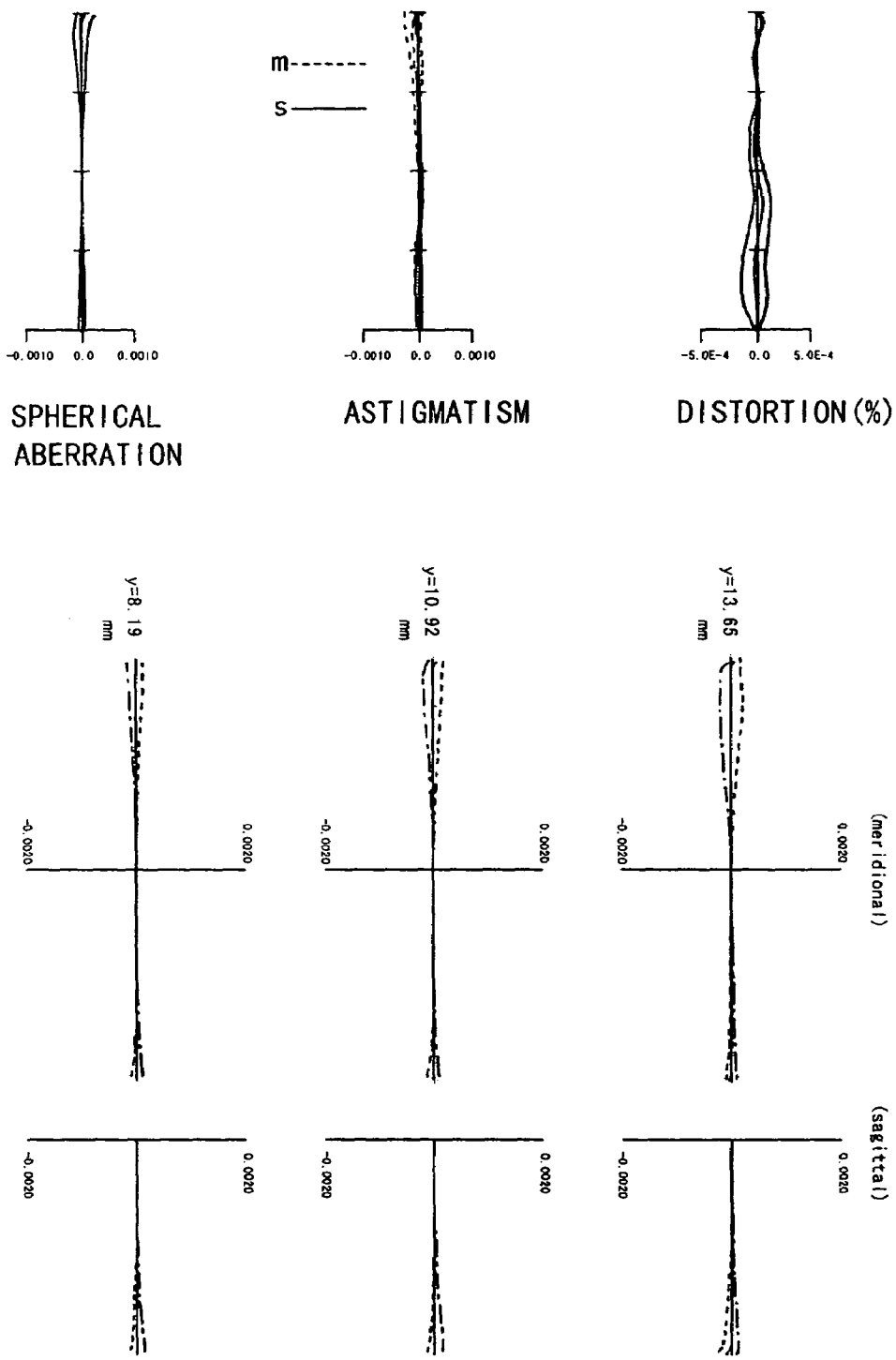
FIG. 35 illustrates aberrations in Example 11 of the present invention.

Structural specifications of numerical examples are shown in Table 11. In this example, an image side working distance of 30.0 mm is assured, and the total glass material length along the optical path is extraordinarily shortened to 371.9 mm. While the largest diameter of the optical system as a whole is 328 mm at the field optical system, the largest diameter of the second imaging system is as small as 141 mm, regardless that the NA is 0.6. FIG. 35 shows aberrations with respect to the base wavelength 157 nm and a wavelength range of 2 pm. From the drawing, it is seen that aberrations are corrected satisfactorily.

EXAMPLE 12

Figure 19:
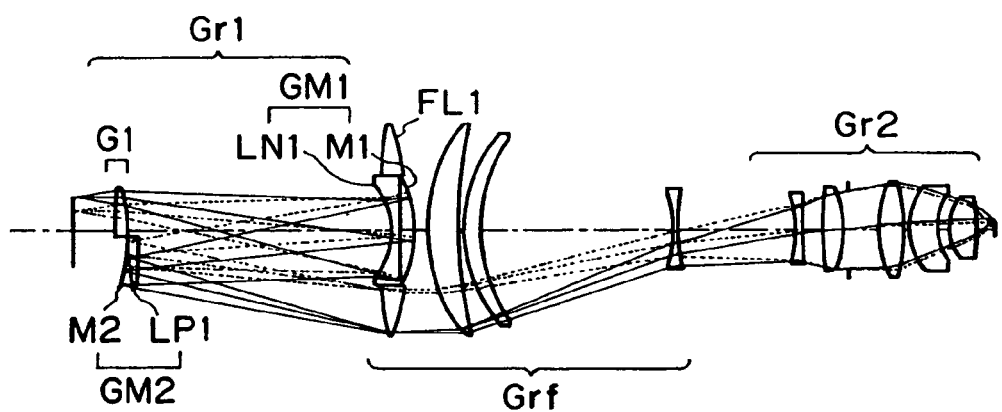
FIG. 19 is a schematic view of a light path in a case, in Example 12 of the present invention, wherein a field optical system is constituted by lens systems.

FIG. 19 is an optical path view of Example 12 of the present invention. The design base wavelength was 157 nm of $F_2$ excimer laser light, the NA was 0.6, and the projection magnification β was 1:4. The lens conjugate distance L was 1430 mm. The optical system had an exposure region (imaging region) upon an image plane, of an arcuate shape, at the image height from 8.19 mm to 13.65 mm. The optical system was provided by a small number of optical elements, i.e., two mirrors and twelve lenses, like Example 11.

Figure 20:
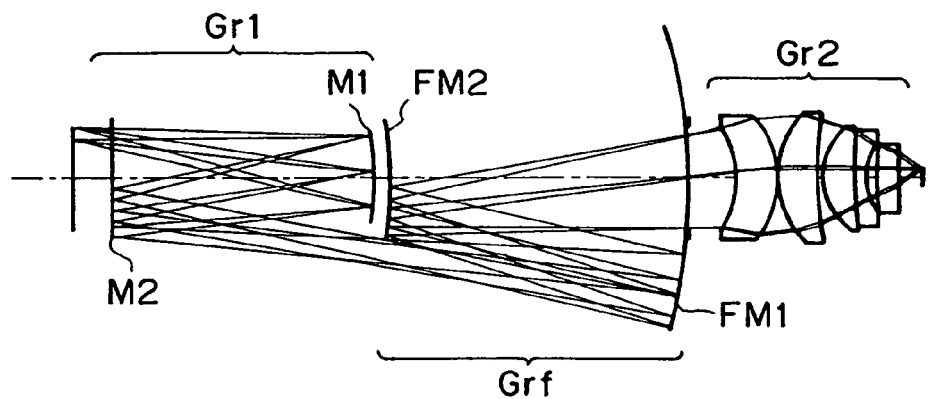
FIG. 20 is a schematic view of a light path in a case, in Example 13 of the present invention, wherein a field optical system includes two mirrors.

In this example, denoted at r1–r12 are components of a first imaging system Gr1, and it comprises a positive lens (group G1) at r1 and r2, and negative lenses LN1 at r3 and r4; and r6 and r7 of the same type which constitute a first mirror group GM1 in combination with a first mirror M1. Also, it comprises positive lenses LP1 at r8 and r9; and r11 and r12 of the same type, for constituting a second mirror group GM2 in combination with a second mirror M2. In FIG. 20, the positive lens group G1 as well as the positive lens LP1 are of half disk-like shape.

Denoted at r13–r20 are components of a field optical system Grf, and it comprises three positive lenses, including a positive lens FL1 of doughnut shape, being hollow at its center, and being disposed outside the first mirror M1, and one negative lens. Denoted at r21–r31 are components of a second imaging system Gr2, and it comprises a stop r25, four positive lenses and one negative lens.

In this example, since the pupil conjugate point of the first imaging system Gr1 is placed closer to the object side, a value close to the lower limit of condition (4) is taken. Further, like Example 10, due to the structure of the first mirror group GM1 as described, the effect of correcting chromatic aberration is enhanced. Also, the positive lens FL1 of the field optical system Grf is made into a doughnut shape, and the first mirror group GM1 of the first imaging system Gr1 is disposed at the central portion of the doughnut shape. With this structure, the light rays can be refracted at a position closer to the object side and, therefore, the powers of the field optical system Grf and the second imaging system Gr2 can be made smaller. This is very advantageous with respect to the aberration correction. Further, the second mirror group GM2 is provided by the positive lens LP1 and the second mirror M2, to thereby control the Petzval sum.

Figure 36:
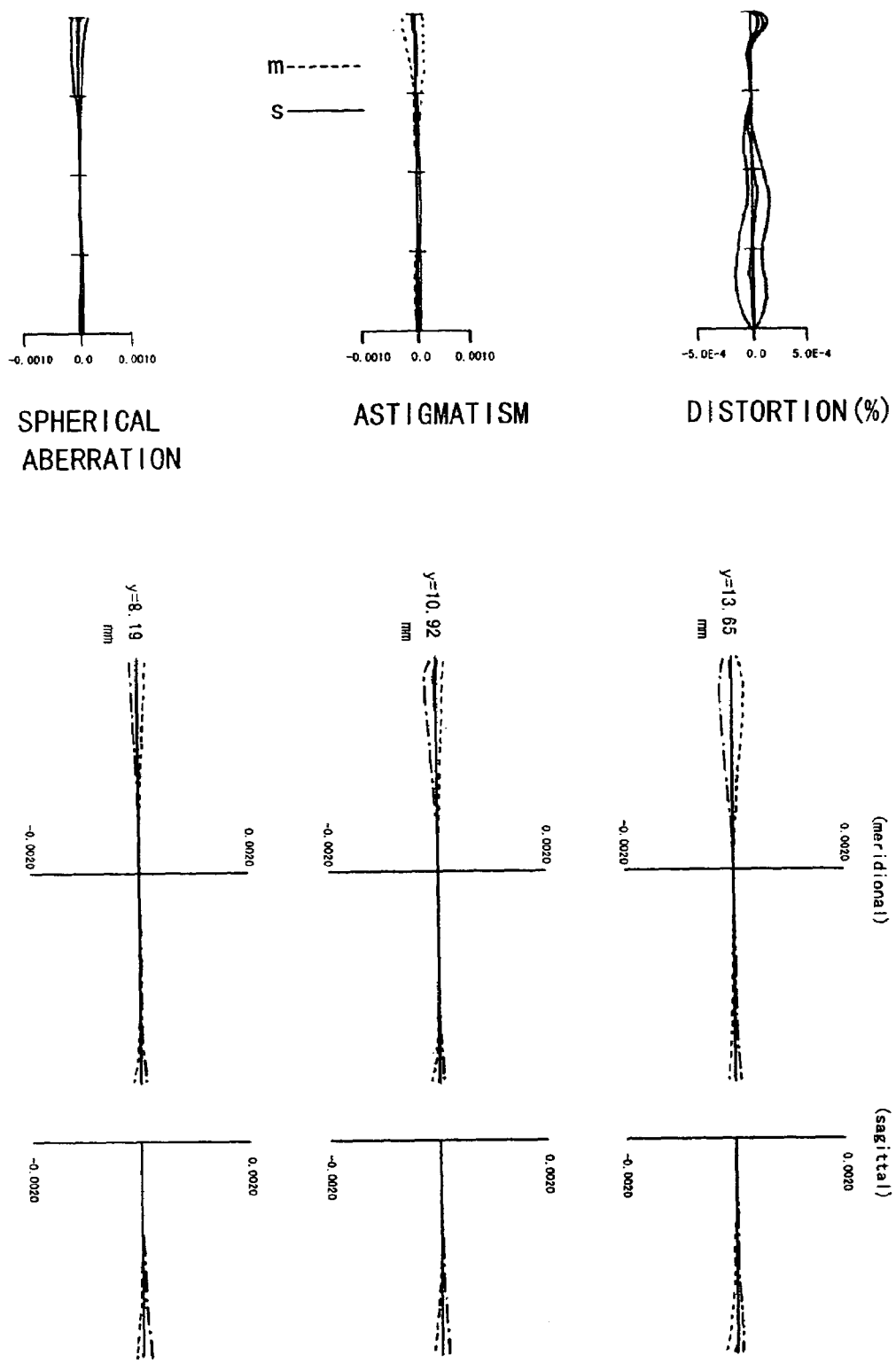
FIG. 36 illustrates aberrations in Example 12 of the present invention.

Structural specifications of numerical examples are shown in Table 12. In this example, an image side working distance of 30.0 mm is assured, and the total glass material length along the optical path is extraordinarily shortened to 377.0 mm. While the largest diameter of the optical system as a whole is 328 mm at the field optical system, the largest diameter of the second imaging system is as small as 144 mm, regardless that the NA is 0.6. FIG. 36 shows aberrations with respect to the base wavelength 157 nm and a wavelength range of 2 pm. From the drawing, it is seen that aberrations are corrected satisfactorily.

EXAMPLE 13

FIG. 20 is an optical path view of Example 13 of the present invention. The design base wavelength was 157 nm of $F_2$ excimer laser light, the NA was 0.6, and the projection magnification β was 1:5. The lens conjugate distance L was 1100 mm. The optical system had an exposure region (imaging region) upon an image plane, of an arcuate shape, at the image height from 10.24 mm to 13.65 mm. The optical system was provided by an extraordinarily simple structure, i.e., with four mirrors and five lenses.

In this example, denoted at r1–r2 are components of a first imaging system Gr1, and it comprises a first mirror M1 (concave surface) and a second mirror M2 (concave surface), only. Denoted at r3–r4 are components of a field optical system Grf, and it comprises a first field mirror FM1 (concave surface) and a second field mirror FM2 (convex surface), only. Denoted at r5–r15 are components of a second imaging system Gr2, and it comprises a stop r5, four positive lenses and one negative lens.

Figure 37:
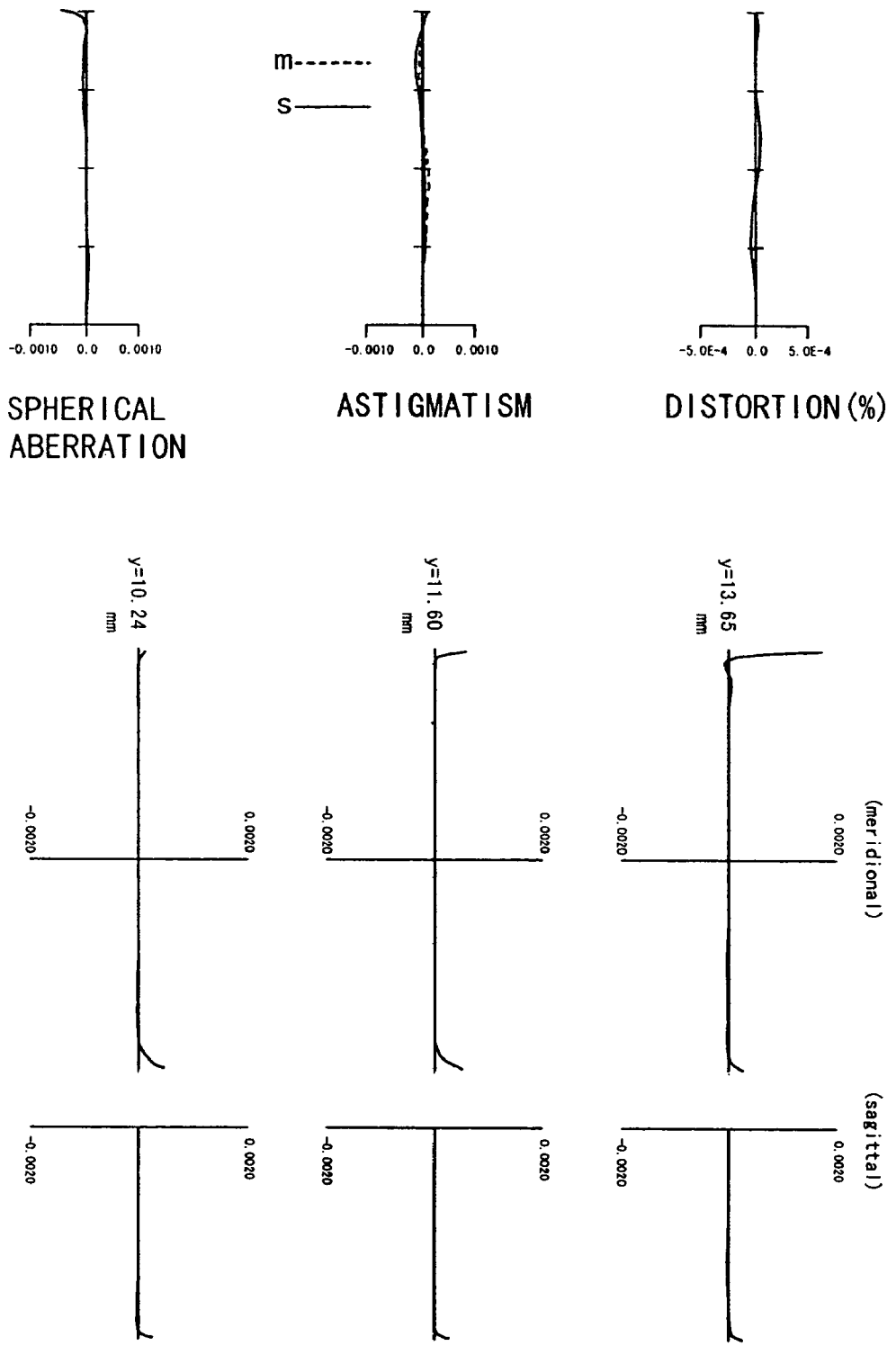
FIG. 37 illustrates aberrations in Example 13 of the present invention.

In this example, the first mirror M1 is positioned relatively at the object side, with respect to the conjugate distance of the whole optical system, and therefore a value close to the lower limit of condition (12) is taken Structural specifications of numerical examples are shown in Table 22. In this example, an image side working distance of 30.0 mm is assured, and the total glass material length along the optical path is extraordinarily shortened to 192.2 mm. While the largest diameter of the optical system as a whole is 388 mm at the field optical system, the largest diameter of the second imaging system is as small as 167 mm, regardless that the NA is 0.6. FIG. 37 shows aberrations. From the drawing, it is seen that aberrations are corrected satisfactorily.

EXAMPLE 14

Figure 21:
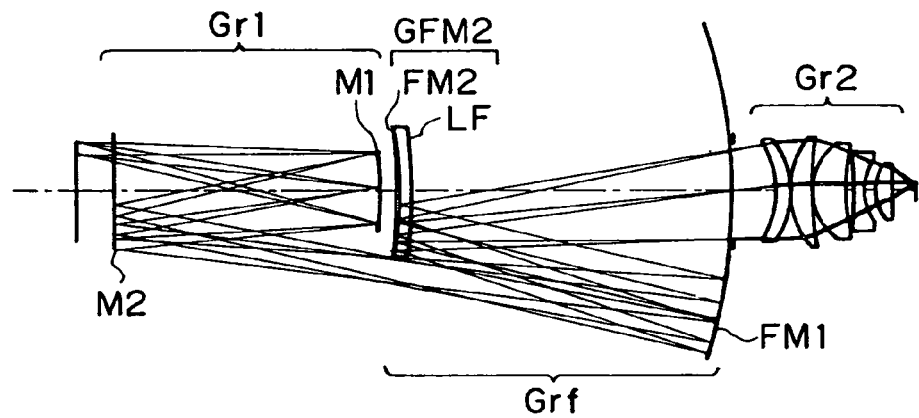
FIG. 21 is a schematic view of a light path in a case, in Example 14 of the present invention, wherein a field optical system includes two mirrors.

FIG. 21 is an optical path view of Example 14 of the present invention. The design base wavelength was 157 nm of $F_2$ excimer laser light, the NA was 0.6, and the projection magnification β was 1:5. The lens conjugate distance L was 1100 mm. The optical system had an exposure region (imaging region) upon an image plane, of an arcuate shape, at the image height from 10.24 mm to 13.65 mm. The optical system was provided by a simple structure, i.e., with four mirrors and six lenses (one lens added to Example 13).

In this example, denoted at r1–r2 are components of a first imaging system Gr1, and it comprises a first mirror M1 (concave surface) and a second mirror M2 (concave surface which is very close to a flat surface), only. Denoted at r3–r8 are components of a field optical system Grf, and it comprises a first field mirror FM1 (concave surface), a second field mirror FM2 (convex surface), and negative lenses LF at r4 and r5; and r7 and r8 of the same type. Denoted at r9–r19 are components of a second imaging system Gr2, and it comprises a stop r9, four positive lenses and one negative lens.

In this example, with use of the second field mirror group GFM2 which is provided by the second field mirror FM2 (concave) and the negative lens LF, the Petzval sum is also controlled. Further, the magnification of the second imaging system Gr2 is made small, such that a value close to the upper limit of condition (1) is taken. Since the first imaging system Gr1 does not include the positive lens group G1, the second mirror M2 is positioned closer to the object side. Therefore, a value close to the upper limit of condition (6) is taken.

Figure 38:
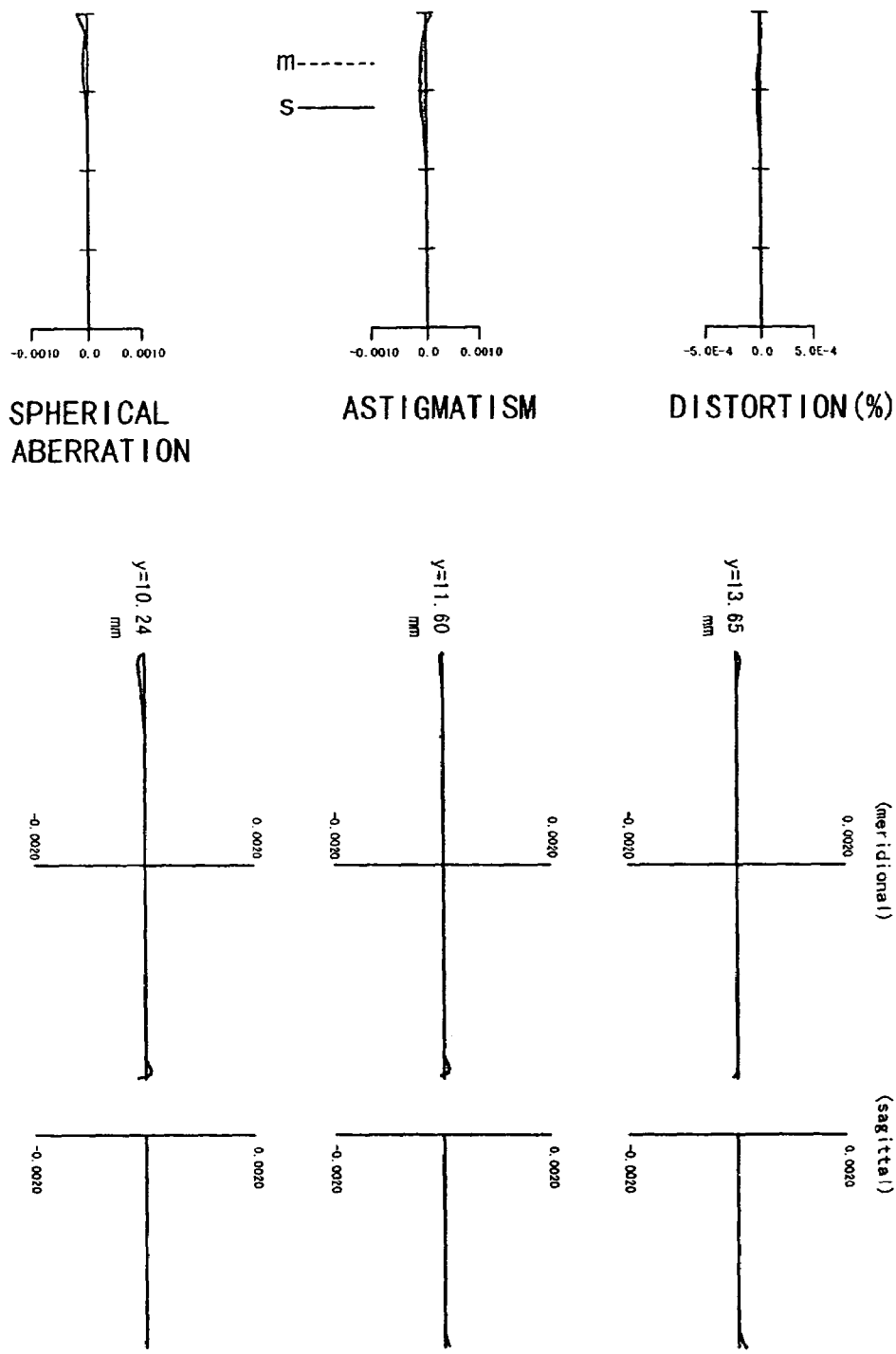
FIG. 38 illustrates aberrations in Example 14 of the present invention.

Structural specifications of numerical examples are shown in Table 14. In this example, an image side working distance of 30 mm is assured, and the total glass material length along the optical path is extraordinarily shortened to 156.4 mm. While the largest diameter of the optical system as a whole is 444 mm at the field optical system, the largest diameter of the second imaging system is as small as 144 mm, regardless that the NA is 0.6. FIG. 38 shows aberrations. From the drawing, it is seen that aberrations are corrected satisfactorily.

EXAMPLE 15

Figure 22:
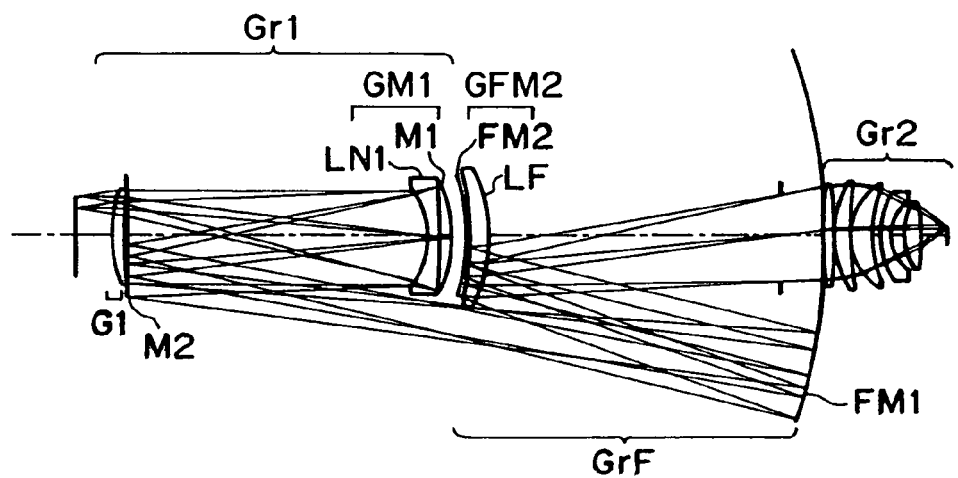
FIG. 22 is a schematic view of a light path in a case, in Example 15 of the present invention, wherein a field optical system includes two mirrors.

FIG. 22 is an optical path view of Example 15 of the present invention. The design base wavelength was 157 nm of $F_2$ excimer laser light, the NA was 0.6, and the projection magnification β was 1:4. The lens conjugate distance L was 1190 mm. The optical system had an exposure region (imaging region) upon an image plane, of an arcuate shape, at the image height from 9.56 mm to 13.65 mm. The optical system was provided by use of four mirrors and eight lenses (two lenses added to Example 13).

In this example, denoted at r1–r8 are components of a first imaging system Gr1, and it comprises a positive lens (G1) at r1 and r2, negative lenses LN1 at r3 and r4; and r6 and r7 of the same type, a first mirror M1 (concave surface) and a second mirror M2 (convex surface). Denoted at r9–r14 are components of a field optical system Grf, and it comprises a first field mirror FM1 (concave surface), a second field mirror FM2 (convex surface), and positive lenses LF at r10 and r11; and r13 and r14 of the same type. Denoted at r15–r25 are components of a second imaging system Gr2, and it comprises a stop r15, four positive lenses and one negative lens.

In this example, the convex lens group G1 is provided in the first imaging system Gr1, by which the optical system is made telecentric on the object side Also, the first mirror group GM1 is provided by the negative lens LN1 and the first mirror M1, by which color correction is performed. Further, with use of the second field mirror group GFM2 which is provided by the second field mirror FM2 (convex) and the positive lens LF, the Petzval sum is also controlled. Further, since the pupil conjugate point of the first imaging system Gr1 is closer to the object side, a value close to the lower limit of condition (10) is taken. Also, since the spacing between the second and first field mirrors FM2 and FM1 is relatively large, a value close to the upper limit of condition (14) is taken.

Figure 39:
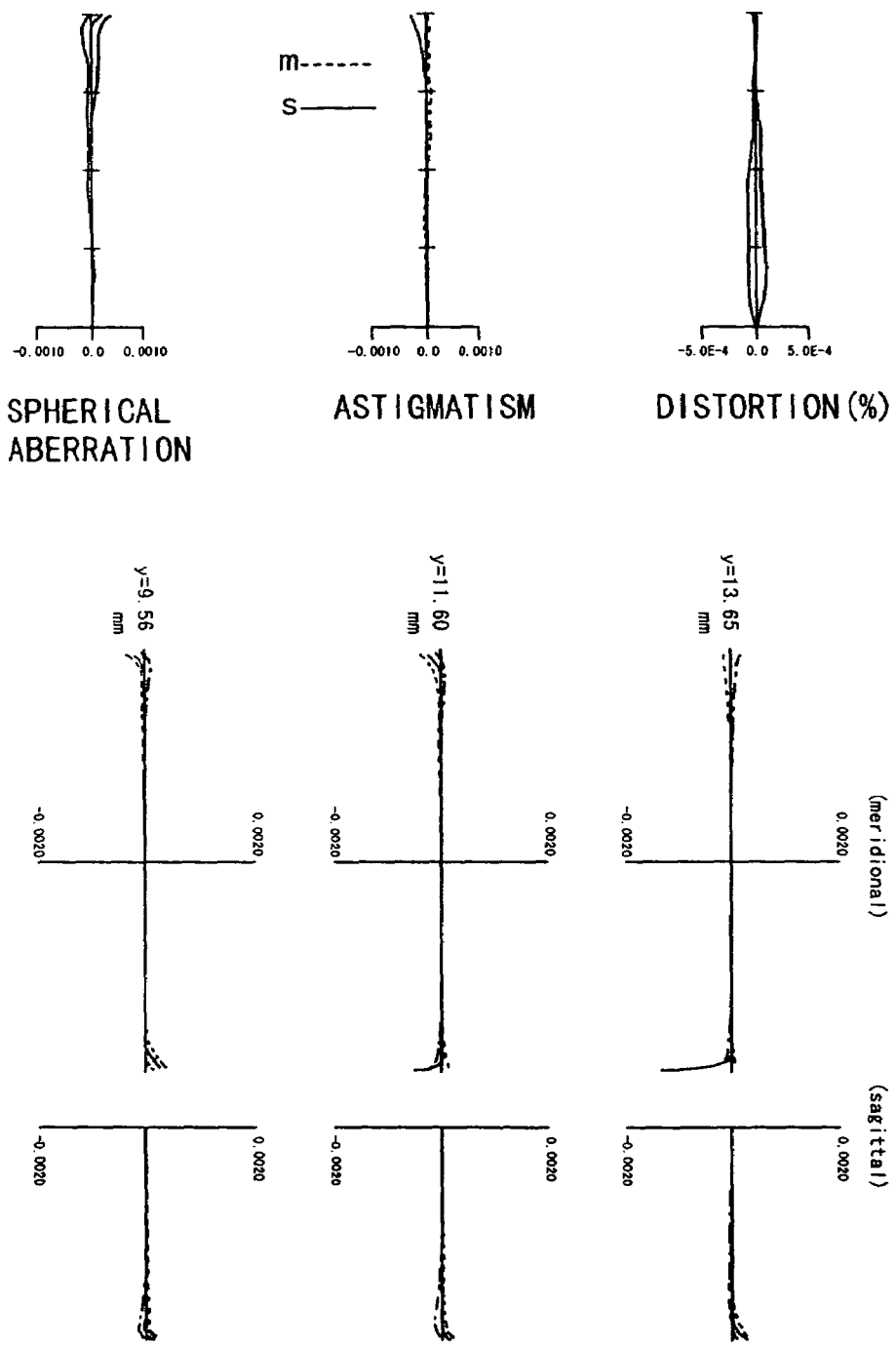
FIG. 39 illustrates aberrations in Example 15 of the present invention.

Structural specifications of numerical examples are shown in Table 15. In this example, an image side working distance of 36 mm is assured, and the total glass material length along the optical path is extraordinarily shortened to 203.7 mm. While the largest diameter of the optical system as a whole is 512 mm at the field optical system, the largest diameter of the second imaging system is as small as 146 mm, regardless that the NA is 0.6. FIG. 39 shows aberrations with respect to the base wavelength 157 nm and a wavelength range of 4 pm. From the drawing, it is seen that aberrations are corrected satisfactorily.

EXAMPLE 16

Figure 23:
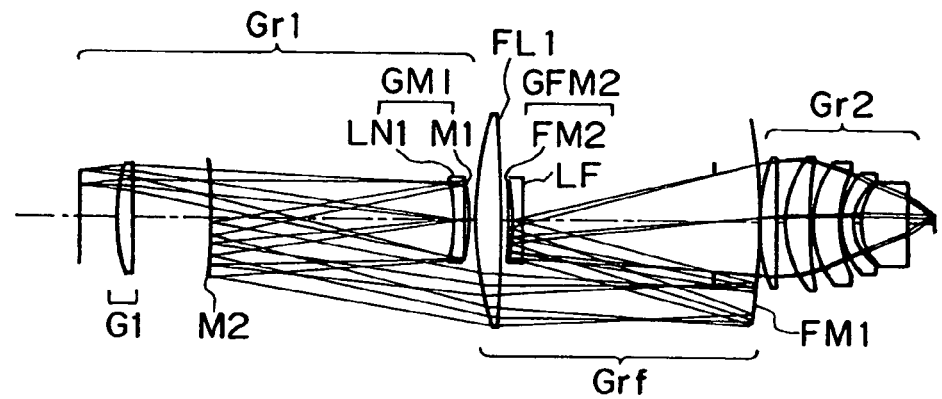
FIG. 23 is a schematic view of a light path in a case, in Example 16 of the present invention, wherein a field optical system includes two mirrors.

FIG. 23 is an optical path view of Example 16 of the present invention. The design base wavelength was 157 nm of $F_2$ excimer laser light, the NA was 0.6, and the projection magnification $\beta$ was 1:5. The lens conjugate distance L was 1190 mm. The optical system had an exposure region (imaging region) upon an image plane of an arcuate shape at the image height from 9.56 m to 13.65 mm. The optical system was provided by use of four mirrors and nine lenses (one lens added to Example 15).

In this example, denoted at r1–r8 are components of a first imaging system Gr1, and it comprises a positive lens (G1) at r1 and r2, negative lenses LN1 at r3 and r4; and r6 and r7 of the same type, a first mirror M1 (concave surface) and a second mirror M2 (convex surface). Denoted at r9–r16 are components of a field optical system Grf, and it comprises a positive lens FL1, a first field mirror FM1 (concave surface), a second field mirror FM2 (convex surface), and negative lenses LF at r12 and r13; and r15 and r16 of the same type. Denoted at r17–r27 are components of a second imaging system Gr2, and it comprises a stop r17, four positive lenses and one negative lens.

In this example, the magnification of the first imaging system Gr1 is slightly enlarged to −3.838× and, in consideration of it, the positive lens FL1 included in the field optical system Grf is disposed at the back on the image side, of the first mirror M1 to thereby suppress the increase of diameter. Further, with use of the first mirror group GM1 including the negative lens LN1 and the first mirror M1, as well as the second field mirror group GFM2 which is provided by the second field mirror FM2 (convex) and the negative lens LF, the Petzval sum is also controlled.

Figure 40:
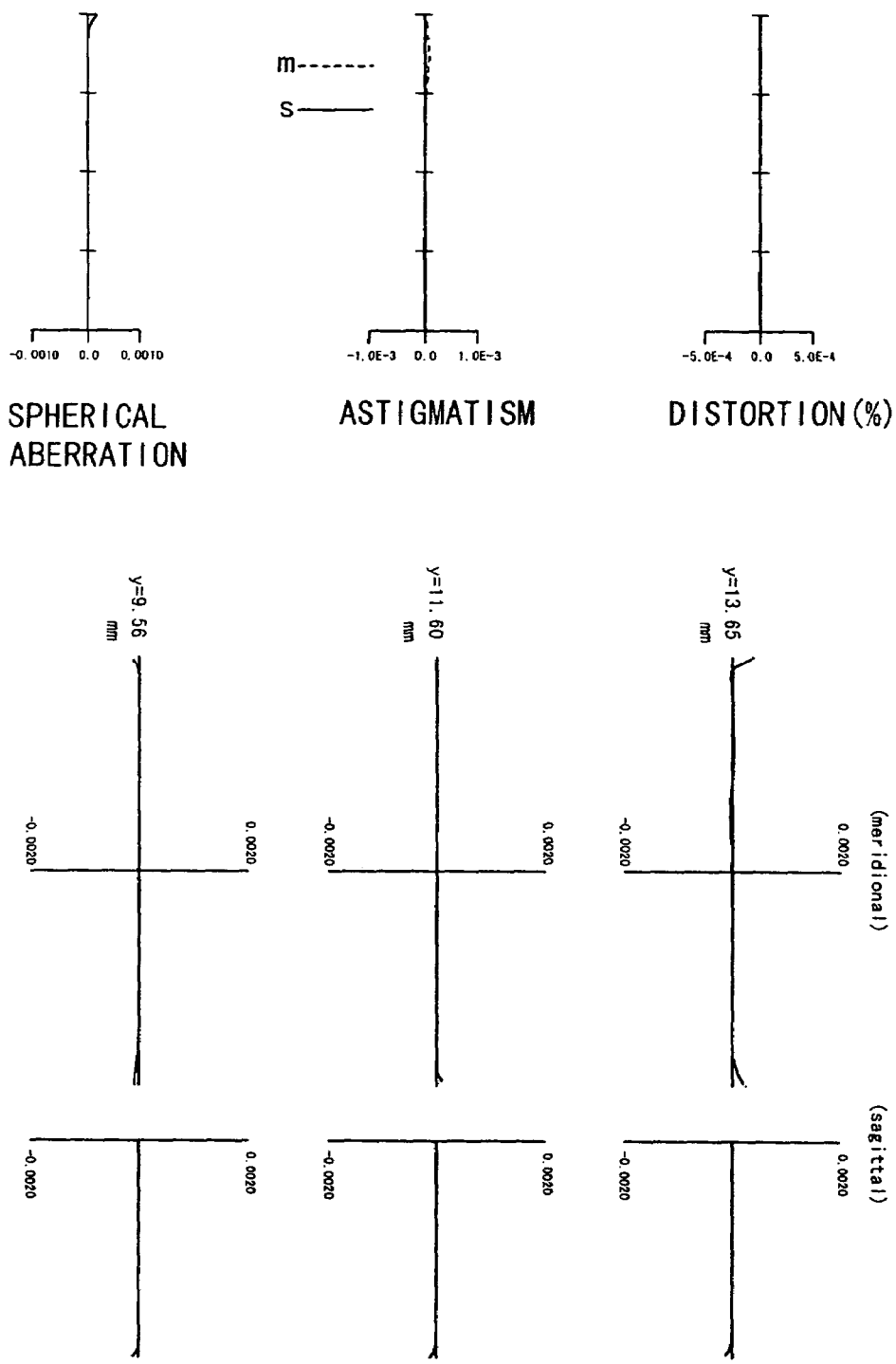
FIG. 40 illustrates aberrations in Example 16 of the present invention.

Structural specifications of numerical examples are shown in Table 16. In this example, an image side working distance of 36 mm is assured, and the total glass material length along the optical path is extraordinarily shortened to 292.8 mm. While the largest diameter of the optical system as a whole is 294 mm at the field optical system, the largest diameter of the second imaging system is as small as 184 mm, regardless that the NA is 0.6. FIG. 40 shows aberrations. From the drawing, it is seen that aberrations are corrected satisfactorily.

EXAMPLE 17

Figure 24:
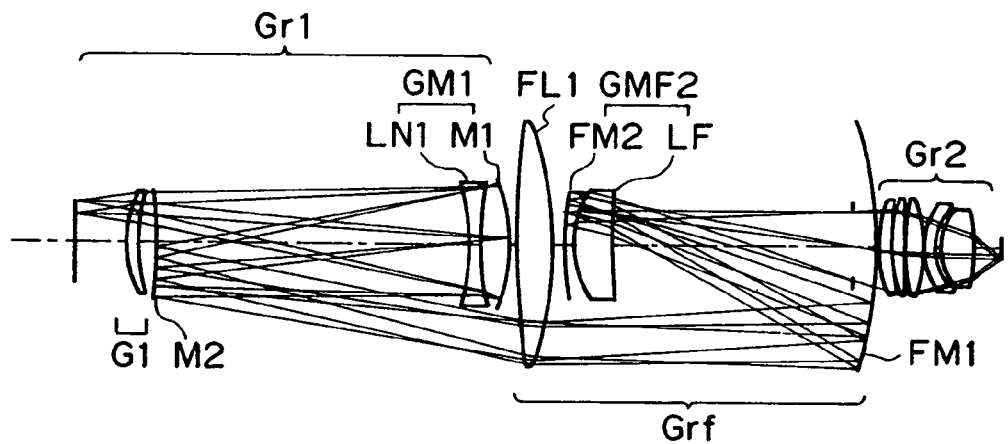
FIG. 24 is a schematic view of a light path in a case, in Example 17 of the present invention, wherein a field optical system includes two mirrors.

FIG. 24 is an optical path view of Example 17 of the present invention. The design base wavelength was 157 nm of $F_2$ excimer laser light, the NA was 0.6, and the projection magnification $\beta$ was 1:4. The lens conjugate distance L was 1188 mm. The optical system had an exposure region (imaging region) upon an image plane, of an arcuate shape, at the image height from 9.56 mm to 13.65 mm. The optical system was provided by use of four mirrors and nine lenses.

In this example, denoted at r1–r8 are components of a first imaging system Gr1, and it comprises a positive lens (G1) at r1 and r2, negative lenses LN1 at r3 and r4; and r6 and r7 of the same type, a first mirror M1 (concave surface) and a second mirror M2 (convex surface). Denoted at r9–r16 are components of a field optical system Grf, and it comprises a positive lens FL1, a first field mirror FM1 (concave surface), a second field mirror FM2 (concave surface), and positive lenses LF at r12 and r13; and r15 and r16 of the same type. Denoted at r17–r27 are components of a second imaging system Gr2, and it comprises a stop r17, four positive lenses and one negative lens.

In this example, the second field mirror FM2 as well as the positive lens LF, at the back thereof, are provided in the field optical system Grf. With this structure, an intermediate image is formed also just after (image side) of the positive lens LP. Thus, in the whole optical system, the imaging is executed three times. Therefore, after the field optical system Grf, the positive power becomes larger and the space is made smaller. Thus, the position of the first mirror M1 is placed relatively at the image side, and a value close to the upper limit of condition (12) is taken. Further, since the magnification at the first mirror M1 is made smaller, a value close to the lower limit of condition (13) is taken. As a result, the paraxial intermediate image at the first imaging system Gr1 is produced after the light which is reflected by the second mirror M2 and at a position closer to the object side. Thus, a value close to the lower limit of condition (11) is taken. Additionally, with use of the first mirror group GM1 provided by the negative lens LN1 and the first mirror M1, color correction is made.

Figure 41:
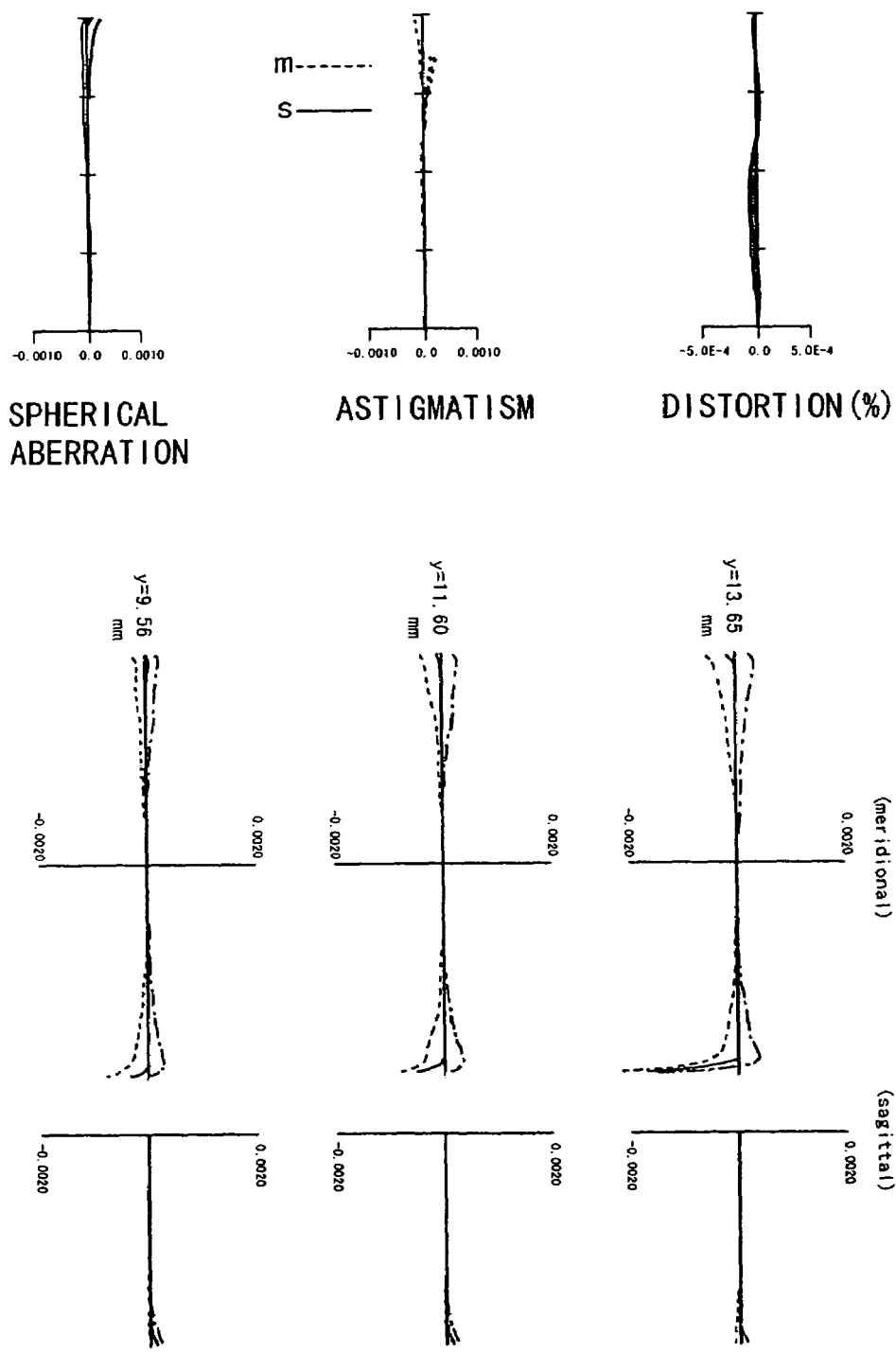
FIG. 41 illustrates aberrations in Example 17 of the present invention.

Structural specifications of numerical examples are shown in Table 17. In this example, an image side working distance of 36 mm is assured, and the total glass material length along the optical path is extraordinarily shortened to 303.3 mm. While the largest diameter of the optical system as a whole is 323 mm at the field optical system, the largest diameter of the second imaging system is as small as 125 mm, regardless that the NA is 0.6. FIG. 41 shows aberrations, with respect to the base wavelength 157 nm and a wavelength range of 2 pm. From the drawing, it is seen that aberrations are corrected satisfactorily.

EXAMPLE 18

Figure 25:
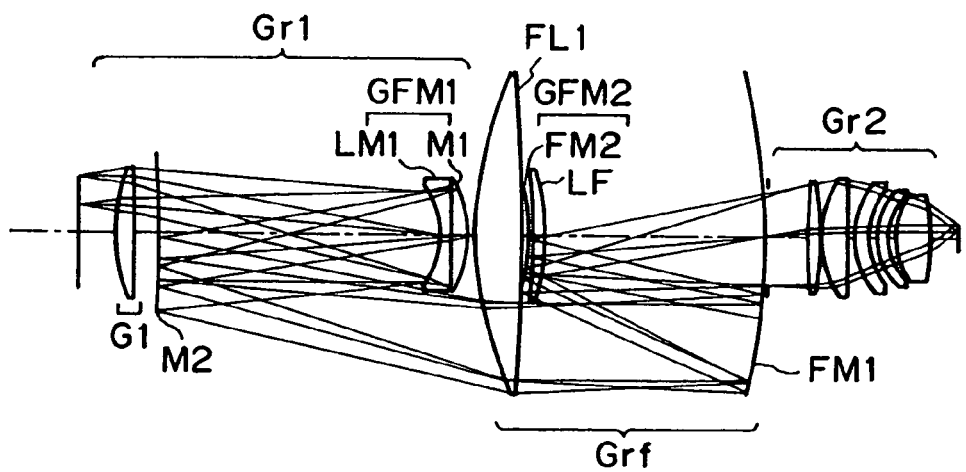
FIG. 25 is a schematic view of a light path in a case, in Example 18 of the present invention, wherein a field optical system includes two mirrors.

FIG. 25 is an optical path view of Example 18 of the present invention. The design base wavelength was 157 nm of $F_2$ excimer laser light, the NA was 0.6, and the projection magnification β was 1:4. The lens conjugate distance L was 1190 mm. The optical system had an exposure region (imaging region) upon an image plane, of an arcuate shape, at the image height from 10.0 mm to 20.0 mm. The optical system was provided by use of four mirrors and nine lenses, like Example 16.

In this example, denoted at r1–r8 are components of a first imaging system Gr1, and it comprises a positive lens (G1) at r1 and r2, negative lenses LN1 at r3 and r4; and r6 and r7 of the same type, a first mirror M1 (concave surface) and a second mirror M2 (convex surface). Denoted at r9–r16 are components of a field optical system Grf, and it comprises a positive lens FL1, a first field mirror FM1 (concave surface), a second field mirror FM2 (convex surface), and positive lenses LF at r12 and r13; and r15 and r16 of the same type. Denoted at r17–r27 are components of a second imaging system Gr2, and it comprises a stop r17, four positive lenses and one negative lens.

In this example, with use of the first mirror group GM1 as provided by the negative lens LN1 and the first mirror M1, color correction is accomplished Further, with use of the second field mirror group GFM2 which is provided by the second field mirror FM2 (convex) and the positive lens LF, the Petzval sum is also controlled.

Figure 42:
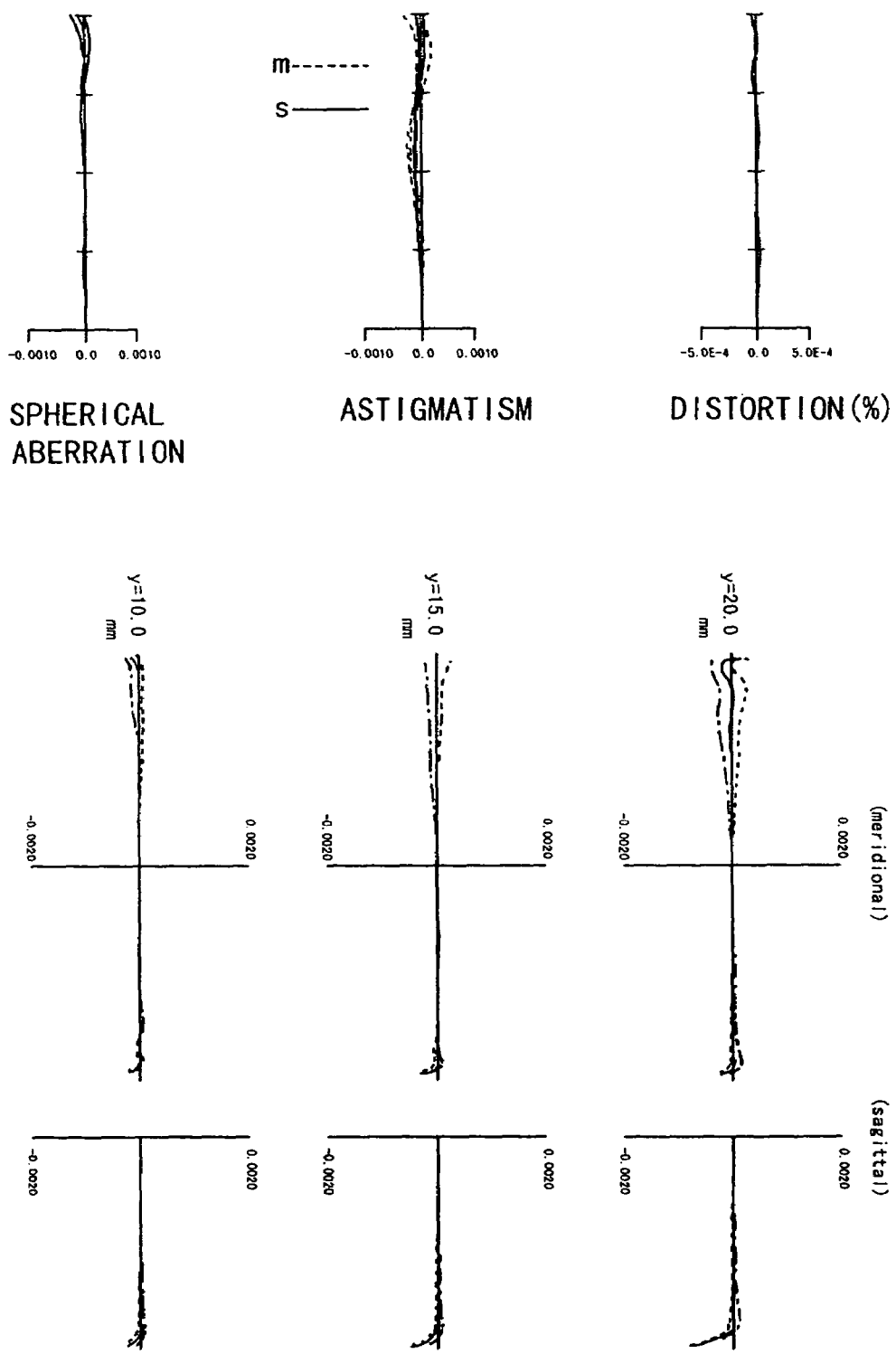
FIG. 42 illustrates aberrations in Example 18 of the present invention.

Structural specifications of numerical examples are shown in Table 18. In this example, an image side working distance of 37 mm is assured, and the total glass material length along the optical path is extraordinarily shortened to 286.8 mm. While the largest diameter of the optical system as a whole is 442 mm at the field optical system, the largest diameter of the second imaging system is as small as 165 mm, regardless that the NA is 0.6. FIG. 42 shows aberrations, with respect to the base wavelength 157 nm and a wavelength range of 4 pm. From the drawing, it is seen that the aberrations are corrected satisfactorily.

EXAMPLE 19

Figure 26:
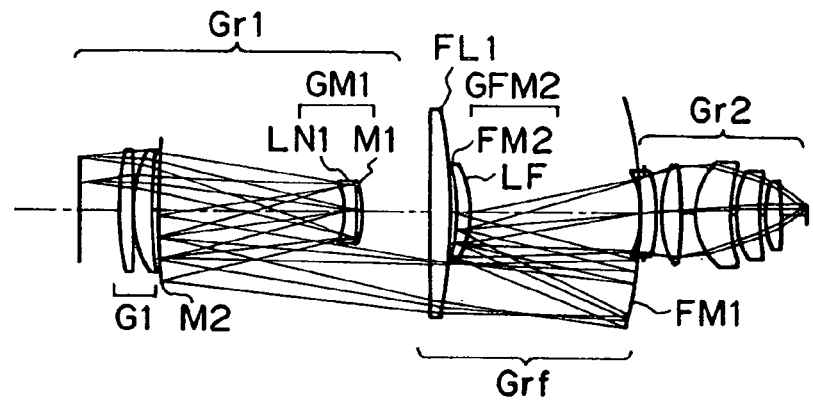
FIG. 26 is a schematic view of a light path in a case, in Example 19 of the present invention, wherein a field optical system includes two mirrors.

FIG. 26 is an optical path view of Example 18 of the present invention. The design base wavelength was 157 nm of $F_2$ excimer laser light, the NA was 0.6, and the projection magnification β was 1:5. The lens conjugate distance L was 934 mm. The optical system had an exposure region (imaging region) upon an image plane, of an arcuate shape, at the image height from 7.7 mm to 14.0 mm. The optical system was provided by use of four mirrors and ten lenses.

In this example, denoted at r1–r10 are components of a first imaging system Gr1, and it comprises positive lenses (G1) at r1 and r2; and r3 and r4, negative lenses LN1 at r5 and r6; and r8 and r9 of the same type, a first mirror M1 (concave surface) and a second mirror M2 (concave surface). Denoted at r11–r18 are components of a field optical system Grf, and it comprises a positive lens FL1, a first field mirror FM1 (concave surface), a second field mirror FM2 (convex surface), and positive lenses LF at r14 and r15; and r17 and r18 of the same type. Denoted at r19–r29 are components of a second imaging system Gr2, and it comprises a stop r19, four positive lenses and one negative lens.

In this example with the use of the first mirror group GM1 as provided by the negative lens LN1 and the first mirror M1, color correction is accomplished. Further with the use of the second field mirror group GFM2 2 which is provided by the second field mirror FM2 (convex) and the positive lens LF, the Petzval sum is also controlled. Since the magnification of the first imaging system Gr1 is at the most reduction rate, a value close to the upper limit of condition (9) is taken. Since the spacing between the second and first field mirrors FM2 and FM1 is relatively small, a value close to the lower limit of condition (14) is taken.

Figure 43:
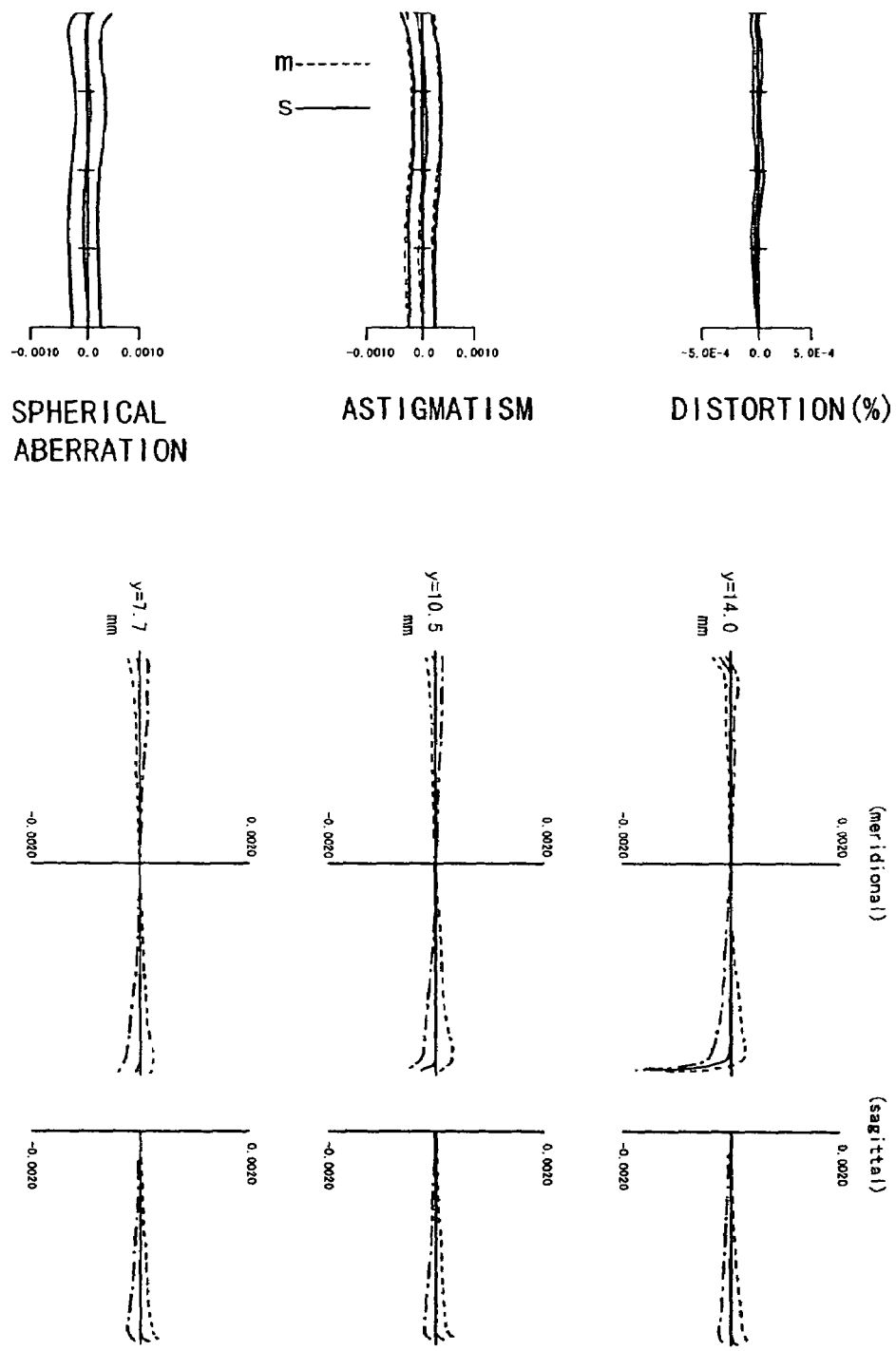
FIG. 43 illustrates aberrations in Example 19 of the present invention.

Structural specifications of numerical examples are shown in Table 19. In this example, an image side working distance of 33.7 mm is assured, and the total glass material length along the optical path is extraordinarily shortened to 264.4 mm. Further, the largest diameter of the whole optical system is very short, as small as 293 mm, and also, the largest diameter of the second imaging system is as small as 130 mm, regardless that the NA is 0.6. FIG. 43 shows aberrations, with respect to the base wavelength 157 nm and a wavelength range of 2 pm. From the drawing, it is seen that aberrations are corrected satisfactorily.

EXAMPLE 20

Figure 27:
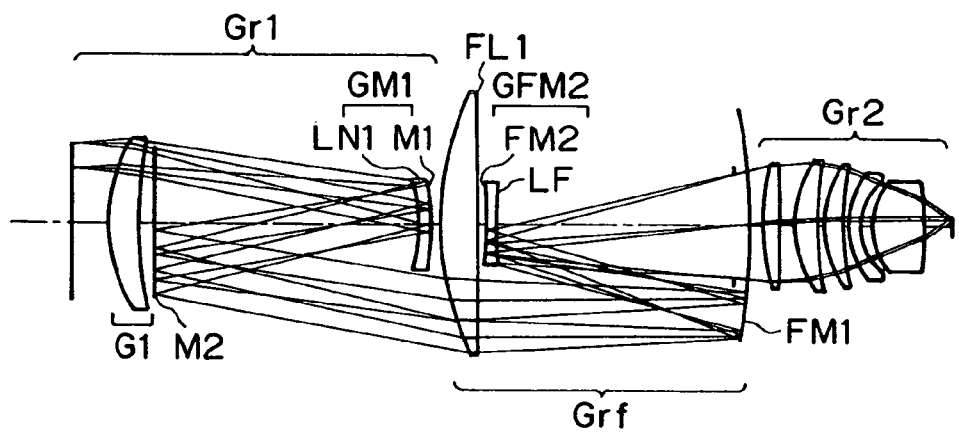
FIG. 27 is a schematic view of a light path in a case, in Example 20 of the present invention, wherein a field optical system includes two mirrors.

FIG. 27 is an optical path view of Example 20 of the present invention. The design base wavelength was 157 nm of $F_2$ excimer laser light, the NA was 0.6, and the projection magnification β was 1:8. The lens conjugate distance L was 1190 mm. The optical system had an exposure region (imaging region) upon an image plane, of an arcuate shape, at the image height from 9.56 mm to 13.65 mm. The optical system was provided by use of four mirrors and nine lenses, like Example 16.

In this example, denoted at r1–r8 are components of a first imaging system Gr1, and it comprises a positive lens (G1) at r1 and r2, negative lenses LN1 at r3 and r4; and r6 and r7 of the same type, a first mirror M1 (concave surface) and a second mirror M2 (convex surface). Denoted at r9–r16 are components of a field optical system Grf, and it comprises a positive lens FL1, a first field mirror FM1 (concave surface), a second field mirror FM2 (convex surface), and negative lenses LF at r12 and r13; and r15 and r16 of the same type. Denoted at r17–r27 are components of a second imaging system Gr2, and it comprises a stop r17, four positive lenses and one negative lens.

In this example, since the magnification of the first imaging system Gr1 is strongly enlarged, a value close to the lower limit of condition (9) is taken. This is because the magnification of the first mirror group GM1 is positive, and because a value close to the upper limit of condition (13) is taken. As a result, a value close to the upper limit of condition (11) is taken, and the position of the intermediate image produced by the first imaging system Gr1 is far remote from the first mirror M1. Further, since the pupil conjugate point of the first imaging system Gr1 is at the image plane side with respect to the first mirror M1, a value close to the upper limit of condition (10) is taken. Additionally, with the use of the second field mirror group GFM2 which is provided by the second field mirror FM2 (convex) and the negative lens LF, the Petzval sum is also controlled.

Figure 44:
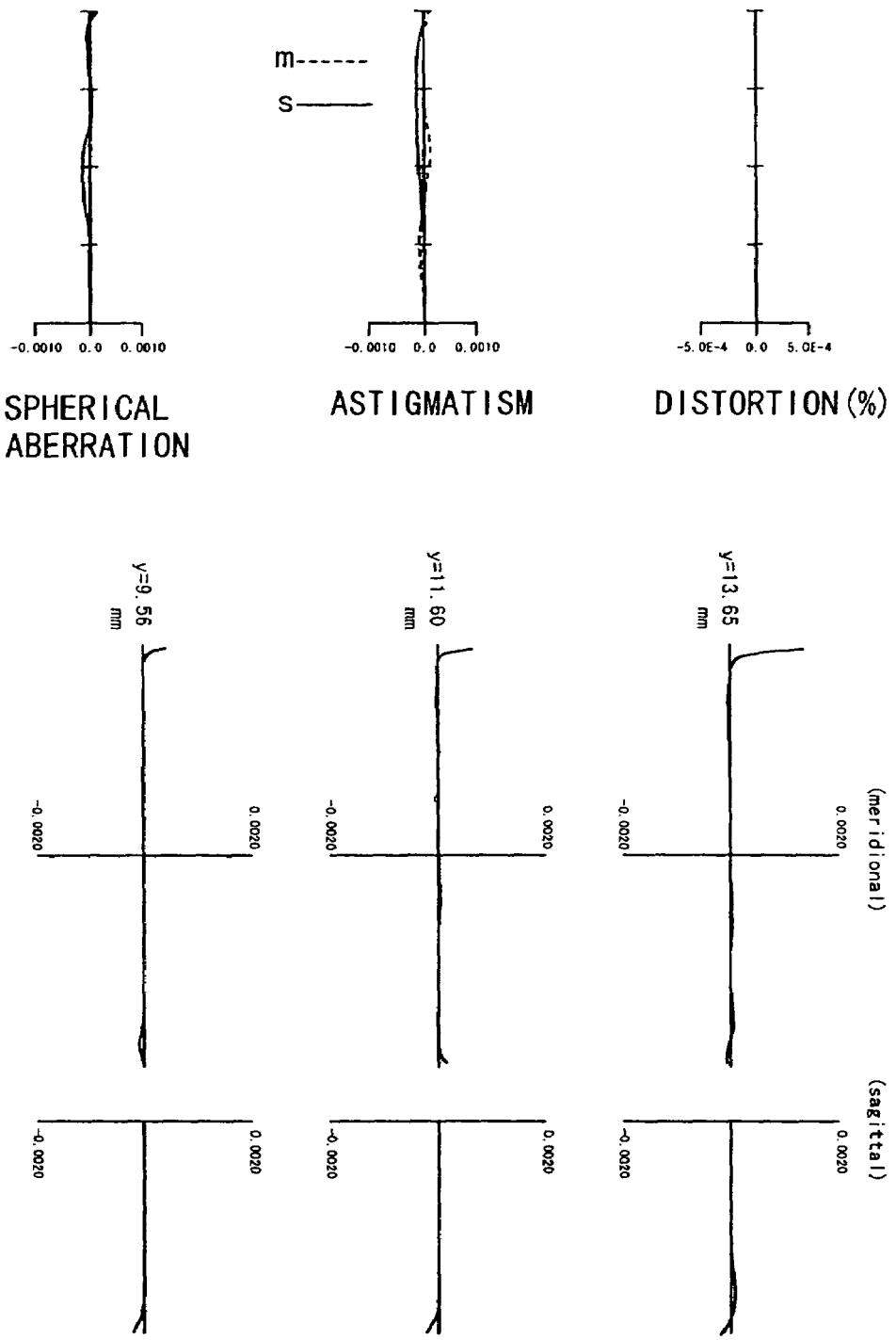
FIG. 44 illustrates aberrations in Example 20 of the present invention.

Structural specifications of numerical examples are shown in Table 20. In this example, an image side working distance of 36 mm is assured, and the total glass material length along the optical path is extraordinarily shortened to 315.5 mm. While the largest diameter of the optical system as a whole is 355 mm at the field optical system, the largest diameter of the second imaging system is as small as 177 mm, regardless that the NA is 0.6. FIG. 44 shows aberrations. From the drawing, it is seen that aberrations are corrected satisfactorily.

EXAMPLE 21

Figure 28:
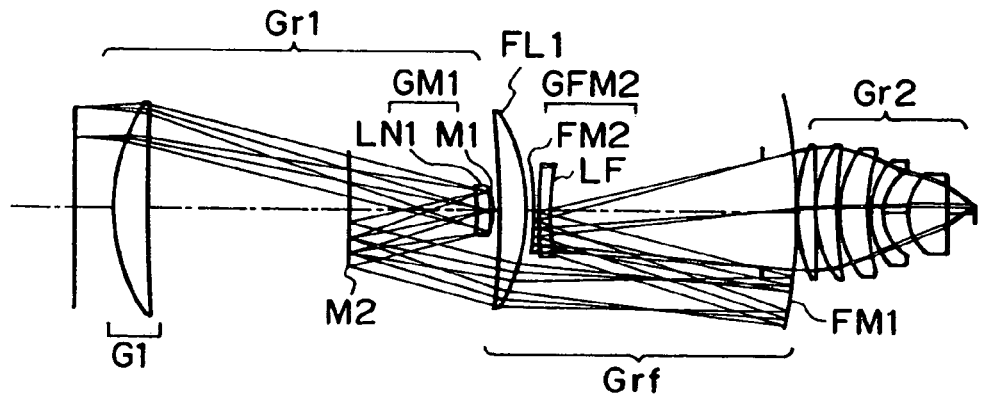
FIG. 28 is a schematic view of a light path in a case, in Example 21 of the present invention, wherein a field optical system includes two mirrors.

FIG. 28 is an optical path view of Example 21 of the present invention. The design base wavelength was 157 nm of $F_2$ excimer laser light, the NA was 0.6, and the projection magnification $\beta$ was 1:10. The lens conjugate distance L was 1190 mm. The optical system had an exposure region (imaging region) upon an image plane, of an arcuate shape, at the image height from 9.56 mm to 13.65 mm. The optical system was provided by the use of four mirrors and nine lenses, like Example 16.

In this example, denoted at r1–r8 are components of a first imaging system Gr1, and it comprises a positive lens (G1) at r1 and r2, negative lenses LN1 at r3 and r4; and r6 and r7 of the same type, a first mirror M1 (concave surface) and a second mirror M2 (convex surface which is substantially flat). Denoted at r9–r16 are components of a field optical system Gr1, and it comprises a positive lens FL1, a first field mirror FM1 (concave surface), a second field mirror FM2 (convex surface), and negative lenses LF at r12 and r13; and r15 and r16 of the same type. Denoted at r17–r27 are components of a second imaging system Gr2, and it comprises a stop r17, four positive lenses and one negative lens.

In this example, the magnification of the second imaging system Gr2 has a value close to the lower limit of condition (1). Also, the distance between the second and first mirrors M2 and M1 is short, and a value close to the lower limit of condition (6) is taken. Further, with the use of the first mirror group GM1 being provided by the negative lens LN1 and the first mirror M1 as well as the second field mirror group GFM2, which is provided by the second field mirror FM2 (convex) and the negative lens LF, the Petzval sum is also controlled.

Figure 45:
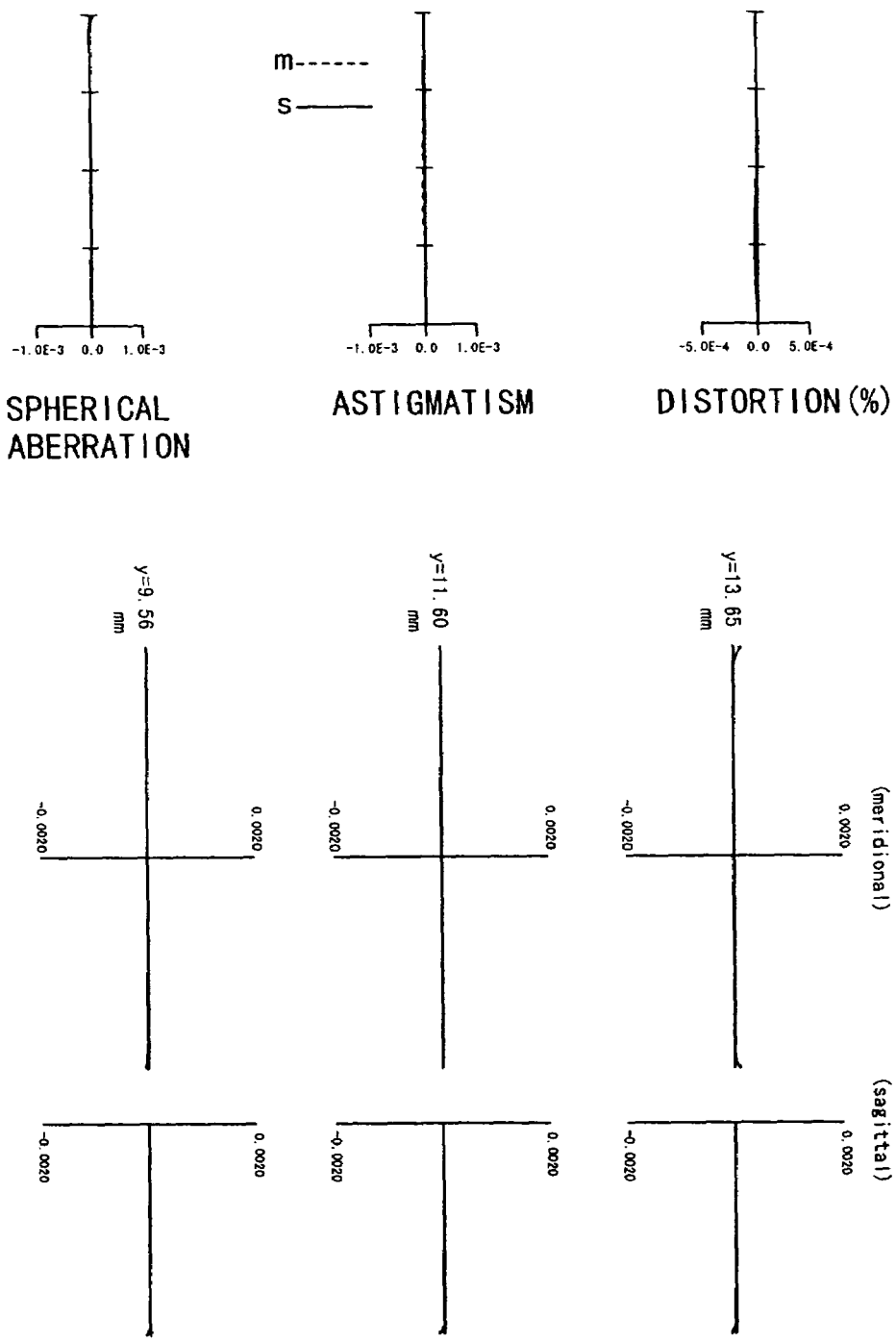
FIG. 45 illustrates aberrations in Example 21 of the present invention.

Structural specifications of numerical examples are shown in Table 21. In this example, an image side working distance of 36 mm is assured, and the total glass material length along the optical path is extraordinarily shortened to 301.7 mm. While the largest diameter of the optical system as a whole is 310 mm at the field optical system, the largest diameter of the second imaging system is as small as 180 mm, regardless that the NA is 0.6. FIG. 45 shows aberrations. From the drawing, it is seen that aberrations are corrected satisfactorily.

In Examples 5–21 described above, aspherical surfaces are used and, among the aspherical surfaces used, there are lens surfaces having a conical constant k set to zero. However, a design may be made while taking the conical constant k as a variable. Further, in these examples, the wavelength of an $F_2$ excimer laser was used as a design wavelength, and fluorite (n=1.5600) was used as the glass material for it. However, any other glass material such as fluorine-doped quartz, for example, may be used. When a KrF or an ArF light source is used, fluorite and quartz may be used in combination. Alternatively, only one of them may be used and, on that occasion, since the dispersion of glass material is smaller, the correction of chromatic aberration becomes easier.

A projection optical system according to these examples may be used as a projection optical system in a scan type projection exposure apparatus for projecting a pattern (device pattern such as a circuit pattern) of a reticle or a mask onto a substrate or a wafer in accordance with a step-and-scan procedure. A wafer is exposed to a device pattern by use of such an exposure apparatus, and then, the exposure wafer is developed. Through subsequent processes such as etching, devices (semiconductor chips) are produced.

Structural specifications of numerical examples according to Examples 1–21 are shown in Tables 1–21 below.

In the numerical examples, $r_i$ denotes the curvature radius at the i-th lens surface, in an order from the object side, $d_i$ is the i-th lens thickness or air spacing in an order from the object side, and $n_i$ is the refractive index of the i-th lens glass, in an order from the object side, with respect to the base wavelength=157 nm.

Further, the refractive indices of the wavelength +2 pm and −2 pm with respect to the base wavelength, are 1.5599949 and 1.5600051, respectively.

The shape of an aspherical surface can be given by the following equation:

$$X = \frac{H^2/\eta}{1+(1-(1+k)\cdot(H/\eta)^2)^{\frac{1}{2}}} + A\cdot H^4 + B\cdot H^6 + C\cdot H^8 + D\cdot H^{10} + E\cdot H^{12} + F\cdot H^{14} + G\cdot H^{16} + \ldots$$

where X is the amount of displacement from the lens vertex along the optical axis direction, H is the distance from the optical axis, $r_i$ is the curvature radius, k is the conical constant, and A, B, . . . and G are aspherical coefficients.

TABLE 1

EXAMPLE 1
FIRST OBJECT TO FIRST SURFACE DISTANCE: 83.739 mm

| i | ri | di | ni | |
|---|---|---|---|---|
| 1 | 989.392 | 18.000 | 1.56000 | M1 |
| 2 | −3595.508 | 1.697 | | M2 |
| 3 | 236.000 | 24.359 | 1.56000 | |
| 4 | 2462.140 | 300.511 | | |
| 5 | −114.548 | 18.000 | 1.56000 | |
| 6 | −946.909 | 7.879 | | |
| 7 | −185.804 | −7.879 | | |
| 8 | −946.909 | −18.000 | 1.56000 | |
| 9 | −114.548 | −286.511 | | |

TABLE 1-continued

EXAMPLE 1
FIRST OBJECT TO FIRST SURFACE DISTANCE: 83.739 mm

| | | | |
|---|---|---|---|
| 10 | 1428.922 | 324.390 | |
| 11 | 380.000 | 48.405 | 1.56000 |
| 12 | −345.892 | 434.726 | |
| 13 | 102.426 | 18.000 | 1.56000 |
| 14 | 225.926 | 45.944 | |
| 15 | 0.0(stop) | 21.343 | |
| 16 | 2291.779 | 28.288 | 1.56000 |
| 17 | −232.971 | 1.000 | |
| 18 | 68.389 | 22.403 | 1.56000 |
| 19 | 275.504 | 1.000 | |
| 20 | 139.927 | 19.297 | 1.56000 |
| 21 | 275.224 | 5.771 | |
| 22 | −963.793 | 27.452 | 1.56000 |
| 23 | −228.789 | 1.000 | |
| 24 | 106.934 | 18.000 | 1.56000 |
| 25 | −742.488 | | | aspherical surfaces

| i | K | A | B | C | D |
|---|---|---|---|---|---|
| 2 | 0.000000e+000 | 3.268074e−008 | −6.656739e−012 | 1.084352e−016 | −1.466501e−020 |
| 4 | 0.000000e+000 | −5.945159e−008 | 9.367805e−012 | −3.675672e−016 | 1.878106e−020 |
| 5 | 0.000000e+000 | −1.045454e−008 | 9.094085e−013 | 4.644093e−017 | 6.202292e−019 |
| 7 | 0.000000e+000 | −1.020658e−008 | −2.127267e−013 | −2.970263e−017 | 1.066496e−019 |
| 9 | 0.000000e+000 | −1.045454e−008 | 9.094085e−013 | 4.644093e−017 | 6.202292e−019 |
| 12 | 0.000000e+000 | 1.276943e−008 | −3.269379e−014 | −1.148753e−018 | 1.871030e−022 |
| 13 | 0.000000e+000 | −1.177280e−007 | −9.735382e−012 | −5.058594e−016 | −7.794080e−020 |
| 16 | 0.000000e+000 | 7.415847e−008 | −1.533594e−011 | 2.908683e−015 | −1.312466e−019 |
| 18 | −2.765242e−001 | −4.548406e−009 | 8.093119e−012 | −1.772233e−015 | −2.169524e−018 |
| 20 | −3.452390e+000 | −1.157411e−007 | −3.193404e−011 | −1.695026e−015 | 3.936837e−018 |
| 22 | 0.000000e+000 | 1.441342e−007 | 1.875541e−011 | 8.365199e−015 | −6.884476e−018 |
| 24 | −5.937621e−001 | −2.497358e−007 | −8.672718e−011 | −1.119851e−014 | −1.058646e−017 |

| i | E | F | G |
|---|---|---|---|
| 2 | 2.506755e−024 | −9.840963e−029 | 0.000000e+000 |
| 4 | −1.827522e−024 | 7.013708e−029 | 0.000000e+000 |
| 5 | −1.953400e−022 | 2.716627e−026 | 0.000000e+000 |
| 7 | −2.877088e−023 | 3.146892e−027 | 0.000000e+000 |
| 9 | −1.963400e−022 | 2.716627e−026 | 0.000000e+000 |
| 12 | −9.175707e−027 | 1.629370e−031 | 0.000000e+000 |
| 13 | 1.160369e−023 | −1.219551e−027 | 0.000000e+000 |
| 16 | −2.557773e−022 | 5.424698e−026 | 0.000000e+000 |
| 18 | 3.623462e−022 | −1.873086e−025 | 0.000000e+000 |
| 20 | 2.639407e−022 | −5.908244e−025 | 0.000000e+000 |
| 22 | 7.408468e−021 | −4.850248e−025 | 0.000000e+000 |
| 24 | 1.061653e−020 | −1.104395e−023 | 0.000000e+000 |

TABLE 2

EXAMPLE 2
FIRST OBJECT TO FIRST SURFACE DISTANCE: 75.685 mm

| i | ri | di | ni | |
|---|---|---|---|---|
| 1 | 297.627 | 19.775 | 1.56000 | M1 |
| 2 | −1115.696 | 328.484 | | M2 |
| 3 | −160.548 | 18.000 | 1.56000 | |
| 4 | 2147.160 | 22.180 | | |
| 5 | −203.139 | −22.180 | | |
| 6 | 2147.160 | −18.000 | 1.56000 | |
| 7 | −160.548 | −313.164 | | |
| 8 | 0.000 | 365.344 | | |
| 9 | 1040.329 | 38.055 | 1.56000 | |
| 10 | −387.846 | 1.000 | | |
| 11 | 190.260 | 45.524 | 1.56000 | |
| 12 | 634.071 | 120.149 | | |
| 13 | 249.471 | 18.000 | 1.56000 | |
| 14 | 127.136 | 325.385 | | |
| 15 | 0.0(stop) | 1.000 | | |
| 16 | 234.780 | 33.014 | 1.56000 | |
| 17 | −336.281 | 1.000 | | |

TABLE 2-continued

EXAMPLE 2
FIRST OBJECT TO FIRST SURFACE DISTANCE: 75.685 mm

| i | ri | di | ni |
|---|---|---|---|
| 18 | 144.606 | 35.000 | 1.56000 |
| 19 | 968.534 | 16.804 | |
| 20 | −793.316 | 35.000 | 1.56000 |
| 21 | −100.000 | 1.000 | |
| 22 | 88.381 | 25.000 | 1.56000 |
| 23 | 0.000 | | | aspherical surfaces

| i | K | A | B | C | D |
|---|---|---|---|---|---|
| 1 | 0.000000e+000 | 1.372961e−008 | 3.473252e−013 | −3.195720e−016 | 9.094243e−020 |
| 3 | 0.000000e+000 | 2.151239e−008 | 9.541648e−012 | 4.776084e−016 | 7.380865e−020 |
| 5 | 0.000000e+000 | 4.532898e−009 | 1.823606e−012 | 1.222571e−016 | 1.631434e−020 |
| 7 | 0.000000e+000 | 2.151239e−008 | 9.541648e−012 | 4.776084e−016 | 7.380865e−020 |
| 10 | 0.000000e+000 | 5.040814e−010 | 2.625973e−013 | −1.989714e−017 | 9.422664e−022 |
| 11 | 0.000000e+000 | −5.072499e−009 | 1.389868e−013 | −1.647184e−017 | 3.468047e−022 |
| 14 | 0.000000e+000 | 3.310157e−008 | 2.186614e−012 | 3.087404e−016 | −3.918557e−020 |
| 17 | 0.000000e+000 | 1.858529e−007 | 1.966297e−011 | 2.828536e−015 | 2.203369e−019 |
| 20 | 0.000000e+000 | −1.667572e−007 | −3.379925e−011 | 7.374563e−015 | −5.503285e−019 |
| 22 | 0.000000e+000 | −4.993819e−008 | 7.233187e−012 | −2.042203e−015 | 3.653495e−020 |

| i | E | F | G |
|---|---|---|---|
| 1 | −1.434764e−023 | 1.206555e−027 | −4.210407e−032 |
| 3 | −2.063590e−023 | 4.825958e−027 | −5.593776e−031 |
| 5 | −8.711867e−025 | 2.964757e−028 | 1.525109e−033 |
| 7 | −2.063590e−023 | 4.825958e−027 | −5.593776e−031 |
| 10 | −2.700833e−026 | 4.650686e−031 | −4.262218e−036 |
| 11 | 3.873194e−028 | −2.799981e−031 | 4.425078e−037 |
| 14 | 1.130858e−023 | −1.107497e−027 | 6.460332e−032 |
| 17 | 1.188890e−022 | −2.552801e−026 | 7.612208e−030 |
| 20 | 1.402677e−023 | 2.115981e−027 | −8.027962e−031 |
| 22 | −2.309114e−022 | −5.309629e−026 | 5.804270e−030 |

TABLE 3

EXAMPLE 3
FIRST OBJECT TO FIRST SURFACE DISTANCE: 72.674

| i | ri | di | ni | |
|---|---|---|---|---|
| 1 | −593.057 | 25.376 | 1.56000 | M1 |
| 2 | −320.774 | 1.000 | | M2 |
| 3 | 463.082 | 27.632 | 1.56000 | |
| 4 | −613.991 | 281.867 | | |
| 5 | −109.249 | 18.000 | 1.56000 | |
| 6 | −961.687 | 9.159 | | |
| 7 | −178.361 | −9.159 | | |
| 8 | −961.687 | −18.000 | 1.56000 | |
| 9 | −109.249 | −266.071 | | |
| 10 | 1622.171 | 305.230 | | |
| 11 | −1660.654 | 24.024 | 1.56000 | |
| 12 | −365.238 | 1.000 | | |
| 13 | 347.111 | 47.000 | 1.56000 | |
| 14 | −1881.176 | 410.002 | | |
| 15 | 8178.667 | 26.178 | 1.56000 | |
| 16 | −212.848 | 75.049 | | |
| 17 | 0.0(stop) | 15.536 | | |
| 18 | 268.041 | 33.816 | 1.56000 | |
| 19 | −186.462 | 1.000 | | |
| 20 | 87.102 | 20.173 | 1.56000 | |
| 21 | 350.675 | 1.000 | | |
| 22 | 156.475 | 21.218 | 1.56000 | |
| 23 | 86.116 | 6.639 | | |
| 24 | 168.945 | 20.602 | 1.56000 | |
| 25 | −165.909 | 1.000 | | |
| 26 | 105.283 | 20.915 | 1.56000 | |
| 27 | −743.988 | | | |

TABLE 3-continued

EXAMPLE 3
FIRST OBJECT TO FIRST SURFACE DISTANCE: 72.674 aspherical surfaces

| i | K | A | B | C | D |
|---|---|---|---|---|---|
| 2 | −7.252390e+000 | −4.701121e−009 | −6.090134e−013 | −1.267089e−017 | 8.029170e−022 |
| 4 | 0.000000e+000 | −4.766887e−008 | 2.462294e−012 | −9.893034e−017 | 6.719603e−021 |
| 5 | 0.000000e+000 | 2.116808e−009 | −1.611319e−013 | 1.025091e−015 | 5.091150e−019 |
| 7 | 0.000000e+000 | −6.712584e−009 | −8.093063e−013 | 2.887582e−017 | 9.870124e−020 |
| 9 | 0.000000e+000 | 2.116808e−009 | −1.611319e−013 | 1.025091e−015 | 5.091150e−019 |
| 10 | 0.000000e+000 | 7.054971e−010 | 2.418241e−014 | 1.839107e−018 | −7.963029e−023 |
| 12 | 0.000000e+000 | 4.707819e−009 | −2.189427e−014 | 1.973642e−018 | −1.068343e−023 |
| 13 | 0.000000e+000 | 8.092928e−010 | −6.294695e−014 | 1.464461e−018 | 1.870403e−023 |
| 15 | 0.000000e+000 | −1.344505e−007 | 1.853632e−012 | 1.650439e−016 | −1.056871e−020 |
| 18 | 5.660213e+000 | 2.805319e−008 | −5.963359e−011 | 5.837059e−017 | 8.483480e−019 |
| 20 | −5.463452e−001 | −1.335770e−007 | −8.743479e−013 | 4.818362e−015 | 2.569222e−020 |
| 22 | −1.401348e+000 | −4.899966e−008 | 2.339115e−011 | −1.429818e−014 | −1.677957e−018 |
| 24 | 0.000000e+000 | 3.153044e−007 | −8.376396e−012 | 1.928547e−014 | −5.705932e−018 |
| 26 | 6.648275e−001 | −1.189888e−007 | 6.781855e−012 | −1.430235e−014 | 3.880028e−018 |

| i | E | F | G |
|---|---|---|---|
| 2 | −4.085486e−025 | 1.924786e−029 | 0.000000e+000 |
| 4 | −2.271393e−025 | 1.177205e−030 | 0.000000e+000 |
| 5 | −1.657547e−023 | 6.847636e−027 | 0.000000e+000 |
| 7 | −1.029026e−023 | 8.654760e−028 | 0.000000e+000 |
| 9 | −1.657547e−023 | 6.847636e−027 | 0.000000e+000 |
| 10 | 4.433871e−028 | 2.201312e−032 | 0.000000e+000 |
| 12 | −2.065745e−027 | 5.118720e−032 | 0.000000e+000 |
| 13 | −3.513181e−027 | 7.676071e−032 | 0.000000e+000 |
| 15 | −1.436354e−025 | −9.351577e−030 | 0.000000e+000 |
| 18 | −2.758585e−022 | 2.006196e−026 | 0.000000e+000 |
| 20 | −2.770624e−022 | −8.035716e−026 | 0.000000e+000 |
| 22 | 1.983183e−021 | −1.380364e−025 | 0.000000e+000 |
| 24 | −4.390899e−023 | 5.287086e−026 | 0.000000e+000 |
| 26 | 3.573891e−021 | 2.151859e−025 | 0.000000e+000 |

TABLE 4

EXAMPLE 4
FIRST OBJECT TO FIRST SURFACE DISTANCE: 81.211

| i | ri | di | ni | |
|---|---|---|---|---|
| 1 | 2240.555 | 47.000 | 1.56000 | M1 |
| 2 | −312.927 | 1.000 | | M2 |
| 3 | 209.677 | 34.603 | 1.56000 | |
| 4 | −314.137 | 150.769 | | |
| 5 | −819.717 | −140.769 | | |
| 6 | 277.686 | 889.917 | | |
| 7 | 1806.318 | 19.445 | 1.56000 | |
| 8 | −583.025 | 1.000 | | |
| 9 | 0.0(stop) | 73.850 | | |
| 10 | 197.078 | 35.504 | 1.56000 | |
| 11 | 879.977 | 1.000 | | |
| 12 | 126.409 | 28.494 | 1.56000 | |
| 13 | 168.675 | 98.900 | | |
| 14 | 121.885 | 21.036 | 1.56000 | |
| 15 | 905.776 | | | | aspherical surfaces

| i | K | A | B | C | D |
|---|---|---|---|---|---|
| 2 | 0.000000e+000 | 3.706794e−008 | −5.144019e−012 | 6.973326e−017 | −7.330968e−021 |
| 4 | 0.000000e+000 | 3.878903e−009 | 7.795334e−012 | −6.781754e−016 | 5.265168e−020 |
| 5 | 0.000000e+000 | 8.445174e−009 | 3.143938e−011 | −2.614011e−014 | 2.098089e−017 |
| 6 | 0.000000e+000 | −2.863861e−009 | −5.305438e−015 | 1.717130e−018 | −3.511472e−023 |
| 7 | 0.000000e+000 | −3.549063e−009 | −1.408264e−013 | 1.931760e−019 | 5.091573e−023 |
| 10 | 0.000000e+000 | −5.841539e−009 | −2.405096e−013 | 4.288890e−018 | −7.434790e−022 |
| 12 | 0.000000e+000 | −5.913583e−009 | −4.340165e−014 | −1.651705e−017 | −1.294295e−022 |
| 14 | 0.000000e+000 | −8.534527e−008 | −8.202426e−012 | −7.411706e−016 | −1.255475e−020 |

TABLE 4-continued

EXAMPLE 4
FIRST OBJECT TO FIRST SURFACE DISTANCE: 81.211

| i | E | F | G |
|---|---|---|---|
| 2 | 7.818988e−025 | −1.099803e−029 | 0.000000e+000 |
| 4 | −3.124244e−024 | 7.960469e−029 | 0.000000e+000 |
| 5 | −1.054713e−020 | 2.300997e−024 | 0.000000e+000 |
| 6 | −1.813806e−028 | 5.037276e−032 | 0.000000e+000 |
| 7 | −4.316781e−027 | 8.877331e−032 | 0.000000e+000 |
| 10 | 2.311772e−026 | −5.842989e−031 | 0.000000e+000 |
| 12 | 1.623655e−026 | −3.143454e−030 | 0.000000e+000 |
| 14 | −2.566756e−024 | −3.831608e−028 | 0.000000e+000 |

TABLE 5

EXAMPLE 5

| i | ri | di | ni | Obj-distance = 281.857 |
|---|---|---|---|---|
| 1 | −276.517 | −185.013 | −1.0 | M1 |
| 2 | 698.217 | 199.972 |  | M2 |
| 3 | 507.773 | 48.488 | 1.56000 | FL1 |
| 4 | −238.848 | 9.987 |  | $\beta$ = 1/6 |
| 5 | 253.725 | 25.649 | 1.56000 | L = 1005 mm |
| 6 | 544.261 | 258.577 |  | NA = 0.6 |
| 7 | −100.183 | 10.000 | 1.56000 |  |
| 8 | −348.125 | 108.113 |  |  |
| 9 | −205.877 | 10.000 | 1.56000 |  |
| 10 | −302.653 | 9.696 |  |  |
| 11 | 0.0(stop) | 11.356 |  |  |
| 12 | 388.065 | 23.350 | 1.56000 |  |
| 13 | −153.114 | 45.670 |  |  |
| 14 | 227.862 | 40.204 | 1.56000 |  |
| 15 | −163.407 | 1.004 |  |  |
| 16 | 82.650 | 12.336 | 1.56000 |  |
| 17 | 80.232 | 7.123 |  |  |
| 18 | 118.960 | 10.000 | 1.56000 |  |
| 19 | 54.261 | 1.597 |  |  |
| 20 | 56.346 | 44.698 | 1.56000 |  |
| 21 | −655.354 |  |  |  | aspherical surfaces

| i | K | A | B | C | D |
|---|---|---|---|---|---|
| 1 | 1.497949e+000 | 5.904355e−008 | 4.604214e−012 | −6.840591e−016 | −4.605410e−019 |
| 2 | 3.802520e+000 | −2.958077e−008 | −4.331805e−013 | −3.956055e−017 | 1.351662e−020 |
| 3 | 0.000000e+000 | −1.396795e−008 | −2.011294e−013 | 9.452577e−019 | 3.436796e−022 |
| 6 | 0.000000e+000 | −5.231213e−009 | −3.200408e−013 | −7.768341e−018 | 3.291916e−022 |
| 8 | 0.000000e+000 | 2.948640e−008 | −6.137758e−012 | −5.828601e−016 | −1.299053e−019 |
| 10 | 0.000000e+000 | 1.391954e−007 | −1.481745e−011 | −9.656666e−016 | 2.464643e−020 |
| 13 | 0.000000e+000 | 9.988863e−008 | 1.676874e−011 | −3.517423e−016 | 1.878125e−019 |
| 14 | 0.000000e+000 | −1.684369e−009 | −1.027341e−011 | −6.807870e−016 | 4.062904e−019 |
| 16 | 0.000000e+000 | −1.178575e−007 | 4.129293e−012 | 4.790552e−015 | 8.697392e−019 |
| 19 | 0.000000e+000 | 1.390299e−008 | −3.249927e−010 | −4.393543e−014 | 1.252755e−016 |
| 20 | 0.000000e+000 | 2.089833e−007 | −3.169110e−010 | −5.080159e−014 | 1.188278e−016 |

| i | E | F | G |
|---|---|---|---|
| 1 | 4.455246e−022 | −9.166535e−026 | 0.000000e+000 |
| 2 | −3.311509e−024 | 2.709386e−028 | 0.000000e+000 |
| 3 | −1.264170e−026 | 1.297626e−031 | 0.000000e+000 |
| 6 | 2.676252e−027 | −1.441611e−031 | 0.000000e+000 |
| 8 | 1.266056e−023 | −2.859330e−027 | 0.000000e+000 |
| 10 | 6.808416e−024 | 2.160253e−027 | 0.000000e+000 |
| 13 | −1.242980e−023 | 4.020013e−028 | 0.000000e+000 |
| 14 | −4.999088e−023 | 2.234236e−027 | 0.000000e+000 |
| 16 | −4.361816e−022 | 6.665268e−026 | 0.000000e+000 |
| 19 | −7.292427e−020 | 1.490664e−023 | 0.000000e+000 |
| 20 | −6.999891e−020 | 1.483259e−023 | 0.000000e+000 |

TABLE 6

EXAMPLE 6

| i | ri | di | ni | Obj-distance = 50.000 |
|---|---|---|---|---|
| 1 | 182.669 | 30.734 | 1.56000 | M1 |
| 2 | −503.082 | 207.487 | −1.0 | M2 |
| 3 | −210.424 | −187.803 | | FL1 |
| 4 | 659.854 | 198.194 | | $\beta = 1/5$ |
| 5 | 444.311 | 36.819 | 1.56000 | L = 956 mm |
| 6 | −268.965 | 10.000 | | NA = 0.6 |
| 7 | 453.477 | 20.965 | 1.56000 | |
| 8 | −50557.268 | 242.048 | | |
| 9 | 40075.824 | 10.000 | 1.56000 | |
| 10 | 139.483 | 106.449 | | |
| 11 | −315.120 | 10.000 | 1.56000 | |
| 12 | −568.730 | 9.619 | | |
| 13 | 0.0(stop) | 12.608 | | |
| 14 | 594.545 | 31.653 | 1.56000 | |
| 15 | −138.456 | 36.327 | | |
| 16 | 237.603 | 34.661 | 1.56000 | |
| 17 | −150.971 | 0.100 | | |
| 18 | 86.895 | 17.884 | 1.56000 | |
| 19 | 114.792 | 5.157 | | |
| 20 | 161.292 | 10.000 | 1.56000 | |
| 21 | 48.459 | 2.549 | | |
| 22 | 50.928 | 29.428 | 1.56000 | |
| 23 | −7294.344 | | | | aspherical surfaces

| i | K | A | B | C | D |
|---|---|---|---|---|---|
| 2 | 0.000000e+000 | 2.099767e−008 | 9.783077e−013 | −1.844192e−016 | 3.604034e−020 |
| 3 | 5.000000e+000 | 5.501181e−007 | 1.471305e−010 | 2.886973e−014 | −5.770432e−017 |
| 4 | −4.000000e+000 | −9.108110e−009 | −4.299510e−013 | −1.602876e−017 | 3.309710e−021 |
| 5 | 0.000000e+000 | −2.136611e−008 | 4.694331e−013 | 1.022387e−017 | −1.167939e−021 |
| 8 | 0.000000e+000 | −9.037445e−009 | 3.670281e−013 | 2.497754e−017 | −1.935627e−021 |
| 10 | 0.000000e+000 | 1.834298e−007 | −9.750539e−012 | −4.421365e−015 | −1.558851e−018 |
| 12 | 0.000000e+000 | 9.777784e−008 | −1.873380e−012 | −2.797369e−015 | 9.645417e−019 |
| 15 | 0.000000e+000 | 8.427543e−011 | 1.174046e−011 | 5.170272e−016 | −9.544492e−020 |
| 16 | 0.000000e+000 | 3.081549e−008 | −1.715163e−011 | −1.340386e−015 | 4.768602e−019 |
| 18 | 0.000000e+000 | −2.081579e−007 | −2.247876e−011 | 7.527512e−015 | 2.070479e−018 |
| 21 | 0.000000e+000 | 2.662651e−007 | −3.356811e−010 | −5.994494e−014 | 9.695043e−017 |
| 22 | 0.000000e+000 | 3.826198e−007 | −2.597161e−010 | −5.670062e−014 | 7.056558e−017 |

| i | E | F | G |
|---|---|---|---|
| 2 | −4.028724e−024 | 1.813820e−028 | 0.000000e+000 |
| 3 | 2.143537e−020 | −3.240090e−024 | 0.000000e+000 |
| 4 | −7.115890e−025 | 4.509207e−029 | 0.000000e+000 |
| 5 | 3.965841e−026 | −6.232492e−031 | 0.000000e+000 |
| 8 | 9.346277e−026 | −2.137993e−030 | 0.000000e+000 |
| 10 | −7.137854e−023 | −1.911788e−025 | 0.000000e+000 |
| 12 | −2.470578e−022 | 3.056952e−026 | 0.000000e+000 |
| 15 | 3.589421e−023 | −4.096568e−027 | 0.000000e+000 |
| 16 | −4.768922e−023 | 1.934145e−027 | 0.000000e+000 |
| 18 | −5.194783e−022 | 1.217812e−025 | 0.000000e+000 |
| 21 | −1.088463e−019 | 3.144081e−023 | 0.000000e+000 |
| 22 | −9.170412e−020 | 2.592177e−023 | 0.000000e+000 |

TABLE 7

EXAMPLE 7

| i | ri | di | ni | Obj-distance = 50.000 |
|---|---|---|---|---|
| 1 | 586.085 | 16.642 | 1.56000 | M1 |
| 2 | −710.026 | 244.154 | | M2 |
| 3 | −293.735 | −213.130 | −1.0 | FL1 |
| 4 | 634.175 | 224.502 | | $\beta = 1/5$ |
| 5 | 692.102 | 18.310 | 1.56000 | L = 1199 mm |
| 6 | −893.803 | 0.100 | | NA = 0.6 |
| 7 | 223.331 | 68.784 | 1.56000 | |
| 8 | 726.029 | 73.396 | | |
| 9 | 244.650 | 29.831 | 1.56000 | |
| 10 | 754.199 | 319.081 | | |

TABLE 7-continued

EXAMPLE 7

| | | | |
|---|---|---|---|
| 11 | 213.429 | 15.000 | 1.56000 |
| 12 | 104.913 | 106.241 | |
| 13 | 0.0(stop) | 20.000 | |
| 14 | 712.703 | 86.305 | 1.56000 |
| 15 | −278.062 | 3.439 | |
| 16 | 182.736 | 24.810 | 1.56000 |
| 17 | −564.680 | 0.782 | |
| 18 | 157.087 | 23.136 | 1.56000 |
| 19 | 1255.657 | 1.227 | |
| 20 | 87.955 | 50.999 | 1.56000 |
| 21 | 123.472 | | | aspherical surfaces

| i | K | A | B | C | D |
|---|---|---|---|---|---|
| 2 | 0.000000e+000 | 3.201613e−008 | 3.554666e−013 | −3.442541e−016 | 8.565884e−020 |
| 3 | −1.672235e+000 | 2.280202e−008 | −7.033732e−013 | 3.718998e−017 | −2.862300e−021 |
| 4 | −1.049283e+000 | 1.235688e−008 | −1.490507e−012 | 7.744144e−016 | −3.612880e−019 |
| 6 | 0.000000e+000 | 2.918278e−008 | 4.292516e−015 | 6.272355e−018 | −7.663849e−022 |
| 9 | 0.000000e+000 | 1.320709e−008 | −8.609941e−013 | 1.501924e−017 | −1.136497e−021 |
| 12 | 0.000000e+000 | 1.980383e−007 | 2.532422e−011 | 3.138382e−015 | 4.147537e−019 |
| 15 | 0.000000e+000 | −1.871714e−008 | −6.639558e−012 | 2.887450e−016 | −2.996064e−020 |
| 16 | 0.000000e+000 | −3.265199e−008 | −6.424945e−012 | −9.334562e−016 | 5.226456e−020 |
| 18 | 0.000000e+000 | −2.362902e−008 | −2.527146e−012 | 1.656380e−015 | 2.693269e−020 |
| 21 | 0.000000e+000 | 2.563403e−008 | −6.361181e−011 | −1.336716e−015 | 7.803202e−018 |

| i | E | F | G |
|---|---|---|---|
| 2 | −1.071073e−023 | 5.207120e−028 | 0.000000e+000 |
| 3 | 1.492277e−025 | −2.707991e−030 | 0.000000e+000 |
| 4 | 9.419452e−023 | −9.922151e−027 | 0.000000e+000 |
| 6 | 4.479081e−026 | −7.629337e−031 | 0.000000e+000 |
| 9 | 4.453112e−026 | −1.452102e−030 | 0.000000e+000 |
| 12 | 2.365835e−023 | 1.782122e−026 | 0.000000e+000 |
| 15 | 2.959532e−024 | −6.298400e−029 | 0.000000e+000 |
| 16 | 3.674846e−026 | 1.155101e−028 | 0.000000e+000 |
| 18 | −6.493817e−024 | −4.440784e−028 | 0.000000e+000 |
| 21 | 3.786297e−022 | −7.589609e−025 | 0.000000e+000 |

TABLE 8

EXAMPLE 8

| i | ri | di | ni | Obj-distance = 50.000 |
|---|---|---|---|---|
| 1 | 283.541 | 20.452 | 1.56000 | M1 |
| 2 | −1053.836 | 121.738 | | M2 |
| 3 | 387.920 | 5.000 | 1.56000 | FL1 |
| 4 | 229.873 | 124.483 | | β = 1/5 |
| 5 | −291.995 | −124.483 | −1.0 | L = 1198 mm |
| 6 | 229.873 | −5.000 | −1.56 | NA = 0.6 |
| 7 | 387.920 | −91.603 | −1.0 | |
| 8 | 881.192 | 91.603 | | |
| 9 | 387.920 | 5.000 | 1.56000 | |
| 10 | 229.873 | 134.534 | | |
| 11 | 1316.372 | 24.857 | 1.56000 | |
| 12 | −643.793 | 0.100 | | |
| 13 | 290.336 | 45.391 | 1.56000 | |
| 14 | −3338.651 | 27.518 | | |
| 15 | 268.455 | 38.225 | 1.56000 | |
| 16 | 708.139 | 372.871 | | |
| 17 | 145.801 | 15.000 | 1.56000 | |
| 18 | 87.306 | 105.457 | | |
| 19 | 0.0(stop) | 20.000 | | |
| 20 | 794.943 | 80.807 | 1.56000 | |
| 21 | −245.392 | 1.206 | | |
| 22 | 219.487 | 25.203 | 1.56000 | |
| 23 | −440.290 | 0.297 | | |
| 24 | 156.783 | 20.641 | 1.56000 | |
| 25 | 3004.077 | 0.391 | | |
| 26 | 91.029 | 52.047 | 1.56000 | |
| 27 | 147.896 | | | |

TABLE 8-continued

EXAMPLE 8 aspherical surfaces

| i | K | A | B | C | D |
|---|---|---|---|---|---|
| 2 | 0.000000e+000 | 1.670163e−008 | −7.564550e−013 | 7.640310e−017 | −8.895236e−021 |
| 4 | 0.000000e+000 | −2.210204e−008 | 3.615438e−012 | −2.715457e−016 | 1.987678e−020 |
| 5 | −1.612890e+000 | 2.100848e−008 | 2.048446e−013 | −9.687279e−017 | 9.141985e−021 |
| 6 | 0.000000e+000 | −2.210204e−008 | 3.615438e−012 | −2.715457e−016 | 1.987678e−020 |
| 8 | 2.782076e+000 | 1.108410e−008 | 8.595356e−013 | −4.263225e−017 | −8.502443e−020 |
| 10 | 0.000000e+000 | −2.210204e−008 | 3.615438e−012 | −2.715457e−016 | 1.987678e−020 |
| 12 | 0.000000e+000 | 4.440282e−009 | −3.621140e−013 | 2.360928e−018 | 9.305637e−023 |
| 15 | 0.000000e+000 | −1.135774e−008 | −4.288698e−013 | 6.421899e−018 | −2.225858e−022 |
| 18 | 0.000000e+000 | 1.483922e−007 | 1.741862e−011 | 2.795320e−015 | 3.491280e−019 |
| 21 | 0.000000e+000 | 1.354475e−008 | −3.828203e−012 | −1.671056e−016 | 3.582427e−020 |
| 22 | 0.000000e+000 | −1.099866e−008 | −2.113914e−012 | −4.900979e−016 | 4.480872e−020 |
| 24 | 0.000000e+000 | −2.754027e−008 | −3.324771e−012 | 1.073083e−016 | 5.780353e−020 |
| 27 | 0.000000e+000 | −2.478578e−008 | 1.119494e−011 | −4.674713e−014 | 1.755113e−017 |

| i | E | F | G |
|---|---|---|---|
| 2 | 1.090188e−024 | −5.939842e−029 | 0.000000e+000 |
| 4 | −1.063676e−024 | 2.691088e−030 | 0.000000e+000 |
| 5 | −5.265028e−025 | 1.391005e−029 | 0.000000e+000 |
| 6 | −1.063676e−024 | 2.691088e−030 | 0.000000e+000 |
| 8 | 2.574157e−023 | −2.657189e−027 | 0.000000e+000 |
| 10 | −1.063676e−024 | 2.691088e−030 | 0.000000e+000 |
| 12 | −7.574790e−027 | 1.413732e−031 | 0.000000e+000 |
| 15 | 2.852148e−028 | 7.381569e−032 | 0.000000e+000 |
| 18 | 8.679435e−024 | 1.093535e−026 | 0.000000e+000 |
| 21 | −2.719953e−024 | 1.131354e−028 | 0.000000e+000 |
| 22 | 2.024346e−025 | −8.888050e−029 | 0.000000e+000 |
| 24 | −1.099840e−023 | 2.651758e−028 | 0.000000e+000 |
| 27 | −5.370134e−021 | 8.559204e−025 | 0.000000e+000 |

TABLE 9

EXAMPLE 9

| i | ri | di | ni | Obj-distance = 51.000 |
|---|---|---|---|---|
| 1 | −1815.127 | 22.814 | 1.56000 | LP1 |
| 2 | −265.701 | 23.300 | | LN1 |
| 3 | 1292.112 | 34.549 | 1.56000 | M1 |
| 4 | −329.343 | 239.736 | | LN1 |
| 5 | −126.569 | 15.000 | 1.56000 | LP1 |
| 6 | 1807.475 | 23.600 | | M2 |
| 7 | −187.707 | −23.600 | −1.0 | LP1 |
| 8 | 1807.475 | −15.000 | −1.56 | FL1 |
| 9 | −126.569 | −239.736 | −1.0 | β = 1/5 |
| 10 | −329.343 | −34.549 | −1.56 | L = 1166 mm |
| 11 | 1292.112 | −3.300 | −1.0 | NA = 0.6 |
| 12 | −816.892 | 3.300 | | |
| 13 | 1292.112 | 34.549 | 1.55000 | |
| 14 | −329.343 | 292.223 | | |
| 15 | 2351.512 | 15.834 | 1.56000 | |
| 16 | −927.736 | 0.100 | | |
| 17 | 304.902 | 27.947 | 1.56000 | |
| 18 | 1478.904 | 10.000 | | |
| 19 | 218.515 | 27.908 | 1.58000 | |
| 20 | 527.237 | 169.549 | | |
| 21 | 278.804 | 10.000 | 1.56000 | |
| 22 | 96.885 | 178.224 | | |
| 23 | −147.170 | 10.000 | 1.56000 | |
| 24 | 2898.421 | 31.011 | | |
| 25 | 415.702 | 30.726 | 1.56000 | |
| 26 | −182.240 | 9.109 | | |
| 27 | 0.0(stop) | 45.578 | | |
| 28 | 190.492 | 37.309 | 1.56000 | |
| 29 | −267.624 | 7.977 | | |
| 30 | 95.129 | 41.064 | 1.56000 | |
| 31 | 116.210 | 15.986 | | |
| 32 | 91.034 | 43.273 | 1.56000 | |
| 33 | −411.423 | | | |

TABLE 9-continued

EXAMPLE 9 aspherical surfaces

| i | K | A | B | C | D |
|---|---|---|---|---|---|
| 2 | 0.000000e+000 | 5.530494e−008 | 1.163655e−012 | −6.282393e−017 | −2.629751e−021 |
| 4 | 0.000000e+000 | −1.892175e−008 | 4.266967e−013 | 1.121436e−017 | −3.030043e−021 |
| 5 | 0.000000e+000 | 1.663615e−007 | 9.890835e−012 | −1.309392e−015 | 6.427099e−019 |
| 7 | 9.165216e−004 | 2.675984e−008 | 1.316128e−012 | 2.694592e−017 | −3.337487e−020 |
| 9 | 0.000000e+000 | 1.663615e−007 | 9.890835e−012 | −1.309392e−015 | 6.427099e−019 |
| 10 | 0.000000e+000 | −1.892175e−008 | 4.266967e−013 | 1.121436e−017 | −3.030043e−021 |
| 12 | 5.000000e+000 | −9.389111e−009 | 1.539504e−013 | 9.799722e−018 | −2.247802e−021 |
| 14 | 0.000000e+000 | −1.892175e−008 | 4.266967e−013 | 1.121436e−017 | −3.030043e−021 |
| 16 | 0.000000e+000 | 1.255592e−008 | −3.238808e−013 | 5.818116e−017 | −7.054083e−021 |
| 17 | 0.000000e+000 | 4.718829e−009 | −5.145083e−013 | 7.657683e−017 | −9.189123e−021 |
| 22 | 0.000000e+000 | −1.928999e−007 | −1.154247e−011 | 4.702416e−017 | −5.121045e−020 |
| 23 | 0.000000e+000 | −3.035320e−007 | −1.933933e−011 | −2.138991e−015 | −4.900557e−019 |
| 26 | 0.000000e+000 | 2.223625e−008 | 5.913986e−012 | −1.487766e−018 | 4.859942e−020 |
| 28 | 0.000000e+000 | 1.714079e−008 | 1.881607e−012 | −6.712043e−018 | 5.005422e−020 |
| 31 | 0.000000e+000 | −1.372556e−008 | 7.658069e−011 | −5.828110e−015 | 1.273953e−018 |
| 32 | 0.000000e+000 | −5.643649e−007 | 1.451319e−011 | −6.462196e−016 | −8.490119e−019 |

| i | E | F | G |
|---|---|---|---|
| 2 | 6.200738e−025 | −2.301378e−029 | 0.000000e+000 |
| 4 | 1.639180e−025 | −3.981772e−030 | 0.000000e+000 |
| 5 | −2.796760e−022 | 4.335286e−026 | 0.000000e+000 |
| 7 | −4.892624e−024 | 1.494940e−027 | 0.000000e+000 |
| 9 | −2.796760e−022 | 4.335286e−026 | 0.000000e+000 |
| 10 | 1.639180e−025 | −3.981772e−030 | 0.000000e+000 |
| 12 | 1.259049e−025 | −3.392339e−030 | 0.000000e+000 |
| 14 | 1.639180e−025 | −3.981772e−030 | 0.000000e+000 |
| 16 | 4.425044e−025 | −1.068897e−029 | 0.000000e+000 |
| 17 | 5.661917e−025 | −1.358877e−029 | 0.000000e+000 |
| 22 | 6.968981e−024 | −1.633272e−027 | 0.000000e+000 |
| 23 | 6.415923e−023 | −3.092374e−026 | 0.000000e+000 |
| 26 | −3.316785e−024 | 1.932364e−028 | 0.000000e+000 |
| 28 | −2.320660e−024 | 6.485526e−029 | 0.000000e+000 |
| 31 | −4.331702e−023 | 6.899488e−027 | 0.000000e+000 |
| 32 | 2.192732e−022 | −3.846738e−026 | 0.000000e+000 |

TABLE 10

EXAMPLE 10

| i | ri | di | ni | Obj-distance = 50.835 |
|---|---|---|---|---|
| 1 | 146.528 | 21.763 | 1.56000 | LP1 |
| 2 | 279.100 | 29.521 | | LN1 |
| 3 | −775.358 | 24.514 | 1.56000 | M1 |
| 4 | −290.509 | 319.654 | | LN1 |
| 5 | −127.746 | 15.000 | 1.56000 | LP1 |
| 6 | 901.597 | 15.068 | | M2 |
| 7 | −165.915 | −15.068 | −1.0 | LP1 |
| 8 | 901.697 | −15.000 | −1.56 | FL1 |
| 9 | −127.746 | −319.054 | −1.0 | β = 1/5 |
| 10 | −290.509 | −24.514 | −1.56 | L = 1160 mm |
| 11 | −775.368 | −2.093 | −1.0 | NA = 0.6 |
| 12 | −1091.384 | 2.093 | | |
| 13 | −775.358 | 24.514 | 1.56000 | |
| 14 | −290.509 | 366.602 | | |
| 15 | −729.668 | 23.975 | 1.56000 | |
| 16 | −353.616 | 16.059 | | |
| 17 | 278.912 | 36.728 | 1.56000 | |
| 18 | 1301.137 | 10.000 | | |
| 19 | 230.845 | 40.089 | 1.56000 | |
| 20 | 858.078 | 145.157 | | |
| 21 | −1139.792 | 10.000 | 1.56000 | |
| 22 | 209.297 | 153.635 | | |
| 23 | 141.077 | 10.000 | 1.56000 | |
| 24 | 77.386 | 30.123 | | |
| 25 | 291.198 | 29.071 | 1.56000 | |
| 26 | −210.751 | 4.057 | | |
| 27 | 0.0(stop) | 21.331 | | |
| 28 | 204.073 | 51.876 | 1.56000 | |

TABLE 10-continued

EXAMPLE 10

| | | | | |
|---|---|---|---|---|
| 29 | −109.376 | 0.559 | | |
| 30 | 220.520 | 23.237 | 1.56000 | |
| 31 | 552.592 | 4.737 | | |
| 32 | 63.753 | 26.644 | 1.56000 | |
| 33 | −13602.898 | | | | aspherical surfaces

| i | K | A | B | C | D |
|---|---|---|---|---|---|
| 2 | 0.000000e+000 | 8.655896e−008 | −1.231783e−012 | 1.505671e−016 | −1.994862e−020 |
| 4 | 0.000000e+000 | −2.107372e−008 | 5.599304e−013 | −3.486775e−017 | 4.285967e−021 |
| 5 | 0.000000e+000 | 1.483901e−007 | −9.642930e−012 | −1.428407e−016 | −3.220462e−019 |
| 7 | −1.883904e−001 | 3.492160e−008 | 2.674541e−013 | −1.521679e−017 | −4.134260e−020 |
| 9 | 0.000000e+000 | 1.481901e−007 | −9.642930e−012 | −1.428407e−016 | −3.220462e−019 |
| 10 | 0.000000e+000 | −2.107372e−008 | 5.599304e−013 | −3.486775e−017 | 4.285967e−021 |
| 12 | −3.641713e+000 | −1.337813e−008 | 6.093453e−013 | −2.932265e−017 | 3.056970e−021 |
| 14 | 0.000000e+000 | −2.107372e−008 | 5.593304e−013 | −3.486775e−017 | 4.285967e−021 |
| 16 | 0.000000e+000 | −1.271307e−008 | 1.326186e−012 | −6.548673e−017 | 2.762947e−021 |
| 19 | 0.000000e+000 | −2.542101e−008 | 1.512560e−012 | −8.198475e−017 | 3.416616e−021 |
| 22 | 0.000000e+000 | −1.103975e−007 | 6.579457e−012 | −1.251416e−016 | −1.137648e−020 |
| 23 | 0.000000e+000 | −6.584060e−007 | −9.731531e−011 | −4.923089e−015 | −1.676955e−018 |
| 26 | 0.000000e+000 | −2.178389e−007 | −1.364187e−011 | 1.018419e−014 | −1.147459e−018 |
| 28 | 0.000000e+000 | −1.274240e−007 | −1.607152e−011 | 8.050135e−015 | −1.032749e−018 |
| 31 | 0.000000e+000 | 6.891976e−008 | 3.356366e−012 | 3.785313e−016 | 3.015742e−018 |
| 32 | 0.000000e+000 | −1.469212e−007 | −7.704012e−012 | −3.664705e−015 | 3.444260e−018 |

| i | E | F | G |
|---|---|---|---|
| 2 | 2.274640e−024 | −9.987248e−029 | 0.000000e+000 |
| 4 | −2.059611e−025 | 2.643547e−031 | 0.000000e+000 |
| 5 | 6.834179e−023 | −3.369361e−027 | 0.000000e+000 |
| 7 | 4.884293e−024 | −2.923001e−028 | 0.000000e+000 |
| 9 | 6.834179e−023 | −3.369361e−027 | 0.000000e+000 |
| 10 | −2.059611e−025 | 2.643547e−031 | 0.000000e+000 |
| 12 | −1.866907e−025 | 2.516890e−030 | 0.000000e+000 |
| 14 | −2.059611e−025 | 2.843547e−031 | 0.000000e+000 |
| 16 | −7.218715e−026 | 8.926086e−031 | 0.000000e+000 |
| 19 | −9.166937e−026 | 1.136094e−030 | 0.000000e+000 |
| 22 | 3.478710e−024 | −1.372775e−028 | 0.000000e+000 |
| 23 | 1.557766e−021 | −4.766741e−025 | 0.000000e+000 |
| 26 | 1.658131e−022 | 9.278465e−027 | 0.000000e+000 |
| 28 | 9.644428e−023 | −4.735347e−027 | 0.000000e+000 |
| 31 | −7.985615e−022 | 1.332556e−025 | 0.000000e+000 |
| 32 | −5.454904e−022 | −8.938622e−026 | 0.000000e+000 |

TABLE 11

EXAMPLE 11

| i | ri | di | ni | Obj-distance = 50.962 |
|---|---|---|---|---|
| 1 | 549.485 | 18.225 | 1.56000 | LN1 |
| 2 | −348.358 | 404.377 | | M1 |
| 3 | −117.591 | 16.000 | 1.56000 | LN1 |
| 4 | −11246.509 | 21.694 | | LP1 |
| 5 | −181.192 | −21.694 | −1.0 | M2 |
| 6 | −11246.509 | −15.000 | −1.56 | LP1 |
| 7 | −117.591 | −352.697 | −1.0 | FL1 |
| 8 | −2026.523 | −18.862 | −1.56 | β = 1/4 |
| 9 | 461.050 | −4.621 | −1.0 | L = 1430 mm |
| 10 | −376.405 | 4.621 | | NA = 0.6 |
| 11 | 461.050 | 18.862 | 1.56000 | |
| 12 | −2026.523 | 398.890 | | |
| 13 | 1172.423 | 42.790 | 1.56000 | |
| 14 | −501.353 | 0.404 | | |
| 15 | 315.855 | 47.177 | 1.56000 | |
| 16 | 1252.990 | 3.907 | | |
| 17 | 200.947 | 27.200 | 1.56000 | |
| 18 | 240.640 | 296.917 | | |
| 19 | −192.453 | 10.000 | 1.56000 | |
| 20 | 602.106 | 179.501 | | |
| 21 | −186.356 | 10.000 | 1.56000 | |
| 22 | 438.885 | 32.245 | | |

TABLE 11-continued

EXAMPLE 11

| i | ri | di | ni |
|---|---|---|---|
| 23 | 541.516 | 30.056 | 1.56000 |
| 24 | −149.805 | 6.704 | |
| 25 | 0.0(stop) | 45.181 | |
| 26 | 179.275 | 33.860 | 1.56000 |
| 27 | −370.567 | 9.275 | |
| 28 | 94.992 | 43.811 | 1.56000 |
| 29 | 81.799 | 18.120 | |
| 30 | 58.314 | 41.095 | 1.56000 |
| 31 | −681.697 | | | aspherical surfaces

| i | K | A | B | C | D |
|---|---|---|---|---|---|
| 1 | 0.000000e+000 | 4.575380e−008 | 7.817822e−013 | −5.883907e−016 | 1.371733e−019 |
| 3 | 0.000000e+000 | 1.832675e−008 | −2.154592e−013 | −1.520651e−016 | −8.218511e−021 |
| 5 | 8.415167e−001 | 1.155130e−008 | 1.103292e−013 | −1.409211e−017 | −1.720226e−021 |
| 7 | 0.000000e+000 | 1.832675e−008 | −2.154592e−013 | −1.520651e−018 | −8.218511e−021 |
| 8 | 0.000000e+000 | 2.539857e−009 | 6.897518e−013 | −2.706670e−016 | 2.977375e−020 |
| 10 | 6.525900e−001 | −3.453255e−010 | 6.892838e−013 | −1.705759e−016 | 1.444644e−020 |
| 12 | 0.000000e+000 | 2.539857e−009 | 6.897518e−013 | −2.708870e−016 | 2.977375e−020 |
| 14 | 0.000000e+000 | −2.178001e−009 | 4.103517e−013 | −1.817801e−017 | 5.715837e−022 |
| 15 | 0.000000e+000 | 4.463480e−009 | 3.163776e−014 | 7.085203e−019 | 0.000000e+000 |
| 17 | 0.000000e+000 | −1.282492e−008 | 3.641378e−013 | −2.566752e−017 | 6.095086e−022 |
| 20 | 0.000000e+000 | 2.891714e−008 | 3.794681e−012 | 1.766293e−016 | −1.533138e−020 |
| 21 | 0.000000e+000 | −2.046926e−007 | 8.688717e−012 | 4.769864e−016 | −8.554569e−020 |
| 24 | 0.000000e+000 | 1.946135e−008 | 5.791056e−012 | −3.912959e−016 | 4.417233e−020 |
| 26 | 0.000000e+000 | 2.141413e−009 | −8.073433e−013 | −6.990201e−016 | 6.444734e−020 |
| 29 | 0.000000e+000 | −2.143697e−008 | 3.327692e−011 | −5.094587e−015 | 1.783172e−018 |
| 30 | 0.000000e+000 | −2.020052e−007 | −8.522637e−012 | −7.090867e−015 | 1.840499e−018 |

| i | E | F | G |
|---|---|---|---|
| 1 | −1.760415e−023 | 8.840230e−028 | 0.000000e+000 |
| 3 | 6.179683e−025 | 8.769913e−028 | 0.000000e+000 |
| 5 | −5.814168e−026 | 4.284447e−029 | 0.000000e+000 |
| 7 | 6.179683e−025 | 8.769913e−028 | 0.000000e+000 |
| 8 | −1.502713e−024 | 2.475219e−029 | 0.000000e+000 |
| 10 | −1.403417e−025 | −3.422820e−029 | 0.000000e+000 |
| 12 | −1.502713e−024 | 2.475219e−029 | 0.000000e+000 |
| 14 | −1.027112e−026 | 8.042716e−032 | 0.000000e+000 |
| 15 | 3.066558e−028 | 0.000000e+000 | 0.000000e+000 |
| 17 | −8.993226e−027 | −1.018383e−031 | 0.000000e+000 |
| 20 | 6.283744e−024 | −5.389611e−028 | 0.000000e+000 |
| 21 | 5.836557e−024 | −1.386454e−027 | 0.000000e+000 |
| 24 | −3.359010e−024 | 9.801933e−029 | 0.000000e+000 |
| 26 | −3.453019e−024 | 7.077619e−029 | 0.000000e+000 |
| 29 | −4.057529e−022 | 2.496099e−026 | 0.000000e+000 |
| 30 | −1.434596e−021 | −8.941485e−027 | 0.000000e+000 |

TABLE 12

EXAMPLE 12

| i | ri | di | ni | Obj-distance = 63.346 |
|---|---|---|---|---|
| 1 | 973.794 | 19.006 | 1.56000 | LN1 |
| 2 | −274.730 | 408.564 | | M1 |
| 3 | −117.937 | 15.000 | 1.56000 | LN1 |
| 4 | −21944.448 | 22.129 | | LP1 |
| 5 | −183.531 | −22.129 | −1.0 | M2 |
| 6 | −21944.448 | −15.000 | −1.56 | LP1 |
| 7 | −117.937 | −391.508 | −1.0 | FL1 |
| 8 | −2342.325 | −16.507 | −1.56 | β = 1/4 |
| 9 | 447.067 | −0.506 | −1.0 | L = 1430 mm |
| 10 | −376.377 | 0.506 | | NA = 0.6 |
| 11 | 447.067 | 16.507 | 1.56000 | |
| 12 | −2342.325 | 373.416 | | |
| 13 | 1097.080 | 47.121 | 1.56000 | |
| 14 | −515.510 | 27.362 | | |
| 15 | 280.430 | 47.913 | 1.56000 | |
| 16 | 718.618 | 7.108 | | |
| 17 | 198.349 | 27.611 | 1.56000 | |
| 18 | 249.428 | 300.922 | | |

TABLE 12-continued

EXAMPLE 12

| i | ri | di | ni |
|---|---|---|---|
| 19 | −216.473 | 10.000 | 1.56000 |
| 20 | 445.322 | 181.217 | |
| 21 | −171.590 | 10.000 | 1.56000 |
| 22 | 666.307 | 32.257 | |
| 23 | 625.617 | 30.422 | 1.56000 |
| 24 | −151.533 | 8.609 | |
| 25 | 0.0(stop) | 47.280 | |
| 26 | 180.626 | 36.149 | 1.56000 |
| 27 | −335.594 | 9.318 | |
| 28 | 100.005 | 44.237 | 1.56000 |
| 29 | 88.936 | 17.909 | |
| 30 | 70.805 | 41.541 | 1.56000 |
| 31 | −1049.267 | | | aspherical surfaces

| i | K | A | B | C | D |
|---|---|---|---|---|---|
| 1 | 0.000000e+000 | 4.255133e−008 | 1.395979e−013 | −1.009633e−016 | 4.472929e−021 |
| 3 | 0.000000e+000 | 1.715982e−008 | 1.867849e−013 | 1.918570e−017 | −5.826782e−020 |
| 5 | 8.550872e−001 | 1.081079e−008 | 1.551602e−013 | 7.022939e−018 | −6.098034e−021 |
| 7 | 0.000000e+000 | 1.715982e−008 | 1.867849e−013 | 1.918570e−017 | −5.826782e−020 |
| 8 | 0.000000e+000 | 3.098651e−009 | 2.787833e−013 | −1.677261e−016 | 1.684901e−020 |
| 10 | 9.872928e−001 | 1.142429e−009 | 4.039291e−013 | −8.905924e−017 | 4.728326e−021 |
| 12 | 0.000000e+000 | 3.098651e−009 | 2.787833e−013 | −1.677261e−016 | 1.684901e−020 |
| 14 | 0.000000e+000 | −8.058628e−009 | 5.469068e−013 | −1.863316e−017 | 4.646973e−022 |
| 15 | 0.000000e+000 | 8.819915e−010 | 1.397684e−013 | −9.400188e−019 | 0.000000e+000 |
| 17 | 0.000000e+000 | −1.822365e−008 | 3.451273e−013 | −2.486759e−017 | 4.418373e−022 |
| 20 | 0.000000e+000 | 3.055326e−008 | 4.873760e−012 | 2.383916e−016 | −6.806035e−021 |
| 21 | 0.000000e+000 | −1.728562e−007 | 1.235438e−011 | 8.006503e−016 | −6.090344e−020 |
| 24 | 0.000000e+000 | 3.819315e−008 | 6.635548e−012 | −2.544128e−016 | 3.425391e−020 |
| 26 | 0.000000e+000 | 5.160883e−009 | −9.687870e−013 | −5.829555e−016 | 5.807106e−020 |
| 29 | 0.000000e+000 | −8.273895e−009 | 2.604783e−011 | −4.590743e−015 | 2.375151e−018 |
| 30 | 0.000000e+000 | −1.430127e−007 | −8.553894e−012 | −7.235770e−015 | 4.163768e−018 |

| i | E | F | G |
|---|---|---|---|
| 1 | 1.933908e−024 | −3.573554e−028 | 0.000000e+000 |
| 3 | 9.440074e−024 | 1.973849e−028 | 0.000000e+000 |
| 5 | 4.929424e−025 | 1.438389e−029 | 0.000000e+000 |
| 7 | 9.440074e−024 | 1.973849e−028 | 0.000000e+000 |
| 8 | −7.086691e−025 | 6.530829e−030 | 0.000000e+000 |
| 10 | 2.776075e−025 | −3.188109e−029 | 0.000000e+000 |
| 12 | −7.086691e−025 | 6.530829e−030 | 0.000000e+000 |
| 14 | −6.797904e−027 | 4.401325e−032 | 0.000000e+000 |
| 15 | 1.176176e−027 | 0.000000e+000 | 0.000000e+000 |
| 17 | −5.160404e−027 | −1.986704e−031 | 0.000000e+000 |
| 20 | 7.977247e−024 | −8.335599e−028 | 0.000000e+000 |
| 21 | −4.004980e−024 | −5.894950e−028 | 0.000000e+000 |
| 24 | −2.492308e−024 | 4.150762e−029 | 0.000000e+000 |
| 26 | −3.458190e−024 | 9.835304e−029 | 0.000000e+000 |
| 29 | −7.369796e−022 | 6.477749e−026 | 0.000000e+000 |
| 30 | −2.463212e−021 | 2.053279e−025 | 0.000000e+000 |

TABLE 13

EXAMPLE 13

| i | ri | di | ni | Obj-distance = 385.595 |
|---|---|---|---|---|
| 1 | −459.459 | −335.573 | −1.0 | M1 |
| 2 | 3067.293 | 748.381 | | M2 |
| 3 | −739.933 | −391.713 | −1.0 | FM1 |
| 4 | −573.829 | 392.713 | | FM2 |
| 5 | 0.0(stop) | 60.000 | | β = 1/5 |
| 6 | −130.197 | 54.213 | 1.56000 | L = 1100 mm |
| 7 | −119.178 | 0.100 | | NA = 0.6 |
| 8 | 117.405 | 51.990 | 1.56000 | |
| 9 | 519.563 | 6.291 | | |
| 10 | 78.099 | 41.649 | 1.56000 | |
| 11 | 1057.227 | 0.100 | | |
| 12 | 1050.175 | 15.000 | 1.56000 | |
| 13 | 87.469 | 11.904 | | |
| 14 | 326.920 | 29.310 | 1.56000 | |
| 15 | −1292068.739 | | | |

TABLE 13-continued

EXAMPLE 13 aspherical surfaces

| i | K | A | B | C | D |
|---|---|---|---|---|---|
| 1 | 2.151232e+000 | 2.074850e−008 | 1.028497e−012 | 1.000198e−016 | −1.543777e−020 |
| 2 | 1.565028e+000 | −1.030439e−008 | −8.656324e−014 | 1.017720e−017 | −3.830427e−021 |
| 3 | −1.579007e−001 | −1.873321e−010 | −2.793967e−016 | −3.564540e−021 | 7.688159e−026 |
| 4 | −1.552277e+000 | −9.150769e−009 | −8.581363e−014 | −1.464695e−017 | 2.978012e−021 |
| 7 | 0.000000e+000 | −1.113320e−008 | 6.313114e−012 | −4.925043e−016 | 6.437342e−020 |
| 8 | 0.000000e+000 | 5.404994e−009 | −2.805582e−012 | 1.463407e−016 | −4.789462e−020 |
| 10 | 0.000000e+000 | −1.606239e−007 | 1.691804e−012 | −2.762745e−015 | 1.781576e−019 |
| 13 | 0.000000e+000 | 2.498212e−007 | 1.350239e−011 | 2.359108e−014 | 5.612084e−019 |
| 14 | 0.000000e+000 | 4.979099e−007 | −1.344689e−010 | 4.588479e−014 | −2.537504e−017 |

| i | E | F | G |
|---|---|---|---|
| 1 | 3.311515e−024 | −2.995664e−028 | 0.000000e+000 |
| 2 | 5.161873e−025 | −2.729459e−029 | 0.000000e+000 |
| 3 | −1.127394e−030 | 7.746168e−036 | 0.000000e+000 |
| 4 | −3.412103e−025 | 1.755156e−029 | 0.000000e+000 |
| 7 | −4.171136e−024 | 1.891343e−028 | 0.000000e+000 |
| 8 | 4.264568e−024 | −3.356973e−028 | 0.000000e+000 |
| 10 | −4.525225e−023 | −2.846830e−028 | 0.000000e+000 |
| 13 | −2.105753e−021 | 1.040548e−024 | 0.000000e+000 |
| 14 | 7.650574e−021 | −1.459197e−024 | 0.000000e+000 |

TABLE 14

EXAMPLE 14

| i | ri | di | ni | Obj-distance = 397.959 |
|---|---|---|---|---|
| 1 | −447.799 | −347.959 | −1.0 | M1 |
| 2 | 11489.229 | 811.432 | | M2 |
| 3 | −804.784 | −422.009 | −1.0 | FM1 |
| 4 | −1121.103 | −15.000 | −1.56 | LF |
| 5 | −431.869 | −5.561 | −1.0 | FM2 |
| 6 | −1235.236 | 5.561 | | LF |
| 7 | −431.869 | 15.000 | 1.56000 | β = /5 |
| 8 | −1121.103 | 423.009 | | L = 1100 mm |
| 9 | 0.0(stop) | 56.691 | | NA = 0.6 |
| 10 | −128.913 | 19.560 | 1.56000 | |
| 11 | −108.272 | 0.309 | | |
| 12 | 124.318 | 28.713 | 1.56000 | |
| 13 | 694.622 | 0.100 | | |
| 14 | 78.512 | 42.819 | 1.56000 | |
| 15 | 219.566 | 9.184 | | |
| 16 | −741.750 | 15.000 | 1.56000 | |
| 17 | 92.545 | 14.848 | | |
| 18 | 73.579 | 20.344 | 1.56000 | |
| 19 | −2120.514 | | | | aspherical surfaces

| i | K | A | B | C | D |
|---|---|---|---|---|---|
| 1 | 1.651069e+000 | 2.374926e−008 | 1.702835e−012 | 1.390779e−017 | 2.614732e−020 |
| 2 | −4.000000e+000 | −1.043013e−008 | −1.517620e−013 | 4.986190e−018 | −2.371680e−021 |
| 3 | −7.638388e−002 | −1.823532e−010 | −2.150504e−016 | −1.108786e−021 | 1.340316e−026 |
| 6 | −3.827967e+000 | −8.674101e−009 | −1.051516e−013 | −5.752138e−018 | 6.145431e−022 |
| 11 | 0.000000e+000 | 4.892931e−008 | −5.416482e−013 | 5.381903e−016 | 1.678633e−020 |
| 12 | 0.000000e+000 | 7.048042e−008 | 2.284679e−012 | −9.626527e−016 | 3.338522e−019 |
| 14 | 0.000000e+000 | −3.924140e−008 | −8.582640e−012 | 1.843538e−015 | −3.326077e−019 |
| 17 | 0.000000e+000 | 8.970756e−007 | 3.402220e−011 | 3.720934e−014 | 1.395150e−017 |
| 18 | 0.000000e+000 | 7.110875e−007 | −5.771239e−011 | 5.210874e−014 | −9.240921e−018 |

| i | E | F | G |
|---|---|---|---|
| 1 | −7.722632e−024 | 7.560718e−028 | 0.000000e+000 |
| 2 | 2.760856e−025 | −1.354385e−029 | 0.000000e+000 |
| 3 | −1.379314e−031 | 5.943291e−037 | 0.000000e+000 |
| 6 | −5.871993e−026 | 2.213211e−030 | 0.000000e+000 |
| 11 | −6.073286e−024 | 6.405299e−028 | 0.000000e+000 |
| 12 | −4.157626e−023 | 2.508234e−027 | 0.000000e+000 |

TABLE 14-continued

EXAMPLE 14

| | | | |
|---|---|---|---|
| 14 | 2.612172e−024 | 2.192107e−027 | 0.000000e+000 |
| 17 | −5.673999e−021 | 3.032464e−024 | 0.000000e+000 |
| 18 | 6.249971e−021 | 9.050086e−031 | 0.000000e+000 |

TABLE 15

EXAMPLE 15

| i | ri | di | ni | Obj-distance = 50.000 |
|---|---|---|---|---|
| 1 | 204.213 | 15.833 | 1.56000 | LN1 |
| 2 | 3825.784 | 413.292 | | M1 |
| 3 | −106.572 | 15.000 | 1.56000 | LN1 |
| 4 | −857.552 | 17.304 | | M2 |
| 5 | −187.562 | −17.304 | −1.0 | FM1 |
| 6 | −857.552 | −15.000 | −1.56 | LF |
| 7 | −106.572 | −408.626 | −1.0 | FM2 |
| 8 | −1909.161 | 951.629 | | LF |
| 9 | −858.848 | −459.710 | −1.0 | β = 1/4 |
| 10 | −214.544 | −26.074 | −1.56 | L = 1190 mm |
| 11 | −423.622 | −4.701 | −1.0 | NA = 0.6 |
| 12 | −291.919 | 4.701 | | |
| 13 | −423.622 | 26.074 | 1.56000 | |
| 14 | −214.544 | 400.010 | | |
| 15 | 0.0(stop) | 59.759 | | |
| 16 | 424.663 | 15.005 | 1.56000 | |
| 17 | −637.707 | 0.101 | | |
| 18 | 135.307 | 20.950 | 1.56000 | |
| 19 | 482.071 | 0.101 | | |
| 20 | 86.180 | 31.425 | 1.56000 | |
| 21 | 180.516 | 9.606 | | |
| 22 | 108.812 | 15.000 | 1.56000 | |
| 23 | 55.211 | 16.293 | | |
| 24 | 82.713 | 23.334 | 1.56000 | |
| 25 | −343.416 | | | | aspherical surfaces

| i | K | A | B | C | D |
|---|---|---|---|---|---|
| 1 | 0.000000e+000 | 7.845851e−008 | 3.480979e−012 | −2.192632e−016 | 2.652275e−020 |
| 2 | 0.000000e+000 | 1.287363e−007 | 5.213100e−012 | −3.909292e−016 | −2.757054e−020 |
| 3 | 0.000000e+000 | 5.511695e−008 | 2.742398e−012 | 2.976607e−016 | −8.135784e−020 |
| 5 | 9.757356e−001 | 2.245223e−008 | 4.961650e−013 | 4.876359e−017 | −9.218124e−021 |
| 7 | 0.000000e+000 | 5.511695e−008 | 2.742398e−012 | 2.976607e−016 | −8.135784e−020 |
| 8 | −2.324211e−001 | −3.741519e−009 | −2.965745e−014 | 3.165593e−019 | −1.721869e−022 |
| 9 | −1.351560e−001 | −4.438792e−012 | 4.120307e−018 | 6.561688e−023 | 1.639361e−026 |
| 10 | 0.000000e+000 | 1.134555e−008 | −5.474633e−013 | −1.044929e−016 | 1.349222e−020 |
| 12 | 2.922694e+000 | 2.325940e−008 | −2.396438e−013 | −1.043028e−016 | 2.382476e−020 |
| 14 | 0.000000e+000 | 1.134555e−008 | −5.474633e−013 | −1.044929e−016 | 1.349222e−020 |
| 16 | 0.000000e+000 | −5.994350e−008 | −4.756412e−012 | −8.685536e−017 | −1.026534e−019 |
| 18 | 0.000000e+000 | −8.290830e−008 | −4.984870e−012 | 1.936271e−015 | 8.131779e−021 |
| 20 | 0.000000e+000 | 4.860989e−008 | 1.213638e−011 | −2.550341e−015 | 9.673512e−020 |
| 23 | 0.000000e+000 | −4.300839e−007 | −3.408055e−011 | −3.710689e−015 | −2.158579e−018 |
| 24 | 0.000000e+000 | −3.101203e−007 | −4.766363e−011 | 1.545142e−015 | 1.795645e−020 |

| i | E | F | G |
|---|---|---|---|
| 1 | −1.461145e−023 | 1.281999e−027 | 0.000000e+000 |
| 2 | 0.000000e+000 | 0.000000e+000 | 0.000000e+000 |
| 3 | 3.995845e−023 | −2.211509e−027 | 0.000000e+000 |
| 5 | 3.224225e−024 | −1.287665e−028 | 0.000000e+000 |
| 7 | 3.995845e−023 | −2.211509e−027 | 0.000000e+000 |
| 8 | 1.248827e−026 | −4.508298e−032 | 0.000000e+000 |
| 9 | −3.247603e−031 | 1.929812e−036 | 0.000000e+000 |
| 10 | −5.294016e−025 | −6.522725e−030 | 0.000000e+000 |
| 12 | −1.683354e−024 | 3.413090e−029 | 0.000000e+000 |
| 14 | −5.294016e−025 | −6.522725e−030 | 0.000000e+000 |
| 16 | 2.849939e−023 | −2.173374e−027 | 0.000000e+000 |
| 18 | −3.631059e−023 | 2.226964e−027 | 0.000000e+000 |
| 20 | −3.275165e−023 | 5.637523e−027 | 0.000000e+000 |
| 23 | −3.457497e−021 | 4.909090e−025 | 0.000000e+000 |
| 24 | −1.908395e−021 | 8.087019e−025 | 0.000000e+000 |

TABLE 16

EXAMPLE 16

| i | ri | di | ni | Obj-distance = 50.267 |
|---|---|---|---|---|
| 1 | 282.936 | 21.255 | 1.56000 | LN1 |
| 2 | 3684.211 | 449.103 | | M1 |
| 3 | −267.457 | 15.000 | 1.56000 | LN1 |
| 4 | −1371.221 | 5.446 | | M2 |
| 5 | −321.384 | −5.446 | −1.0 | FL1 |
| 6 | −1371.221 | −15.000 | −1.56 | FM1 |
| 7 | −267.457 | −338.525 | −1.0 | LF |
| 8 | −1540.132 | 368.971 | | FM2 |
| 9 | 440.699 | 35.890 | 1.56000 | LF |
| 10 | −1887.670 | 362.966 | | β = 1/5 |
| 11 | −922.802 | −332.666 | −1.0 | L = 1190 mm |
| 12 | 8422.125 | −15.000 | −1.56 | NA = 0.6 |
| 13 | −462.452 | −5.300 | −1.0 | |
| 14 | −1026.228 | 5.270 | | |
| 15 | −462.452 | 15.000 | 1.56000 | |
| 16 | 8422.125 | 268.193 | | |
| 17 | 0.0(stop) | 64.503 | | |
| 18 | 237.890 | 23.809 | 1.56000 | |
| 19 | 2990.697 | 12.038 | | |
| 20 | 135.928 | 34.579 | 1.56000 | |
| 21 | 622.051 | 3.846 | | |
| 22 | 144.391 | 38.185 | 1.56000 | |
| 23 | 205.170 | 2.454 | | |
| 24 | 114.728 | 15.000 | 1.56000 | |
| 25 | 72.687 | 9.881 | | |
| 26 | 78.971 | 64.113 | 1.56000 | |
| 27 | 2179.982 | | | | aspherical surfaces

| i | K | A | B | C | D |
|---|---|---|---|---|---|
| 1 | 0.000000e+000 | 4.950479e−008 | −1.556107e−012 | 1.719144e−017 | 2.105431e−021 |
| 3 | 0.000000e+000 | −5.113917e−009 | −2.873876e−012 | 2.602766e−017 | 6.788996e−020 |
| 5 | 7.999895e−001 | −1.716298e−009 | −1.163867e−012 | 2.214635e−018 | 2.170496e−020 |
| 7 | 0.000000e+000 | −5.113917e−009 | −2.873876e−012 | 2.602766e−017 | 6.788996e−020 |
| 8 | 5.000000e+000 | 3.994191e−009 | −6.866541e−014 | −1.799842e−018 | −3.213142e−023 |
| 9 | 0.000000e+000 | −4.745677e−009 | 9.727308e−015 | −1.323010e−019 | 1.552321e−024 |
| 11 | −3.742879e−001 | −9.987061e−011 | −8.267759e−016 | 2.319422e−020 | −3.735582e−026 |
| 12 | 0.000000e+000 | 1.256240e−008 | 2.224328e−012 | −1.743188e−015 | 1.674418e−019 |
| 14 | 3.922730e−001 | −2.955486e−008 | −3.015675e−013 | −1.303534e−015 | 8.709164e−020 |
| 16 | 0.000000e+000 | 1.256240e−008 | 2.224328e−012 | −1.743188e−015 | 1.674418e−019 |
| 20 | 0.000000e+000 | −4.228533e−008 | −1.756337e−012 | −1.341137e−016 | −8.216530e−021 |
| 22 | 0.000000e+000 | 1.397442e−008 | −6.652675e−013 | 1.180182e−016 | 1.951605e−020 |
| 25 | 0.000000e+000 | 4.243718e−008 | 1.008140e−011 | −5.060486e−016 | −5.298502e−020 |
| 26 | 0.000000e+000 | −1.152710e−007 | 4.633120e−012 | −7.184290e−016 | −1.928268e−019 |

| i | E | F | G |
|---|---|---|---|
| 1 | 0.000000e+000 | 0.000000e+000 | 0.000000e+000 |
| 3 | 0.000000e+000 | 0.000000e+000 | 0.000000e+000 |
| 5 | 0.000000e+000 | 0.000000e+000 | 0.000000e+000 |
| 7 | 0.000000e+000 | 0.000000e+000 | 0.000000e+000 |
| 8 | 0.000000e+000 | 0.000000e+000 | 0.000000e+000 |
| 9 | 0.000000e+000 | 0.000000e+000 | 0.000000e+000 |
| 11 | 0.000000e+000 | 0.000000e+000 | 0.000000e+000 |
| 12 | 0.000000e+000 | 0.000000e+000 | 0.000000e+000 |
| 14 | 0.000000e+000 | 0.000000e+000 | 0.000000e+000 |
| 16 | 0.000000e+000 | 0.000000e+000 | 0.000000e+000 |
| 20 | 0.000000e+000 | 0.000000e+000 | 0.000000e+000 |
| 22 | 0.000000e+000 | 0.000000e+000 | 0.000000e+000 |
| 25 | 0.000000e+000 | 0.000000e+000 | 0.000000e+000 |
| 26 | 0.000000e+000 | 0.000000e+000 | 0.000000e+000 |

TABLE 17

EXAMPLE 17

| i | ri | di | ni | Obj-distance = 64.302 |
|---|---|---|---|---|
| 1 | 145.868 | 15.654 | 1.56000 | LN1 |
| 2 | 277.033 | 421.902 | | M1 |

TABLE 17-continued

EXAMPLE 17

| | | | | |
|---|---|---|---|---|
| 3 | −331.764 | 15.000 | 1.56000 | LN1 |
| 4 | 427.187 | 37.533 | | M2 |
| 5 | −243.163 | −37.533 | −1.0 | FL1 |
| 6 | 427.187 | −15.000 | −1.56 | FM1 |
| 7 | −331.764 | −400.174 | −1.0 | LF |
| 8 | −1050.590 | 462.707 | | FM2 |
| 9 | 1082.335 | 45.592 | 1.56000 | LF |
| 10 | −506.181 | 419.093 | | β = 1/4 |
| 11 | −556.173 | −340.231 | −1.0 | L = 1188 mm |
| 12 | 890.632 | −49.792 | −1.56 | NA = 0.6 |
| 13 | 129.563 | −12.279 | −1.0 | |
| 14 | 503.066 | 12.279 | | |
| 15 | 129.563 | 49.792 | 1.56000 | |
| 16 | 890.632 | 308.936 | | |
| 17 | 0.0(stop) | 34.831 | | |
| 18 | 212.603 | 15.000 | 1.56000 | |
| 19 | 358.696 | 0.100 | | |
| 20 | 154.082 | 17.867 | 1.56000 | |
| 21 | 14558.550 | 0.107 | | |
| 22 | 233.915 | 24.251 | 1.56000 | |
| 23 | −182.460 | 0.246 | | |
| 24 | 102.219 | 15.000 | 1.56000 | |
| 25 | 70.401 | 6.731 | | |
| 26 | 78.313 | 40.387 | 1.56000 | |
| 27 | −274.349 | | | | aspherical surfaces

| i | K | A | B | C | D |
|---|---|---|---|---|---|
| 1 | 0.000000e+000 | −4.543384e−008 | 2.008795e−013 | −5.987597e−017 | −7.178408e−022 |
| 3 | 0.000000e+000 | −1.396774e−008 | −1.312696e−012 | −4.099589e−017 | −1.204130e−021 |
| 5 | 2.136452e+000 | 7.442417e−009 | 1.306120e−013 | 2.191394e−018 | −3.414108e−023 |
| 7 | 0.000000e+000 | −1.396774e−008 | −1.312696e−012 | −4.099589e−017 | −1.204130e−021 |
| 8 | 3.674765e−001 | −5.080134e−009 | −2.169803e−013 | −7.383666e−018 | −2.178985e−022 |
| 9 | 0.000000e+000 | −3.096618e−009 | 6.122886e−015 | −3.324130e−020 | −2.496687e−026 |
| 11 | −6.480972e−001 | 7.109927e−010 | −3.912529e−015 | 3.016030e−021 | −2.009020e−027 |
| 13 | 0.000000e+000 | −1.535424e−008 | −4.271143e−013 | −5.423533e−017 | 2.156146e−021 |
| 14 | −2.947254e−001 | 1.369848e−009 | −1.353039e−013 | 1.572367e−017 | −1.209804e−021 |
| 15 | 0.000000e+000 | −1.535424e−008 | −4.271143e−013 | −5.423533e−017 | 2.156146e−021 |
| 20 | 0.000000e+000 | −1.254255e−007 | −3.689620e−012 | −1.110656e−015 | 1.994369e−019 |
| 22 | 0.000000e+000 | −1.374196e−007 | −1.437806e−011 | 3.602627e−015 | −3.618777e−019 |
| 25 | 0.000000e+000 | 8.431891e−008 | −2.787295e−011 | −9.578735e−015 | −5.255927e−018 |
| 26 | 0.000000e+000 | 7.697163e−008 | 1.013236e−011 | −6.851146e−015 | −4.256775e−018 |

| i | E | F | G |
|---|---|---|---|
| 1 | 0.000000e+000 | 0.000000e+000 | 0.000000e+000 |
| 3 | 0.000000e+000 | 0.000000e+000 | 0.000000e+000 |
| 5 | 0.000000e+000 | 0.000000e+000 | 0.000000e+000 |
| 7 | 0.000000e+000 | 0.000000e+000 | 0.000000e+000 |
| 8 | 0.000000e+000 | 0.000000e+000 | 0.000000e+000 |
| 9 | 0.000000e+000 | 0.000000e+000 | 0.000000e+000 |
| 11 | 0.000000e+000 | 0.000000e+000 | 0.000000e+000 |
| 13 | 0.000000e+000 | 0.000000e+000 | 0.000000e+000 |
| 14 | 0.000000e+000 | 0.000000e+000 | 0.000000e+000 |
| 15 | 0.000000e+000 | 0.000000e+000 | 0.000000e+000 |
| 20 | 0.000000e+000 | 0.000000e+000 | 0.000000e+000 |
| 22 | 0.000000e+000 | 0.000000e+000 | 0.000000e+000 |
| 25 | 0.000000e+000 | 0.000000e+000 | 0.000000e+000 |
| 26 | 0.000000e+000 | 0.000000e+000 | 0.000000e+000 |

TABLE 18

EXAMPLE 18

| i | ri | di | ni | Obj-distance = 51.375 |
|---|---|---|---|---|
| 1 | 294.105 | 24.410 | 1.56000 | LN1 |
| 2 | −2765.072 | 417.053 | | M1 |
| 3 | −116.294 | 15.000 | 1.56000 | LN1 |
| 4 | −2872.831 | 20.722 | | M2 |
| 5 | −186.216 | −20.722 | −1.0 | FL1 |
| 6 | −2872.831 | −15.000 | −1.56 | FM1 |

TABLE 18-continued

EXAMPLE 18

| i | ri | di | ni | |
|---|---|---|---|---|
| 7 | −116.294 | −383.291 | −1.0 | LF |
| 8 | −1505.962 | 429.623 | | FM2 |
| 9 | 444.041 | 63.934 | 1.56000 | LF |
| 10 | −3099.408 | 334.815 | | $\beta = 1/4$ |
| 11 | −948.436 | −300.896 | −1.0 | L = 1197 mm |
| 12 | −314.227 | −16.435 | −1.56 | NA = 0.6 |
| 13 | −824.068 | −7.484 | −1.0 | |
| 14 | −325.089 | 7.484 | | |
| 15 | −824.068 | 16.435 | 1.56000 | |
| 16 | −314.227 | 301.796 | | |
| 17 | 0.0(stop) | 55.267 | | |
| 18 | 654.524 | 17.101 | 1.56000 | |
| 19 | −493.112 | 0.100 | | |
| 20 | 127.646 | 36.817 | 1.56000 | |
| 21 | 9721.169 | 9.587 | | |
| 22 | 124.513 | 19.292 | 1.56000 | |
| 23 | 107.027 | 11.036 | | |
| 24 | 94.369 | 15.000 | 1.56000 | |
| 25 | 93.351 | 9.999 | | |
| 26 | 115.073 | 47.374 | 1.56000 | |
| 27 | −373.527 | | | | aspherical surfaces

| i | K | A | B | C | D |
|---|---|---|---|---|---|
| 1 | 0.000000e+000 | 3.270469e−008 | −2.618357e−012 | 4.062834e−016 | −5.211535e−020 |
| 3 | 0.000000e+000 | 4.411046e−009 | −5.444659e−013 | −4.482642e−017 | 1.266365e−019 |
| 5 | 9.780048e−001 | 1.163827e−008 | 2.616720e−013 | −9.065597e−019 | 1.119604e−020 |
| 7 | 0.000000e+000 | 4.411046e−009 | −5.444659e−013 | −4.482642e−017 | 1.266365e−019 |
| 8 | −1.539537e+000 | 3.786900e−009 | −9.453622e−014 | 3.248795e−018 | −2.012056e−022 |
| 9 | 0.000000e+000 | −4.149266e−009 | 2.307771e−015 | −1.751852e−021 | −1.213130e−024 |
| 11 | −3.776756e+000 | −4.342111e−010 | −2.394400e−015 | 5.496039e−020 | −1.406823e−024 |
| 12 | 0.000000e+000 | −1.673853e−009 | −3.281730e−012 | 6.683323e−016 | −8.393102e−020 |
| 14 | −3.600157e+000 | −3.076829e−008 | −3.309550e−012 | 6.132785e−016 | −1.002042e−019 |
| 16 | 0.000000e+000 | −1.673853e−009 | −3.281730e−012 | 6.683323e−016 | −8.393102e−020 |
| 19 | 0.000000e+000 | 1.130381e−008 | 1.048332e−012 | −2.689716e−016 | 1.609677e−020 |
| 20 | 0.000000e+000 | −2.363339e−008 | −1.791151e−012 | −4.488565e−016 | −3.302356e−020 |
| 22 | 0.000000e+000 | 4.460228e−009 | −2.267365e−012 | −2.653562e−016 | 2.051402e−020 |
| 25 | 0.000000e+000 | 3.016193e−007 | 2.151092e−011 | −3.603828e−016 | −2.089239e−018 |
| 26 | 0.000000e+000 | 2.718387e−007 | 2.254954e−011 | −7.855692e−016 | −2.167393e−018 |

| i | E | F | G |
|---|---|---|---|
| 1 | 3.766459e−024 | −1.147383e−028 | 0.000000e+000 |
| 3 | −1.676440e−023 | 2.206450e−027 | 0.000000e+000 |
| 5 | −9.520370e−025 | 9.545144e−029 | 0.000000e+000 |
| 7 | −1.676440e−023 | 2.206450e−027 | 0.000000e+000 |
| 8 | 1.042016e−026 | −2.633116e−031 | 0.000000e+000 |
| 9 | 1.190683e−029 | −3.996052e−035 | 0.000000e+000 |
| 11 | 1.831918e−029 | −9.562670e−035 | 0.000000e+000 |
| 12 | 4.958336e−024 | −1.328994e−028 | 0.000000e+000 |
| 14 | 7.328052e−024 | −3.110175e−028 | 0.000000e+000 |
| 16 | 4.958336e−024 | −1.328994e−028 | 0.000000e+000 |
| 19 | −7.303308e−025 | 3.915870e−029 | 0.000000e+000 |
| 20 | −6.049533e−025 | −2.110230e−029 | 0.000000e+000 |
| 22 | 5.955447e−023 | −4.660843e−027 | 0.000000e+000 |
| 25 | 7.756637e−022 | −7.997079e−027 | 0.000000e+000 |
| 26 | 7.445927e−022 | −4.578951e−026 | 0.000000e+000 |

TABLE 19

EXAMPLE 19

| i | ri | di | ni | Obj-distance = 51.000 |
|---|---|---|---|---|
| 1 | 351.655 | 16.754 | 1.56000 | LN1 |
| 2 | −8365.385 | 1.500 | | M1 |
| 3 | 200.954 | 22.369 | 1.56000 | LN1 |
| 4 | 591.866 | 247.671 | | M2 |
| 5 | −88.814 | 15.000 | 1.56000 | FL1 |
| 6 | −402.056 | 7.000 | | FM1 |
| 7 | −151.144 | −7.000 | −1.0 | LF |
| 8 | −402.056 | −15.000 | −1.56 | FM2 |

TABLE 19-continued

EXAMPLE 19

| i | ri | di | ni | |
|---|---|---|---|---|
| 9 | −88.814 | −240.671 | −1.0 | LF |
| 10 | 1366.187 | 349.374 | | β = 1/5 |
| 11 | 19831.441 | 26.737 | 1.56000 | L = 934 mm |
| 12 | −735.739 | 244.705 | | NA = 0.6 |
| 13 | −566.816 | −219.048 | −1.0 | |
| 14 | −133.579 | −14.510 | −1.56 | |
| 15 | −205.618 | −1.148 | −1.0 | |
| 16 | −202.153 | 1.148 | | |
| 17 | −205.618 | 14.510 | 1.56000 | |
| 18 | −133.579 | 224.997 | | |
| 19 | 0.0(stop) | −4.929 | | |
| 20 | −119.907 | 20.312 | 1.56000 | |
| 21 | −246.626 | 7.094 | | |
| 22 | 153.705 | 24.772 | 1.56000 | |
| 23 | −385.679 | 18.913 | | |
| 24 | 97.386 | 43.291 | 1.56000 | |
| 25 | 177.767 | 7.651 | | |
| 26 | 95.442 | 31.717 | 1.56000 | |
| 27 | 364.058 | 6.848 | | |
| 28 | 103.255 | 19.448 | 1.56000 | |
| 29 | −1048.656 | | | | aspherical surfaces

| i | K | A | B | C | D |
|---|---|---|---|---|---|
| 1 | 0.000000e+000 | −8.093313e−008 | 4.522834e−012 | −2.018073e−016 | 2.267148e−020 |
| 3 | 0.000000e+000 | 6.511812e−008 | −3.723599e−012 | 1.013032e−016 | −2.501488e−021 |
| 5 | 0.000000e+000 | 2.476497e−008 | −5.194074e−012 | 2.934576e−014 | −6.771024e−018 |
| 7 | −8.634921e−002 | 5.766118e−008 | 1.400403e−011 | 1.171617e−014 | −2.406379e−018 |
| 9 | 0.000000e+000 | 2.476497e−008 | −5.194074e−012 | 2.934576e−014 | −6.771024e−018 |
| 10 | 3.403605e+000 | −2.532676e−009 | 4.911669e−014 | 1.807856e−018 | −2.255506e−022 |
| 13 | −5.700272e−001 | 1.734919e−010 | 1.781213e−015 | −7.464135e−021 | 1.125815e−024 |
| 14 | 0.000000e+000 | 6.268611e−009 | 9.790240e−013 | 5.096073e−017 | −4.749646e−020 |
| 16 | −9.969546e−001 | 4.762518e−009 | 8.200176e−013 | 6.576997e−017 | −5.959712e−020 |
| 18 | 0.000000e+000 | 6.268611e−009 | 9.790240e−013 | 5.096073e−017 | −4.749646e−020 |
| 21 | 0.000000e+000 | 7.500151e−008 | −2.370496e−011 | −1.965330e−015 | 3.913950e−019 |
| 23 | 0.000000e+000 | −5.983025e−009 | 2.383340e−011 | −4.396313e−016 | −2.197526e−019 |
| 24 | 0.000000e+000 | 4.080007e−008 | −9.297261e−012 | 1.873727e−015 | −1.418320e−018 |
| 26 | 0.000000e+000 | −3.783040e−007 | −1.883182e−012 | −8.030466e−016 | −7.057718e−019 |
| 28 | 0.000000e+000 | −9.452418e−008 | −1.957493e−011 | −1.244651e−014 | 0.000000e+000 |

| i | E | F | G |
|---|---|---|---|
| 1 | −3.670991e−024 | 2.228767e−028 | 0.000000e+000 |
| 3 | 1.383272e−024 | −1.154892e−028 | 0.000000e+000 |
| 5 | 4.483389e−021 | −9.723939e−025 | 0.000000e+000 |
| 7 | 8.068244e−022 | −6.319119e−026 | 0.000000e+000 |
| 9 | 4.483389e−021 | −9.723939e−025 | 0.000000e+000 |
| 10 | 1.792109e−026 | −6.218030e−031 | 0.000000e+000 |
| 13 | −3.288087e−029 | 4.085249e−034 | 0.000000e+000 |
| 14 | 1.007847e−023 | 2.645246e−029 | 0.000000e+000 |
| 16 | 1.769682e−023 | −1.119411e−027 | 0.000000e+000 |
| 18 | 1.007847e−023 | 2.645246e−029 | 0.000000e+000 |
| 21 | −1.267664e−023 | −8.319497e−028 | 0.000000e+000 |
| 23 | 1.954211e−023 | −3.173836e−029 | 0.000000e+000 |
| 24 | 1.171050e−023 | −3.681475e−028 | 0.000000e+000 |
| 26 | 8.165762e−023 | 1.411746e−026 | 0.000000e+000 |
| 28 | −2.398432e−022 | −4.378158e−025 | 0.000000e+000 |

TABLE 20

EXAMPLE 20

| i | ri | di | ni | Obj-distance = 50.000 |
|---|---|---|---|---|
| 1 | 245.198 | 40.746 | 1.56000 | LN1 |
| 2 | 565.312 | 378.944 | | M1 |
| 3 | −198.743 | 15.000 | 1.56000 | LN1 |
| 4 | −553.813 | 2.806 | | M2 |
| 5 | −383.608 | −2.806 | −1.0 | FL1 |
| 6 | −553.813 | −15.000 | −1.56 | FM1 |
| 7 | −198.743 | −358.732 | −1.0 | LF |
| 8 | 6976.362 | 386.889 | | FM2 |

TABLE 20-continued

EXAMPLE 20

| | | | | |
|---|---|---|---|---|
| 9 | 355.685 | 51.490 | 1.56000 | LF |
| 10 | −12321.788 | 369.283 | | β = 1/8 |
| 11 | −1028.093 | −343.512 | −1.0 | L = 1190 mm |
| 12 | 730.908 | −15.000 | −1.56 | NA = 0.6 |
| 13 | −1511.630 | −0.100 | −1.0 | |
| 14 | −1023.030 | 0.070 | | |
| 15 | −1511.630 | 15.000 | 1.56000 | |
| 16 | 730.908 | 323.513 | | |
| 17 | 0.0(stop) | 39.007 | | |
| 18 | 302.719 | 22.983 | 1.56000 | |
| 19 | −6847.780 | 21.360 | | |
| 20 | 145.723 | 31.514 | 1.56000 | |
| 21 | 618.670 | 8.713 | | |
| 22 | 147.653 | 25.174 | 1.56000 | |
| 23 | 391.950 | 8.285 | | |
| 24 | 121.433 | 15.000 | 1.56000 | |
| 25 | 80.944 | 14.809 | | |
| 26 | 94.829 | 68.564 | 1.56000 | |
| 27 | −806.611 | | | | aspherical surfaces

| i | K | A | B | C | D |
|---|---|---|---|---|---|
| 1 | 0.000000e+000 | 2.707002e−008 | −8.717359e−013 | 1.291774e−017 | −8.046083e−023 |
| 3 | 0.000000e+000 | −1.285216e−008 | −4.644289e−012 | −1.098284e−015 | 4.074896e−020 |
| 5 | 1.853481e+000 | −5.942386e−009 | −1.921556e−012 | −3.991601e−016 | 3.066166e−020 |
| 7 | 0.000000e+000 | −1.285216e−008 | −4.644289e−012 | −1.098284e−015 | 4.074896e−020 |
| 8 | 4.692105e+000 | 6.776075e−009 | −1.213133e−013 | 2.083765e−018 | −3.379785e−023 |
| 9 | 0.000000e+000 | −7.268271e−009 | 3.352308e−015 | −1.357278e−019 | −1.824547e−024 |
| 11 | 1.213373e+000 | −1.515625e−010 | −6.598956e−015 | 2.230167e−019 | −3.018642e−024 |
| 12 | 0.000000e+000 | 2.663004e−009 | −5.964634e−012 | −3.132031e−015 | 3.139422e−019 |
| 14 | 3.818120e+000 | −5.339360e−008 | −6.525763e−012 | −2.026068e−015 | 1.112273e−019 |
| 16 | 0.000000e+000 | 2.663004e−009 | −5.964634e−012 | −3.132031e−015 | 3.139422e−019 |
| 20 | 0.000000e+000 | −4.537132e−008 | −1.444034e−012 | −6.237537e−017 | −1.225622e−020 |
| 22 | 0.000000e+000 | 2.258810e−008 | −2.784423e−012 | −4.694218e−017 | 4.207858e−020 |
| 25 | 0.000000e+000 | 1.033200e−007 | −6.071918e−012 | −2.759843e−015 | −3.195258e−019 |
| 26 | 0.000000e+000 | −2.135939e−008 | −6.495251e−012 | −2.642392e−015 | −2.963340e−019 |

| i | E | F | G |
|---|---|---|---|
| 1 | 0.000000e+000 | 0.000000e+000 | 0.000000e+000 |
| 3 | 0.000000e+000 | 0.000000e+000 | 0.000000e+000 |
| 5 | 0.000000e+000 | 0.000000e+000 | 0.000000e+000 |
| 7 | 0.000000e+000 | 0.000000e+000 | 0.000000e+000 |
| 8 | 0.000000e+000 | 0.000000e+000 | 0.000000e+000 |
| 9 | 0.000000e+000 | 0.000000e+000 | 0.000000e+000 |
| 11 | 0.000000e+000 | 0.000000e+000 | 0.000000e+000 |
| 12 | 0.000000e+000 | 0.000000e+000 | 0.000000e+000 |
| 14 | 0.000000e+000 | 0.000000e+000 | 0.000000e+000 |
| 16 | 0.000000e+000 | 0.000000e+000 | 0.000000e+000 |
| 20 | 0.000000e+000 | 0.000000e+000 | 0.000000e+000 |
| 22 | 0.000000e+000 | 0.000000e+000 | 0.000000e+000 |
| 25 | 0.000000e+000 | 0.000000e+000 | 0.000000e+000 |
| 26 | 0.000000e+000 | 0.000000e+000 | 0.000000e+000 |

TABLE 21

EXAMPLE 21

| i | ri | di | ni | Obj-distance = 50.487 |
|---|---|---|---|---|
| 1 | 248.654 | 45.879 | 1.56000 | LN1 |
| 2 | 2498.279 | 433.450 | | M1 |
| 3 | −430.357 | 17.451 | 1.56000 | LN1 |
| 4 | 1258.317 | 2.793 | | M2 |
| 5 | −320.814 | −2.793 | −1.0 | FL1 |
| 6 | 1258.317 | −17.451 | −1.56 | FM1 |
| 7 | −430.357 | −170.466 | −1.0 | LF |
| 8 | −566426.061 | 200.710 | | FM2 |
| 9 | −1563.039 | 37.005 | 1.56000 | LF |
| 10 | −250.953 | 361.172 | | β = 1/10 |
| 11 | −765.976 | −329.940 | −1.0 | L = 1190 mm |
| 12 | 244.884 | −15.000 | −1.56 | NA = 0.6 |

TABLE 21-continued

EXAMPLE 21

| | | | |
|---|---|---|---|
| 13 | 549.490 | −6.231 | −1.0 |
| 14 | −701.208 | 6.201 | |
| 15 | 549.490 | 15.000 | 1.56000 |
| 16 | 244.884 | 283.488 | |
| 17 | 0.0(stop) | 46.600 | |
| 18 | 244.341 | 23.507 | 1.56000 |
| 19 | 57346.724 | 0.100 | |
| 20 | 138.156 | 28.770 | 1.56000 |
| 21 | 561.247 | 3.336 | |
| 22 | 145.732 | 37.036 | 1.56000 |
| 23 | 260.318 | 4.990 | |
| 24 | 111.587 | 15.000 | 1.56000 |
| 25 | 70.790 | 33.292 | |
| 26 | 75.408 | 49.617 | 1.56000 |
| 27 | 5689.128 | | | aspherical surfaces

| i | K | A | B | C | D |
|---|---|---|---|---|---|
| 1 | 0.000000e+000 | −2.521478e−009 | −8.451485e−014 | 5.214505e−019 | −2.685571e−023 |
| 3 | 0.000000e+000 | −3.993741e−008 | 2.044280e−012 | 1.954603e−014 | 4.016803e−018 |
| 5 | 4.706536e+000 | −4.082512e−008 | −1.158264e−011 | 7.155566e−015 | −2.269483e−019 |
| 7 | 0.000000e+000 | −3.993741e−008 | 2.044280e−012 | 1.954603e−014 | 4.016803e−018 |
| 8 | 5.000000e+000 | −3.971095e−009 | −7.223454e−014 | −1.084017e−018 | 6.587792e−024 |
| 9 | 0.000000e+000 | −4.759165e−009 | 1.313843e−014 | 1.109392e−019 | −1.230866e−024 |
| 11 | 3.289899e−001 | −3.568080e−010 | −1.380316e−015 | 1.016681e−020 | −6.587533e−026 |
| 12 | 0.000000e+000 | −2.613402e−008 | −9.198710e−013 | −1.784868e−016 | 2.018156e−020 |
| 14 | −4.000000e+000 | −3.882997e−008 | −1.433855e−012 | −1.916913e−016 | 4.859577e−022 |
| 16 | 0.000000e+000 | −2.613402e−008 | −9.198710e−013 | −1.784868e−016 | 2.018156e−020 |
| 20 | 0.000000e+000 | −4.145601e−008 | −2.245516e−012 | −8.585230e−017 | −7.216150e−021 |
| 22 | 0.000000e+000 | 1.029827e−008 | −4.482490e−015 | 1.152103e−017 | 1.349052e−020 |
| 25 | 0.000000e+000 | 1.056111e−007 | 8.819533e−012 | 3.490901e−016 | 2.003722e−020 |
| 26 | 0.000000e+000 | −3.282437e−008 | 3.472717e−012 | −3.391125e−016 | −1.465019e−019 |

| i | E | F | G |
|---|---|---|---|
| 1 | 0.000000e+000 | 0.000000e+000 | 0.000000e+000 |
| 3 | 0.000000e+000 | 0.000000e+000 | 0.000000e+000 |
| 5 | 0.000000e+000 | 0.000000e+000 | 0.000000e+000 |
| 7 | 0.000000e+000 | 0.000000e+000 | 0.000000e+000 |
| 8 | 0.000000e+000 | 0.000000e+000 | 0.000000e+000 |
| 9 | 0.000000e+000 | 0.000000e+000 | 0.000000e+000 |
| 11 | 0.000000e+000 | 0.000000e+000 | 0.000000e+000 |
| 12 | 0.000000e+000 | 0.000000e+000 | 0.000000e+000 |
| 14 | 0.000000e+000 | 0.000000e+000 | 0.000000e+000 |
| 16 | 0.000000e+000 | 0.000000e+000 | 0.000000e+000 |
| 20 | 0.000000e+000 | 0.000000e+000 | 0.000000e+000 |
| 22 | 0.000000e+000 | 0.000000e+000 | 0.000000e+000 |
| 25 | 0.000000e+000 | 0.000000e+000 | 0.000000e+000 |
| 26 | 0.000000e+000 | 0.000000e+000 | 0.000000e+000 |

While the invention has been described with reference to the structures disclosed herein, it is not confined to the details set forth and this application is intended to cover such modifications or changes as may come within the purposes of the improvements or the scope of the following claims.

What is claimed is:

1. A projection optical system for projecting an image of an object onto an image plane, said projection optical system comprising:
a first imaging optical system for forming an image of the object, said first imaging optical system including a first mirror for reflecting and collecting abaxial light from the object;
a second imaging optical system for re-imaging the image upon the image plane;
a second mirror for reflecting the abaxial light from said first mirror to the image plane side, whereby the abaxial light is caused to pass outside of an effective diameter of said first mirror; and
a field optical system including three lenses each having a positive refractive power,
wherein the abaxial light passed through the outside of the effective diameter of said first mirror is refracted by said three lenses toward a direction nearing an optical axis of said three lenses,
wherein, in a meridional plane, the abaxial light passes through only one side of said three lenses with respect to the optical axis,
wherein light that has passed through said three lenses is directed to said second imaging optical system, and
wherein said first and second imaging optical systems are disposed along a common optical axis.

2. A projection optical system according to claim 1, wherein said field optical system includes one lens having a negative refractive power.

3. A projection exposure apparatus for projecting a pattern of a mask onto a substrate through a projection optical system as recited in claim 1.

4. A projection exposure apparatus according to claim 3, wherein laser light from one of an ArF excimer laser and an $F_2$ excimer laser is used for the projection optical system.

5. A device manufacturing method, comprising the steps of:
- printing a device pattern on a wafer by exposure, using a projection exposure apparatus as recited in claim 3.

6. A projection exposure apparatus for projecting an image of an object onto an image plane, said apparatus comprising:
- a first imaging optical system for forming an intermediate image of the object, said first imaging optical system including (i) a first lens unit having a positive power, (ii) a first optical unit having a first mirror for reflecting and collecting abaxial light from the object, (iii) a second optical unit having a second mirror for reflecting light from said first mirror to the image plane side, with which the abaxial light is caused to pass an outside of an effective diameter of said first mirror, and (iv) a second lens unit having a negative power and being disposed between said first and second mirrors;
- a second imaging optical system for re-imaging the intermediate image upon the image plane, said second imaging optical system being composed of a plurality of lenses; and
- a field optical system disposed between said first imaging optical system and said second imaging optical system, for projecting a pupil of said first imaging optical system onto said second imaging optical system, said field optical system including three lenses each having a positive power,
- wherein, in a meridional plane, the abaxial light passes through only one side of said three lenses with respect to the optical axis, and
- wherein said first imaging optical system, said second imaging optical system and said field optical system are disposed along a common straight optical axis.

7. A projection exposure apparatus according to claim 6, further comprising a projection optical system for projecting a pattern of a mask onto a substrate.

8. A device manufacturing method, comprising the steps of:
- printing a device pattern on a wafer by exposure, using a projection exposure apparatus as recited in claim 7; and
- developing the exposed wafer.

* * * * *

UNITED STATES PATENT AND TRADEMARK OFFICE
CERTIFICATE OF CORRECTION

PATENT NO.      : 6,995,918 B2
APPLICATION NO. : 10/992853
DATED           : February 7, 2006
INVENTOR(S)     : Chiaki Terasawa et al.

It is certified that error appears in the above-identified patent and that said Letters Patent is hereby corrected as shown below:

COLUMN 1:
    Line 44, "its" should read -- their --.

COLUMN 2:
    Line 8, "idealisti-" should read -- ideally,--.
    Line 9, "cally," should be deleted.

COLUMN 8:
    Line 36, "1o" should be deleted.

COLUMN 16:
    Line 31, "Any way," should read -- Anyway, --.

COLUMN 17:
    Line 25, "0.75<LM1/L<0.55" should read -- 0.25<LM1/L<0.55 --.

COLUMN 20:
    Line 30, "2 pm." should read -- ±2 pm. --.

COLUMN 23:
    Line 54, "b" should be deleted.

COLUMN 28:
    Line 7, "taken" should read -- taken. --.

COLUMN 34:
    Lines 42-43, " $X = \dfrac{H^2/\eta}{1 + (1 - (1+k) \cdot (H/\eta)^2)^{\frac{1}{2}}} + A \cdot H^4 + B \cdot H^6 + $ " should read $$-- X = \dfrac{H^2/r_i}{1 + (1 - (1+k) \cdot (H/r_i)^2)^{\frac{1}{2}}} + A \cdot H^4 + B \cdot H^6 + --$$

COLUMN 41:
    In "TABLE 5," under the section entitled "aspherical surfaces," in column "A," the eighth-listed entry "-1.684369e-009" should read -- -1.684359e-009 --.

UNITED STATES PATENT AND TRADEMARK OFFICE
CERTIFICATE OF CORRECTION

PATENT NO. : 6,995,918 B2
APPLICATION NO. : 10/992853
DATED : February 7, 2006
INVENTOR(S) : Chiaki Terasawa et al.

It is certified that error appears in the above-identified patent and that said Letters Patent is hereby corrected as shown below:

<u>COLUMN 43:</u>
In "TABLE 6," under the section entitled "aspherical surfaces," in column "D," the seventh-listed entry "9.645417e-019" should read -- 9.646417e-019 -- and in column "F," the sixth-listed entry "-1.911788e-025" should read -- -1.911788e-026 --.

<u>COLUMN 45:</u>
In "TABLE 8," under the section entitled "Example 8," in column "ri," the fifth-listed entry "-291.995" should read -- -291.999 --.

<u>COLUMN 49:</u>
In "TABLE 10," under the section entitled "Example 10," in column "ri," the eleventh-listed entry "-775.368" should read -- -775.358 -- ; and in column "di," the first-listed entry "21.763" should read -- 21.753 -- and the fourth-listed entry "319.654" should read -- 319.054 --.

<u>COLUMN 51:</u>
In "TABLE 10-continued," under the section entitled "Example 10," in the second column "ri," the first-listed entry "-109.376" should read -- -109.375 --; under the section entitled "aspherical surfaces," under column "A," the fifth-listed entry "1.481901e-007" should read -- 1.483901e-007 -- and under column "F," the eighth-listed entry "2.843547e-031" should read -- 2.643547e-031 -- and under column "F," the thirteenth-listed entry "9.278465e-027" should read -- 9.278466e-027 --.
In "TABLE 11," under the section entitled "Example 11," under column "di," the third-listed entry "16.000" should read -- 15.000 --.

UNITED STATES PATENT AND TRADEMARK OFFICE
CERTIFICATE OF CORRECTION

PATENT NO. : 6,995,918 B2
APPLICATION NO. : 10/992853
DATED : February 7, 2006
INVENTOR(S) : Chiaki Terasawa et al.

It is certified that error appears in the above-identified patent and that said Letters Patent is hereby corrected as shown below:

COLUMN 53:
In "TABLE 11-continued," under the section entitled "aspherical surfaces," under column "A," the eleventh-listed entry "2.891714e-008" should read -- 2.691714-008 --; under column "C," the seventh-listed entry "-2.708870e-016" should read -- -2.706670e-016 -- and under column "D," the twelfth-listed entry "-8.554569e-020" should read -- -8.554669e-020--.

Signed and Sealed this

Seventeenth Day of October, 2006

JON W. DUDAS
*Director of the United States Patent and Trademark Office*